(12) United States Patent
Park et al.

(10) Patent No.: US 11,758,806 B2
(45) Date of Patent: Sep. 12, 2023

(54) COMPOUND FOR ORGANIC ELECTRIC ELEMENT, ORGANIC ELECTRIC ELEMENT USING THE SAME, AND AN ELECTRONIC DEVICE THEREOF

(71) Applicant: DUK SAN NEOLUX CO., LTD., Cheonan-si (KR)

(72) Inventors: Jong Gwang Park, Cheonan-si (KR); Yun Suk Lee, Cheonan-si (KR); Jung Hwan Park, Cheonan-si (KR); Kyoung Chul Kim, Cheonan-si (KR); Sun Hee Lee, Cheonan-si (KR); Bum Sung Lee, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 580 days.

(21) Appl. No.: 15/733,389

(22) PCT Filed: Dec. 17, 2018

(86) PCT No.: PCT/KR2018/016008
§ 371 (c)(1),
(2) Date: Jul. 17, 2020

(87) PCT Pub. No.: WO2019/143031
PCT Pub. Date: Jul. 25, 2019

(65) Prior Publication Data
US 2021/0098719 A1   Apr. 1, 2021

(30) Foreign Application Priority Data

Jan. 18, 2018   (KR) ........................ 10-2018-0006547

(51) Int. Cl.
*H01L 51/00*   (2006.01)
*H10K 85/40*   (2023.01)
(Continued)

(52) U.S. Cl.
CPC ........... *H10K 85/40* (2023.02); *C07F 7/0816* (2013.01); *H10K 50/11* (2023.02); *H10K 50/15* (2023.02);
(Continued)

(58) Field of Classification Search
None
See application file for complete search history.

(56) References Cited

U.S. PATENT DOCUMENTS

2005/0062053 A1*   3/2005   Chen ................. H01L 29/66757
                                                    257/E29.279
2016/0028020 A1*   1/2016   Lee ..................... H10K 85/6572
                                                    257/40

(Continued)

FOREIGN PATENT DOCUMENTS

KR   10-2014-0083622 A    7/2014
KR   10-2014-0142628 A    12/2014
(Continued)

OTHER PUBLICATIONS

Notice of Allowance dated Jul. 3, 2023 from Korean Patent Office in a counterpart Korean Patent Application No. 10-2018-0006547(all the cited references are listed in this IDS.) (English translation is also submitted herewith.).

*Primary Examiner* — Robert S Loewe
(74) *Attorney, Agent, or Firm* — The PL Law Group, PLLC

(57) ABSTRACT

The present invention provides the compound represented by Formula 1, an organic electric element comprising a first electrode, a second electrode, and an organic material layer formed between the first electrode and the second electrode, and electronic device thereof, and by employing the compound represented by Formula 1 in the organic material layer, the driving voltage of the organic electric element can (Continued)

be lowered, and the luminous efficiency and life time of the electric element can be improved.

10 Claims, 1 Drawing Sheet

(51) Int. Cl.
*C07F 7/08* (2006.01)
*H10K 50/11* (2023.01)
*H10K 50/15* (2023.01)
*H10K 50/16* (2023.01)
*H10K 50/17* (2023.01)

(52) U.S. Cl.
CPC ............. *H10K 50/16* (2023.02); *H10K 50/17* (2023.02); *H10K 50/171* (2023.02)

(56) References Cited

U.S. PATENT DOCUMENTS

| | | | |
|---|---|---|---|
| 2016/0155961 A1* | 6/2016 | Ueno | H10K 85/636 257/40 |
| 2018/0145268 A1* | 5/2018 | Ma | C07F 7/0816 |
| 2019/0081253 A1* | 3/2019 | Xia | C07F 7/0816 |
| 2019/0263841 A1* | 8/2019 | Mujica-Fernaud | H10K 85/40 |

FOREIGN PATENT DOCUMENTS

| | | |
|---|---|---|
| KR | 10-1468087 B1 | 12/2014 |
| KR | 10-2016-0081531 A | 7/2016 |
| KR | 10-2016-0095827 A | 8/2016 |
| KR | 10-2017-0052777 A | 5/2017 |
| KR | 10-2017-0056425 A | 5/2017 |

* cited by examiner

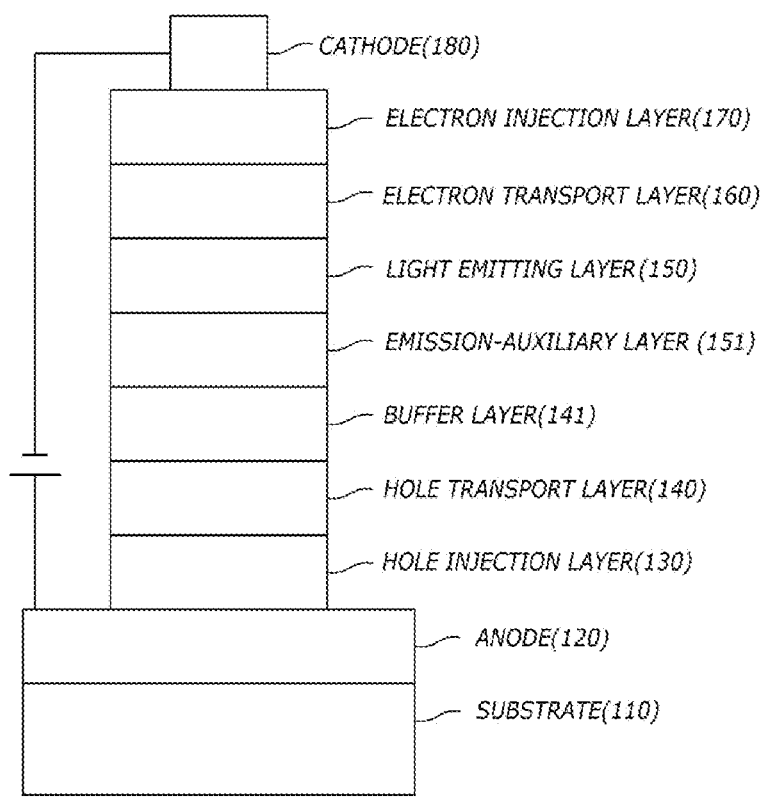

COMPOUND FOR ORGANIC ELECTRIC ELEMENT, ORGANIC ELECTRIC ELEMENT USING THE SAME, AND AN ELECTRONIC DEVICE THEREOF

CROSS-REFERENCE TO RELATED APPLICATION

This patent application claims priority from and the benefit under 35 U.S.C. § 119 to § 121, and § 365 of Korean Patent Application No. 10-2018-0006547, filed on Jan. 18, 2018 which is hereby incorporated by reference for all purposes as if fully set forth herein. Further, this application claims the benefit of priority in countries other than U.S., which is hereby incorporated by reference herein.

BACKGROUND

Technical Field

The present invention relates to compound for an organic electric element, an an organic electric element using the same and an electronic device thereof.

Background Art

In general, an organic light emitting phenomenon refers to a phenomenon that converts electric energy into light energy using an organic material. An organic electric element utilizing the organic light emitting phenomenon usually has a structure comprising an anode, a cathode, and an organic material layer formed the anode and the cathode. In many cases, the organic material layer has a multi-layered structure having respectively different materials in order to improve efficiency and stability of an organic electric element, and for example, may comprise a hole injection layer, a hole transport layer, a light emitting layer, an electron transport layer, an electron injection layer and the like.

Materials used as an organic material layer in an organic electric element may be classified into a light emitting material and a charge transport material, for example, a hole injection material, a hole transport material, an electron transport material, an electron injection material and the like according to its function.

Currently, the power consumption is required more than more as the size of display becomes larger and larger in the portable display market. Therefore, the power consumption is a very important factor in the portable display with a limited power source of the battery, and efficiency and life span issue also is solved.

Efficiency, life span, driving voltage, and the like are correlated with each other. if efficiency is increased, then driving voltage is relatively lowered, and the crystallization of an organic material due to Joule heating generated during operation is reduced as driving voltage is lowered, as a result of which life span shows a tendency to increase. However, efficiency cannot be maximized only by simply improving the organic material layer. This is because long life span and high efficiency can be simultaneously achieved when an optimal combination of energy levels and $T_1$ values, inherent material properties (mobility, interfacial properties, etc.), and the like among the respective layers included in the organic material layer is given.

In addition, in the recent organic electroluminescent devices, an emission-auxiliary layer (multi-layered hole transport layer) must be present between the hole transport layer and the light emitting layer in order to solve the problems of luminescence in the hole transport layer and the driving voltage, and it is necessary to develop different emission-auxiliary layers according to respective light emitting layers.

In general, an electron is transferred from an electron transport layer to a light emitting layer and a hole is transferred from a hole transport layer to the light emitting layer, as a result, an exciton is formed by the recombination of the electron and hole within the light emitting layer.

However, material used in a hole transport layer has a low T1 value because the material should have a low HOMO value. As a result, the exciton generated in the light emitting layer is transferred to the hole transport layer and it causes charge unbalance in the light emitting layer, thereby emitting light at the interface of the hole transport layer.

When light is emitted from the interface of a hole transporting layer, the color purity and efficiency of the organic electronic element are lowered and the lifetime is shortened. Therefore, it is strongly desired to develop materials for the emission-auxiliary layer having a HOMO level between the HOMO energy level of the hole transporting layer and the HOMO energy level of the light emitting layer, a high T1 energy value and a hole mobility within a suitable driving voltage range (within a driving voltage range of blue element of a full device).

However, this cannot be achieved simply by the structural properties of the core of the emission-auxiliary layer material. An element having a high efficiency and a long life span can be realized when the characteristics of core and sub-substituents of the emission-auxiliary layer material, the proper combination of the emission-auxiliary layer and the hole transport layer, and the proper combination of the emission-auxiliary layer and the light emitting layer.

In order to fully exhibit the excellent characteristics of the organic electric element, materials forming the organic material layer in the element, such as a hole injection material, a hole transport material, a light emitting material, an electron transport material, an electron injection material, an emission-auxiliary layer material, etc. should be prerequisite to support by a stable and efficient material, in particular, it is strongly required to develop material for an emission-auxiliary layer.

Object, Technical Solution and Effects of the Invention

An object of the present invention is to provide a compound lowering a driving voltage, improving luminous efficiency, color purity and lifetime of the element, an organic electric element using the same, and an electronic device thereof.

In an aspect of the present invention, the present invention provides the compound represented by the following formula.

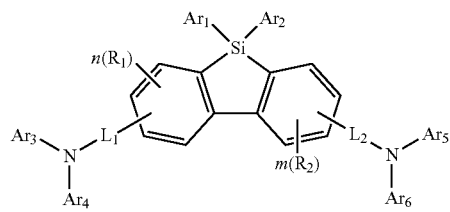

In another aspect of the present invention, the present invention provides an organic electric element employing the compound represented by formula above and an electronic device thereof.

By using the compound according to embodiment of the present invention, a driving voltage of an organic electric element can be lowered and the luminous efficiency, color purity and lifetime of the element can be largely improved.

BRIEF DESCRIPTION OF THE DRAWINGS

FIGURE illustrates an example of an organic electroluminescent element according to the present invention: 100 is an organic electric element, 110 is a substrate, 120 is a first electrode, 130 is a hole injection layer, 140 is a hole transport layer, 141 is a buffer layer, 150 is a light emitting layer, 151 is an emission-auxiliary layer, 160 is an electron transport layer, 170 is an electron injection layer, and 180 is a second electrode.

DETAILED DESCRIPTION

In this specification, a 'group name' corresponding to an aryl group, an arylene group, a heterocyclic group, and the like exemplified for each symbol and its substituent may be written in the name of functional group reflecting the valence, and may also be described as the name of a parent compound. For example, in the case of phenanthrene which is a kind of aryl group, it may be described by distinguishing valence such as 'phenanthryl' when it is 'monovalent group', and as 'phenanthrylene' when it is 'divalent group', and it may also be described as a parent compound name, 'phenanthrene', regardless of its valence. Similarly, in the case of pyrimidine, it may be described as 'pyrimidine' regardless of its valence, and it may also be described as the name of corresponding functional group such as pyrimidinyl when it is 'monovalent group', and as 'pyrimidylene' when it is 'divalent group'.

Unless otherwise stated, the term "fluorenyl group" or "fluorenylene group" as used herein means univalent or bivalent functional group in which R, R' and R" are all hydrogen in the following structure, "substituted fluorenyl group" or "substituted fluorenylene group" means that at least any one of R, R' and R" is a substituent other than hydrogen, and it comprises the case where R and R' are bonded to each other to form the spiro compound together with the carbon to which they are bonded.

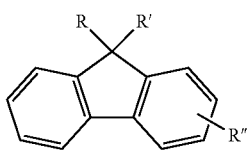

The term "spiro compound" as used herein has, a spiro union which means union having one atom as the only common member of two rings. The common atom is designated as 'spiro atom'. The compounds are defined as 'monospiro-', 'dispiro-' or 'trispiro-' depending on the number of Spiro atoms in one compound.

The term "heterocyclic group" as used herein means a ring comprising a heteroatom like N, O, S, P, Si or the like instead of carbon consisting of, it comprises a non-aromatic ring as well as an aromatic ring like "heteroaryl group" or "heteroarylene group" and the compound comprising the heteroatom group like $SO_2$, $P=O$ or the like instead of carbon consisting of a ring such as the following compound.

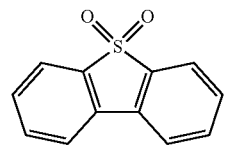 [SMILES: O=S1(=O)c2ccccc2-c2ccccc21]

In addition, otherwise specified, the formulas used in the present invention are as defined in the index definition of the substituent of the following formula.

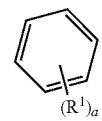

Here, the substituent $R^1$ is absent when a is an integer of zero, the sole $R^1$ is bonded to any one of the carbon atoms constituting the benzene ring when a is an integer of 1, when a is an integer of 2 or 3, the substituent $R^1$s may be bonded as follows and the substituents $R^1$s may be the same or different each other, and the substituent $R^1$s may be bonded to the carbon of the benzene ring in a similar manner when a is an integer of 4 to 6. Herein, the indication of the hydrogen bonded to the carbon which forms the benzene ring is omitted.

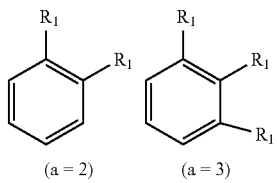

Hereinafter, a laminated structure of the electric element comprising the compound of the present invention will be described with reference to FIGURE.

The FIGURE illustrates a laminated structure of an organic electric element according to an embodiment of the present invention.

Referring to the FIGURE, an organic electric element 100 according to an embodiment of the present invention includes a first electrode 120, a second electrode 180, and an organic material layer formed between the first electrode 120 and the second electrode 180 and comprising the compound of the present invention which are formed on a substrate 110. Here, the first electrode 120 may be an anode (positive electrode), and the second electrode 180 may be a cathode (negative electrode). In the case of an inverted organic electroluminescent element, the first electrode may be a cathode, and the second electrode may be an anode.

The organic material layer may include a hole injection layer 130, a hole transport layer 140, a light emitting layer 150, an electron transport layer 160, and an electron injection layer 170 formed in sequence on the first electrode 120. Here, at least one layer of the organic material layer may be omitted, or the organic material layer may further include a hole blocking layer, an electron blocking layer, an emission-auxiliary layer 151, an electron transport-auxiliary layer, a buffer layer 141, etc., and the electron transport layer 160 or the like may serve as a hole blocking layer.

In addition, although not shown, the organic electric element according to an embodiment of the present invention may further include a protective layer or a layer for improving luminous efficiency formed on at least one side of both sides of the first electrode and the second electrode, wherein at least one side is not facing the organic material layer.

The inventive compound employed in the organic material layer may be used as a material of a hole injection layer 130, a hole transport layer 140, an emission-auxiliary layer 151, an electron transport-auxiliary layer, an electron transport layer 160, an electron injection layer 170 and the like, host or dopant for a light emitting layer 150, or material of a layer for improving luminous efficiency. For example, the inventive compound may be used as material for a hole transport layer 140 and/or an emission-auxiliary layer 151, preferably, or an emission-auxiliary layer 151.

On the other hand, even if the core is same, the band gap, the electrical characteristics, the interface characteristics and the like may be different depending on which substituent is bonded at which position. Therefore, there is a need to study the selection of the core and the combination of the core and the sub-substituent bonded to the core. In particular, long life span and high efficiency can be simultaneously achieved when the optimal combination of energy levels and $T_1$ values, inherent material properties (mobility, interfacial properties, etc.) and the like among the respective layers of an organic material layer is achieved.

Therefore, the energy level and $T_1$ value between the respective layers of the organic material layer, inherent material properties (mobility, interfacial properties, etc.) and the like can be optimized by forming an emission-auxiliary layer 151 with the compound of the present invention, and thus it is possible to simultaneously improve the life span and efficiency of the organic electric element.

The organic electric element according to an embodiment of the present invention may be manufactured using various deposition methods. The organic electric element according to an embodiment of the present invention may be manufactured using a PVD (physical vapor deposition) method or CVD (chemical vapor deposition) method. For example, the organic electric element may be manufactured by depositing a metal, a conductive metal oxide, or a mixture thereof on the substrate to form the anode 120, forming the organic material layer including the hole injection layer 130, the hole transport layer 140, the light emitting layer 150, the electron transport layer 160, and the electron injection layer 170 thereon, and then depositing a material, which can be used as the cathode 180, thereon. In addition, an emitting auxiliary layer 151 may be formed between a hole transport layer 140 and a light emitting layer 150, and an electron transport-auxiliary layer may be formed between a light emitting layer 150 and an electron transport layer 160.

In addition, the organic material layer may be manufactured in such a manner that a smaller number of layers are formed using various polymer materials by a soluble process or solvent process, for example, spin coating, nozzle printing, inkjet printing, slot coating, dip coating, roll-to-roll, doctor blading, screen printing, or thermal transfer, instead of deposition. Since the organic material layer according to the present invention may be formed in various ways, the scope of protection of the present invention is not limited by a method of forming the organic material layer.

The organic electric element according to the present invention may be one of an organic light emitting device (OLED), an organic solar cell, an organic photo conductor (OPC), an organic transistor, an element for monochromatic or white illumination and an element quantum dot display.

Another embodiment of the present invention provides an electronic device including a display device which includes the above described organic electric element, and a control unit for controlling the display device. Here, the electronic device may be a wired/wireless communication terminal which is currently used or will be used in the future, and covers all kinds of electronic devices including a mobile communication terminal such as a cellular phone, a personal digital assistant (PDA), an electric dictionary, a point-to-multipoint (PMP), a remote controller, a navigation unit, a game player, various kinds of TVs, and various kinds of computers, and the display device may comprise an electroluminescent display, a quantum dot display and so on.

Hereinafter, the compound according to an aspect of the present invention will be described.

Compound according to an aspect of the present invention may be represented by Formula 1.

<Formula 1>

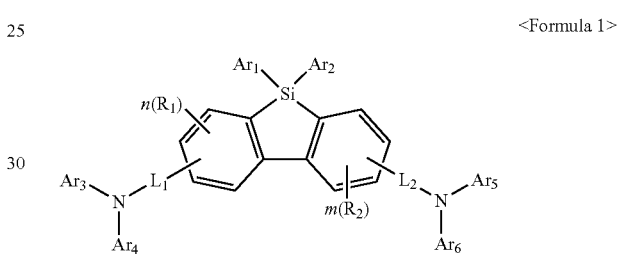

In formula 1, each of symbols may be defined as follows.

$Ar_1$ and $Ar_2$ are each independently selected from the group consisting of a $C_6$-$C_{60}$ aryl group, a $C_2$-$C_{60}$ heterocyclic group containing at least one heteroatom of O, N, S, Si, and P, a $C_3$-$C_{60}$ aliphatic ring group, a $C_1$-$C_{50}$ alkyl group, a $C_2$-$C_{20}$ alkenyl group, a $C_2$-$C_{20}$ alkynyl group, a $C_1$-$C_{30}$ alkoxyl group, a $C_6$-$C_{30}$ aryloxy group, and -L'-N($R_a$)($R_b$), and adjacent groups together may be bonded to each other to form a heterocyclic group containing Si.

Where $Ar_1$ and $Ar_2$ are an aryl group, the aryl group may be preferably a $C_6$-$C_{30}$, more preferably a $C_6$-$C_{14}$ aryl group, for example, phenyl, biphenyl, naphthyl, phenanthrene and the like. Where $Ar_1$ and $Ar_2$ are a heterocyclic group, the heterocyclic group may be preferably a $C_2$-$C_{30}$, more preferably a $C_2$-$C_8$ heterocyclic group, for example, pyridine, pyrimidine, triazine, quinazoline and the like. Where $Ar_1$ and $Ar_2$ are an alkyl group, the alkyl group may be preferably a $C_1$-$C_{10}$ alkyl group, more preferably a $C_1$-$C_4$ alkyl group, for example, methyl, ethyl, t-butyl and the like. In addition, where $Ar_1$ and $Ar_2$ are bonded to each other to form a ring, the ring may be a spiro-compound together with the Si to which they are attached, wherein the spiro-atom is Si.

$Ar_3$ to $Ar_6$ are each independently selected from the group consisting of a $C_6$-$C_{60}$ aryl group, a $C_2$-$C_{60}$ heterocyclic group containing at least one heteroatom of O, N, S, Si, and P, a $C_3$-$C_{60}$ aliphatic ring group, -L'-N($R_a$)($R_b$) and Formula 1-1, and adjacent groups together may be bonded to each other to form a $C_2$-$C_{60}$ heterocyclic group containing N. With the proviso that at least one of $Ar_3$ to $Ar_6$ is Formula 1-1.

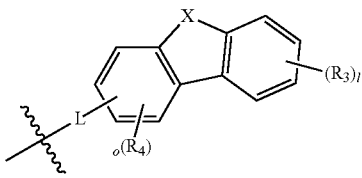

<Formula 1-1>

Where $Ar_3$ to $Ar_6$ are an aryl group, the aryl group may be preferably a $C_6$-$C_{30}$, more preferably a $C_6$-$C_{18}$ aryl group, for example, phenyl, biphenyl, naphthyl, phenanthrene, triphenylene, terphenyl and the like. Where $Ar_3$ to $Ar_6$ are a heterocyclic group, the heterocyclic group may be preferably a $C_2$-$C_{30}$, more preferably a $C_2$-$C_{22}$ heterocyclic group, for example, pyridine, pyrimidine, dibenzothiophene, dibenzofuran, carbazole, phenylcarbazole, 9-(naphthalen-2-yl)-9H-carbazole, benzonaphthofuran and the like. Where $Ar_3$ to $Ar_6$ are a fluorenyl group, the fluorenyl group may be dimethylfluorene, diphenylfluorene and the like.

X is O or S.

$R_1$ to $R_4$ are each independently selected from the group consisting of hydrogen, deuterium, halogen, a $C_6$-$C_{60}$ aryl group, a fluorenyl group, a $C_2$-$C_{60}$ heterocyclic group containing at least one heteroatom of O, N, S, Si, and P, a $C_3$-$C_{60}$ aliphatic ring group, a $C_1$-$C_{50}$ alkyl group, a $C_2$-$C_{20}$ alkenyl group, a $C_1$-$C_{30}$ alkoxyl group, a $C_6$-$C_{30}$ aryloxy group and -L'-N($R_a$)($R_b$), and adjacent groups together may be bonded to each other to form a ring.

Adjacent $R_1$s, adjacent $R_2$s, adjacent $R_3$s or adjacent $R_4$s together may be bonded to each other to form a ring, wherein the ring is selected from the group consisting of a $C_6$-$C_{60}$ aromatic ring, a fluorenyl group, a $C_2$-$C_{60}$ heterocyclic group containing at least one heteroatom of O, N, S, Si, and P, a $C_3$-$C_{60}$ aliphatic ring group, and a combination thereof. Where adjacent groups together may be bonded to each other to form an aromatic ring, the aromatic ring is preferably a $C_6$-$C_{20}$, more preferably a $C_6$-$C_{10}$ aromatic ring, for example, benzene, naphthalene and the like.

Where $R_1$ to $R_4$ are an aryl group, the aryl group may be preferably a $C_6$-$C_{30}$, more preferably a $C_6$-$C_{12}$ aryl group, for example, phenyl, biphenyl, naphthyl and the like. Where $R_1$ to $R_4$ are an aliphatic ring group, the aliphatic ring group may be preferably a $C_3$-$C_{30}$, more preferably a $C_3$-$C_6$ aliphatic ring group, for example, cyclohexane.

n, m and o are each an integer of 0 to 3, l is an integer of 0~4, where they are each an integer of 2 or more, each of a plurality of $R_1$s, each of a plurality of $R_2$s, each of a plurality of $R_3$s, each of a plurality of $R_4$s are the same or different from each other.

$L_1$, $L_2$ and L are each independently selected from the group consisting of a single bond, a $C_6$-$C_{60}$ arylene group, a fluorenylene group, a $C_2$-$C_{60}$ heterocyclic group containing at least one heteroatom of O, N, S, Si, and P, and a $C_3$-$C_{60}$ aliphatic ring. Where $L_1$, $L_2$ and L are an arylene group, the arylene group may be preferably a $C_6$-$C_{30}$, more preferably a $C_6$-$C_{12}$ arylene group, for example, phenylene, biphenyl, naphthalene and the like.

L' is selected from the group consisting of a single bond, a $C_6$-$C_{60}$ arylene group, a fluorenylene group, a $C_3$-$C_{60}$ aliphatic ring and a $C_2$-$C_{60}$ heterocyclic group.

$R_a$ and $R_b$ are each independently selected from the group consisting of a $C_6$-$C_{60}$ aryl group, a fluorenyl group, a $C_3$-$C_{60}$ aliphatic ring group, and a $C_2$-$C_{60}$ heterocyclic group containing at least one heteroatom of O, N, S, Si, and P.

$Ar_1$ to $Ar_6$, $R_1$ to $R_4$, the ring formed by adjacent groups, $L_1$, $L_2$, L, L', $R_a$ and $R_b$ may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a phosphine oxide group unsubstituted or substituted with a $C_1$-$C_{20}$ alkyl group or a $C_6$-$C_{20}$ aryl group, a $C_1$-$C_{20}$ alkylthio group, a $C_1$-$C_{20}$ alkoxyl group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group containing at least one heteroatom of O, N, S, Si, and P, a $C_3$-$C_{20}$ cycloalkyl group, a $C_7$-$C_{20}$ arylalkyl group, and $C_8$-$C_{20}$ arylalkenyl group.

For example, $Ar_1$ to $Ar_6$ are further substituted with methyl, ethene, pyridine, methoxy, phenyl, F and the like.

Preferably, Formula 1 may be represented by Formula 2 or Formula 3.

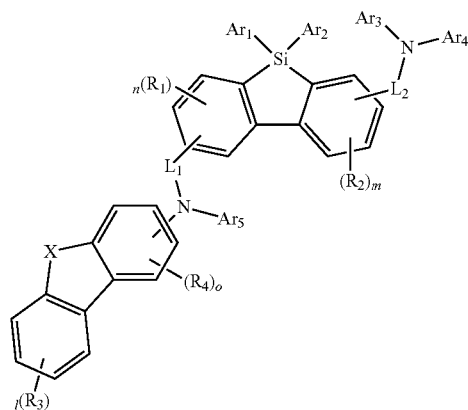

<Formula 2>

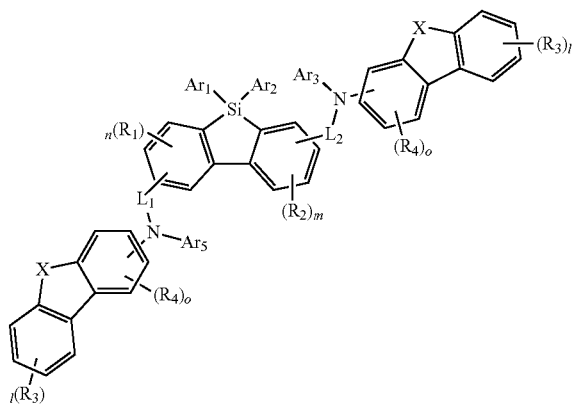

<Formula 3>

In Formulas 2 and 3, X, $Ar_1$ to $Ar_5$, $R_1$ to $R_4$, $L_1$, $L_2$, n, m, o and l are the same as defined for Formula 1.

In addition, Formula 1 may be represented by one of Formula 4 to Formula 7.

<Formula 4>

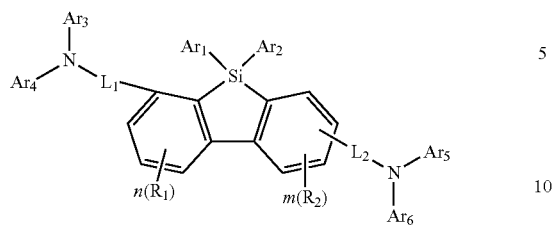

<Formula 9>

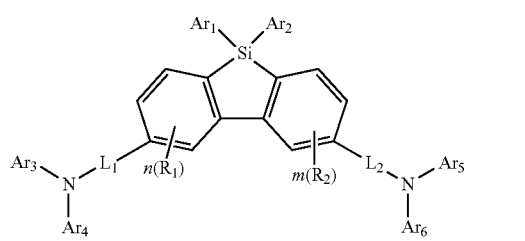

<Formula 5>

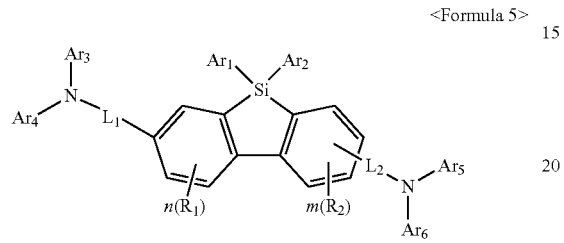

<Formula 10>

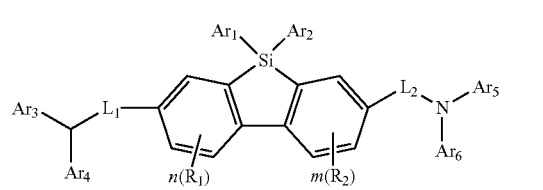

<Formula 6>

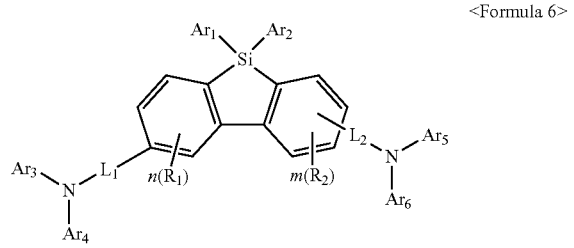

In Formulas 8 to 10, $Ar_1$ to $Ar_6$, $R_1$, $R_2$, $L_1$, $L_2$, n and m are the same as defined for Formula 1.

Specifically, compound represented by formula 1 may be one of the following compounds.

<Formula 7>

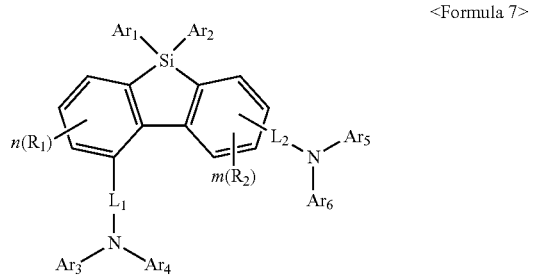

In Formulas 4 to 7, $Ar_1$ to $Ar_6$, $R_1$, $R_2$, $L_1$, $L_2$, n and m are the same as defined for Formula 1.

In addition, Formula 1 may be represented by one of Formula 8 to Formula 10.

<Formula 8>

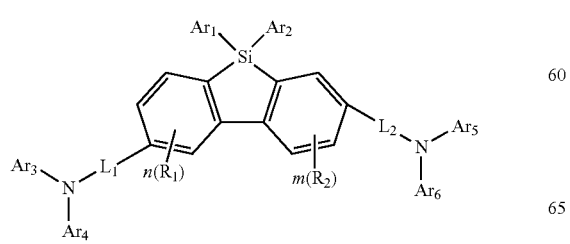

P-1

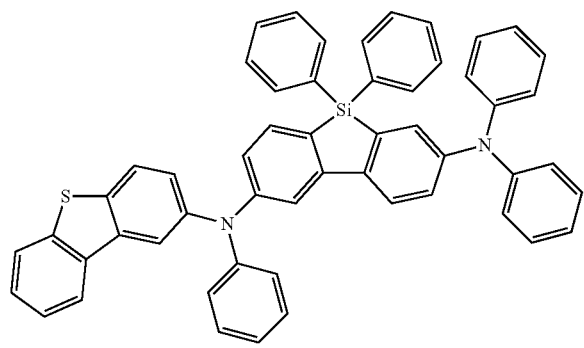

P-2

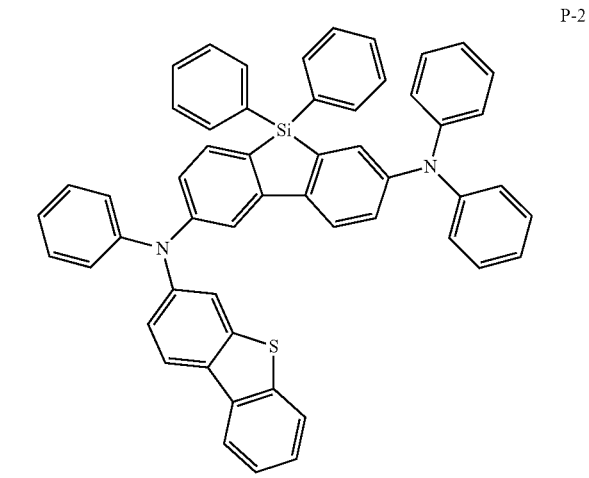

P-3
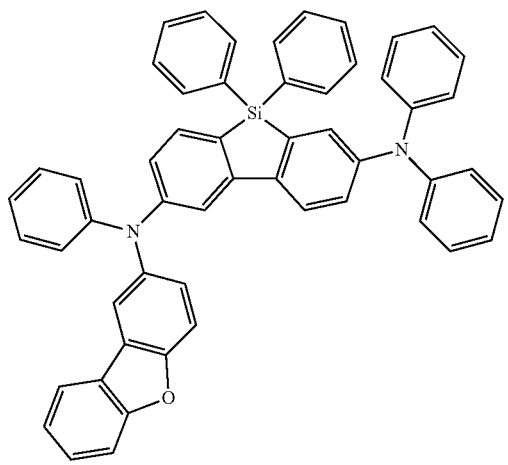
P-4
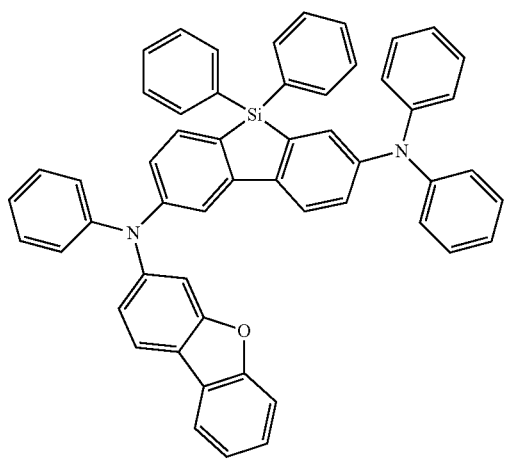
P-5
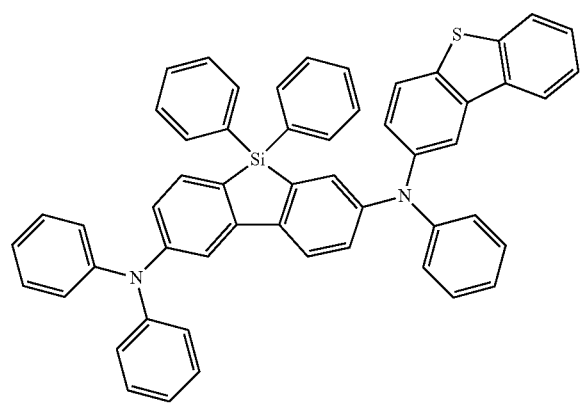
P-6
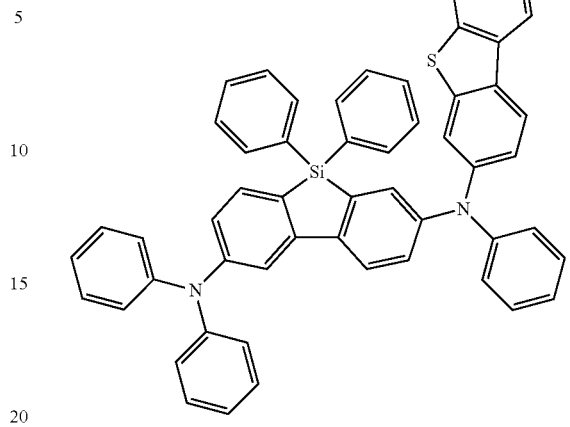
P-7
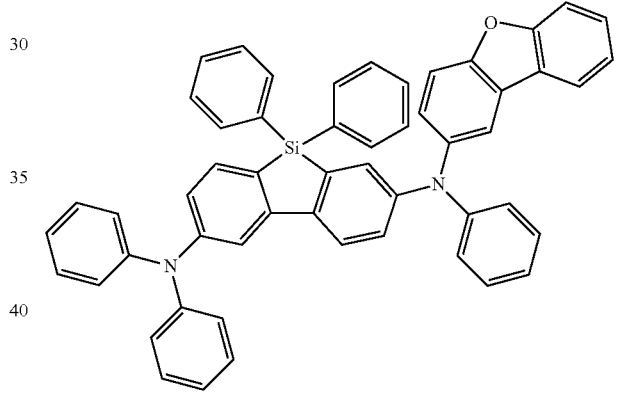
P-8
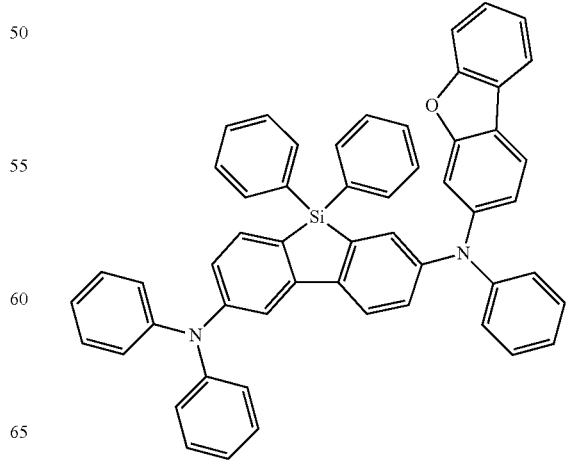

-continued
P-9
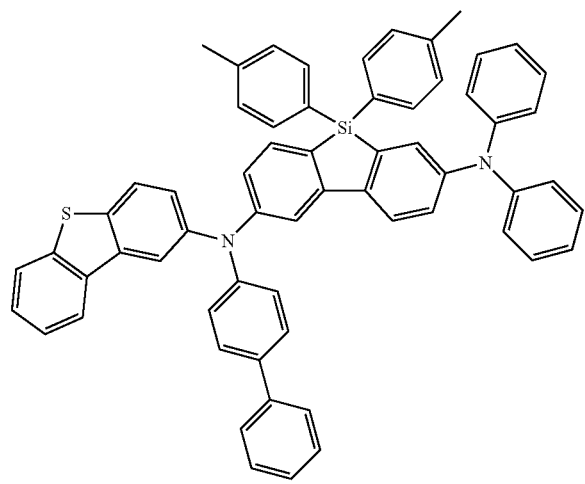
P-12
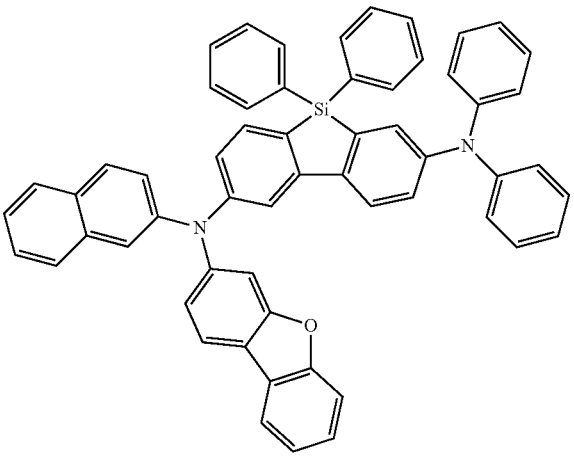
P-10
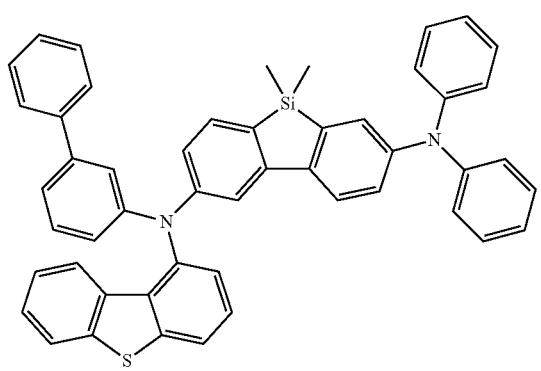
P-13
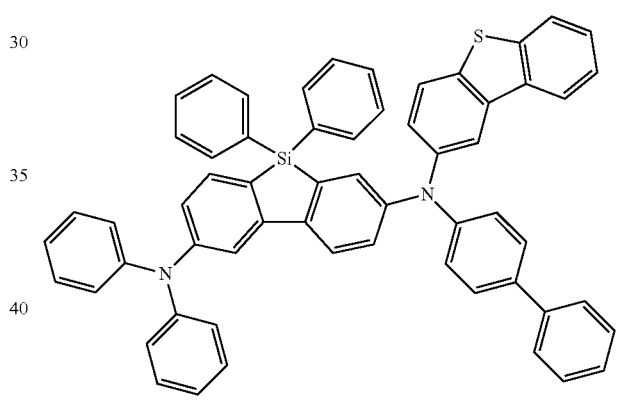
P-11
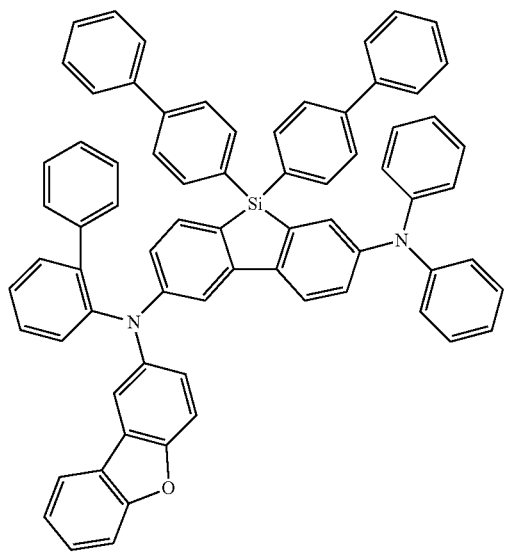
P-14
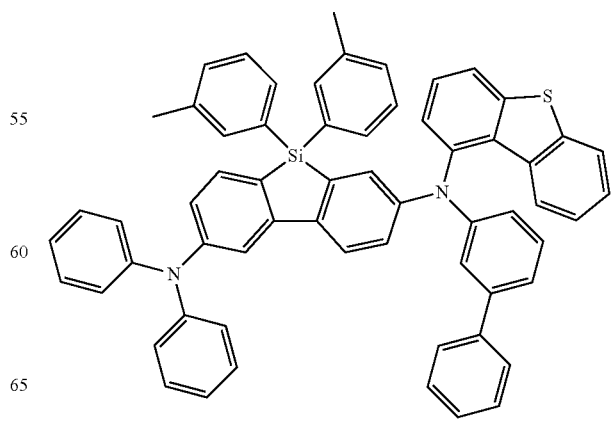

P-15
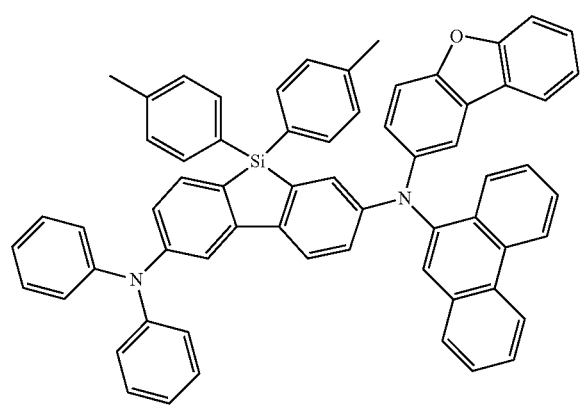
P-18
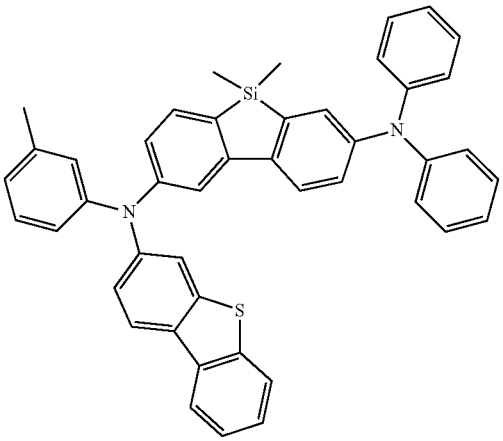
P-16
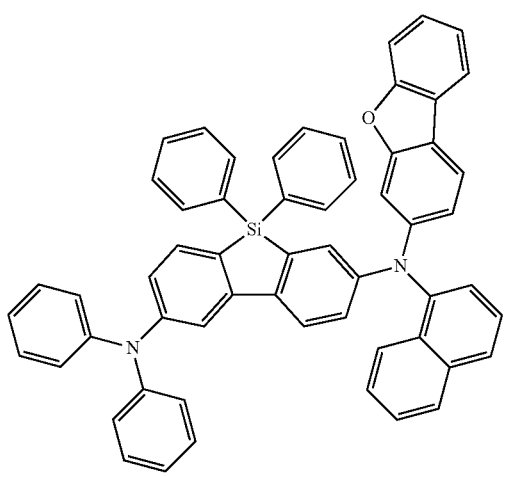
P-19
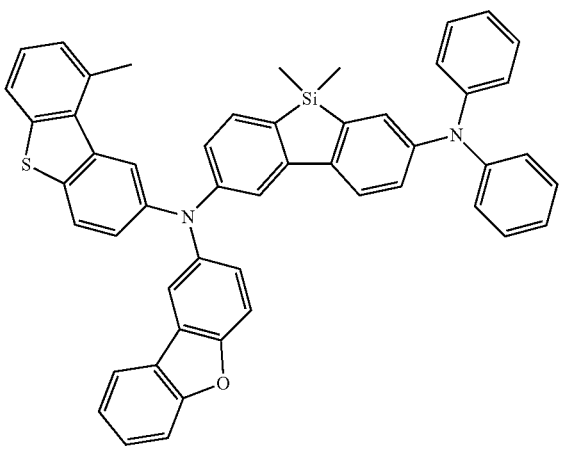
P-17
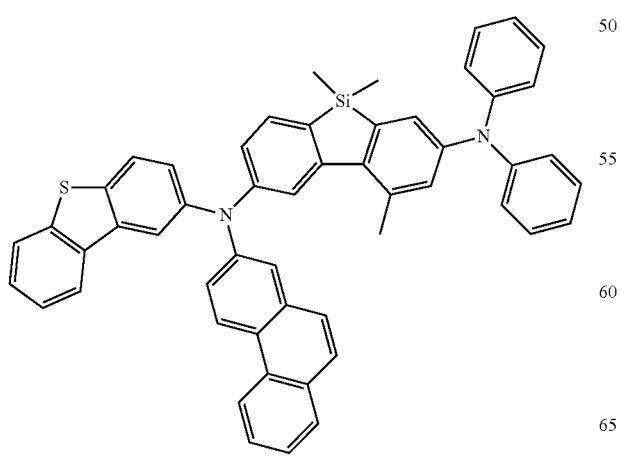
P-20
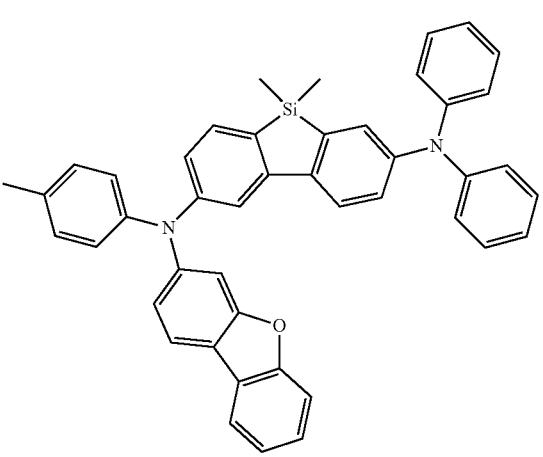

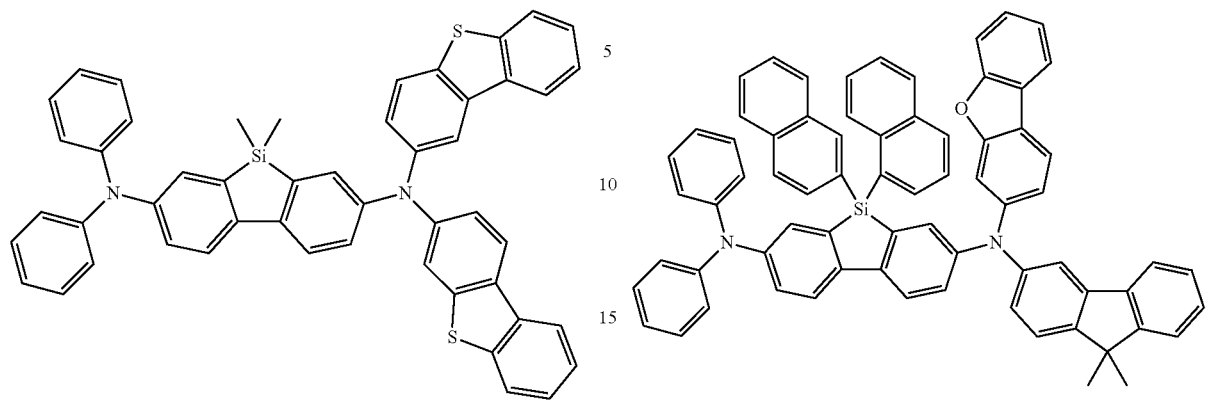
P-21
P-24
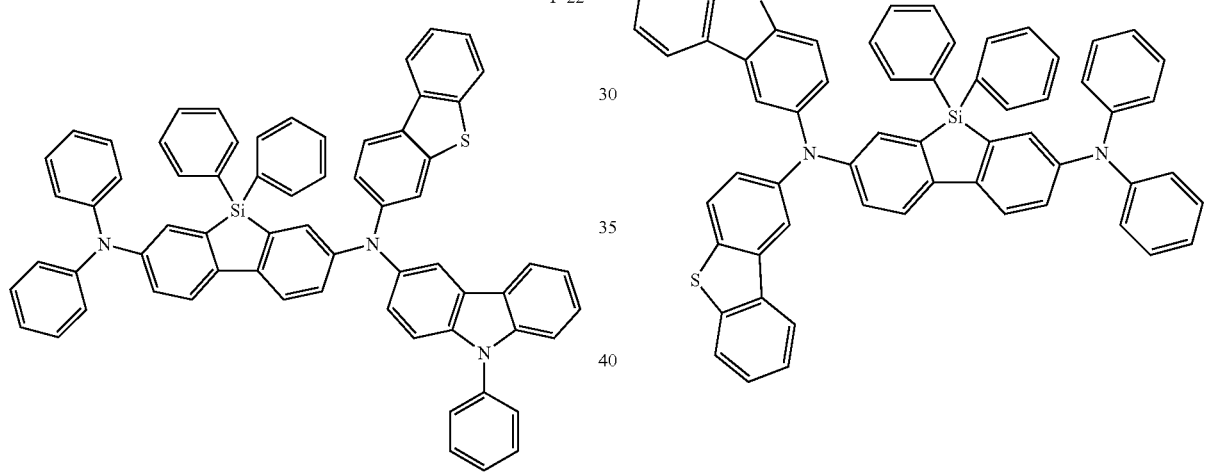
P-22
P-25
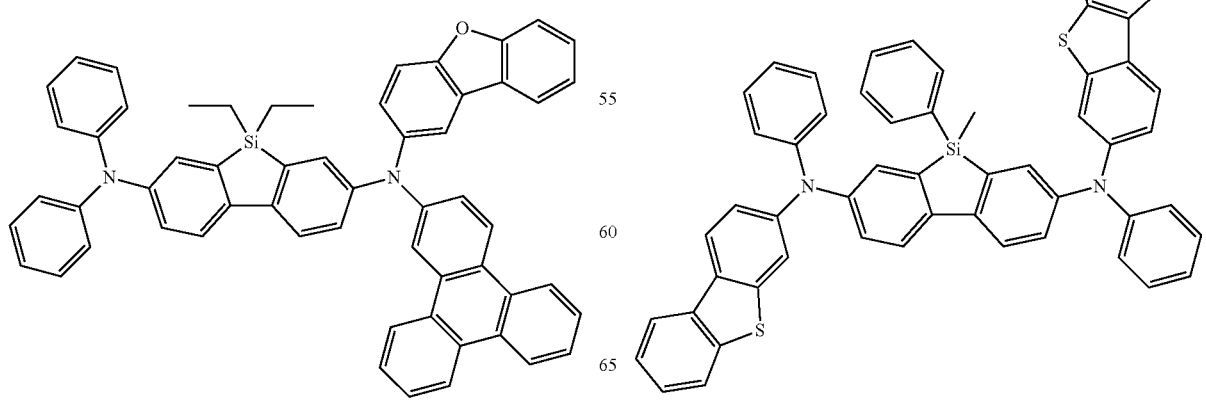
P-23
P-26

-continued
P-27
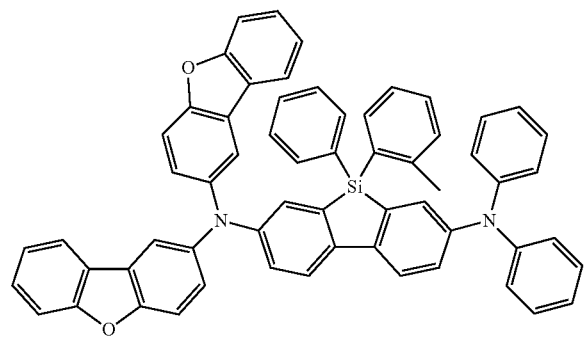
P-28
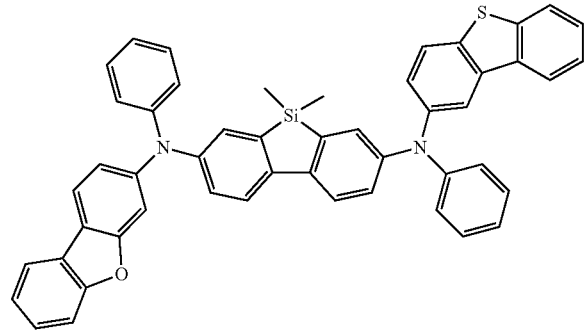
P-29
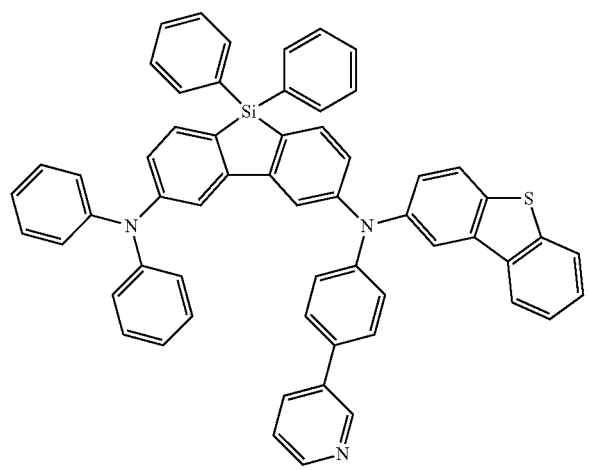
P-30
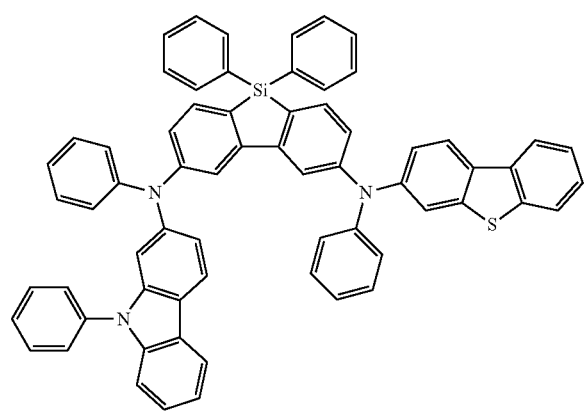
P-31
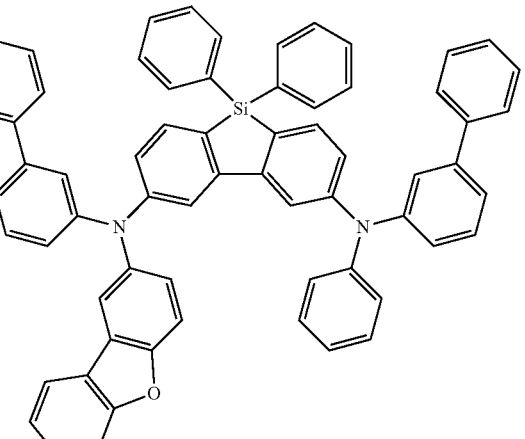
P-32
P-33
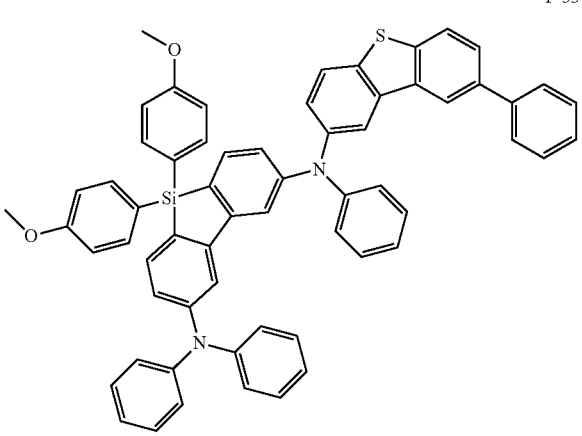

P-34
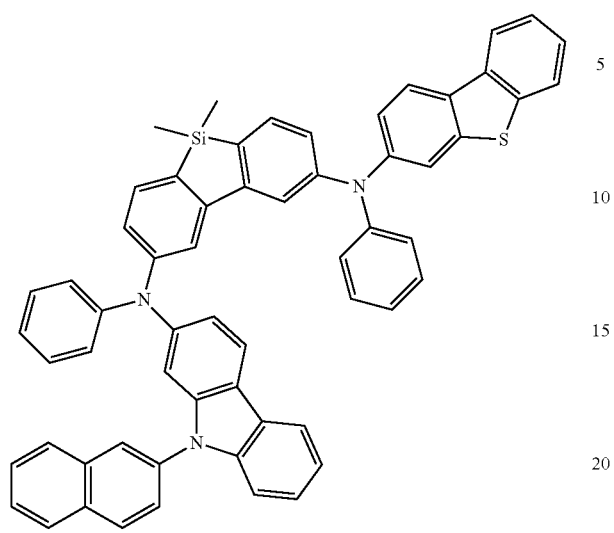
P-35
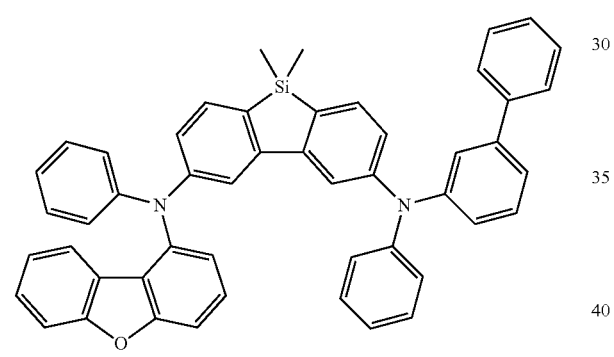
P-36
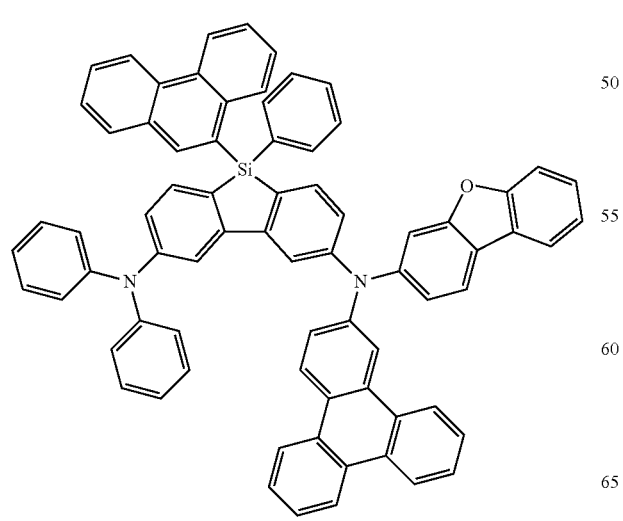
P-37
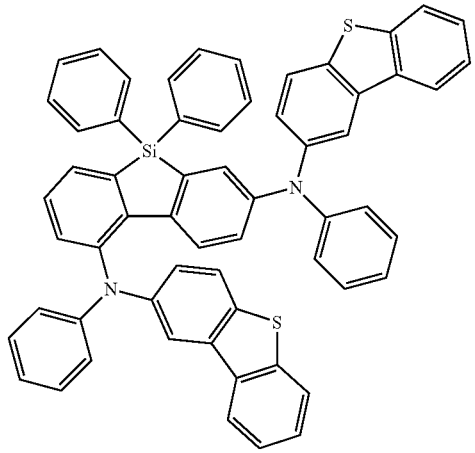
P-38
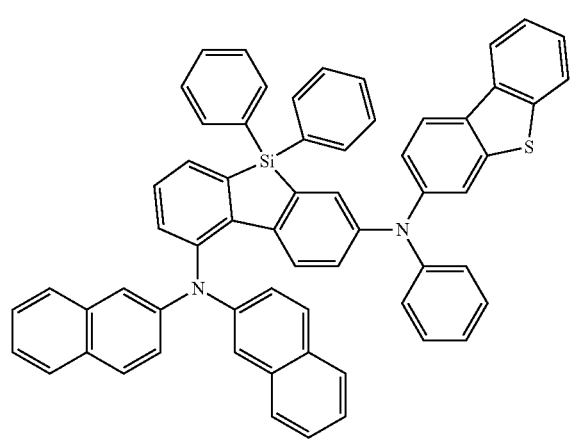
P-39
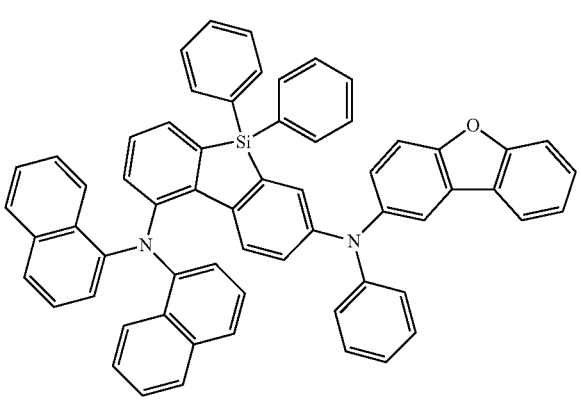

P-40

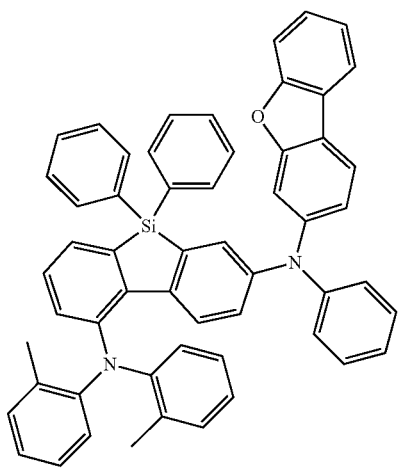

P-41

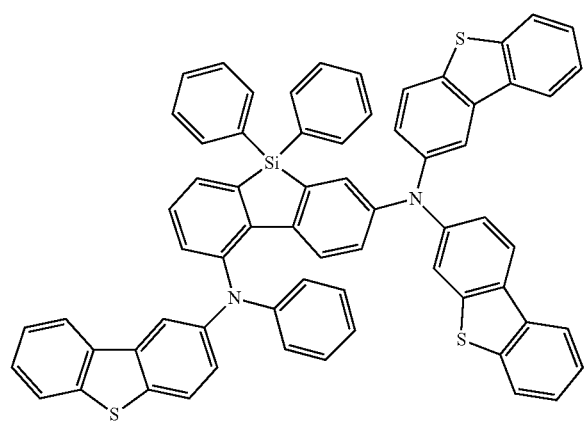

P-42

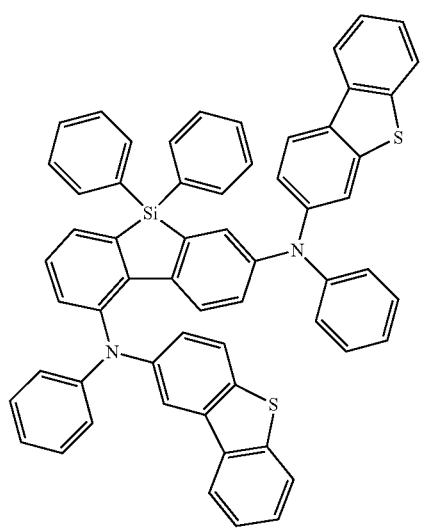

P-43

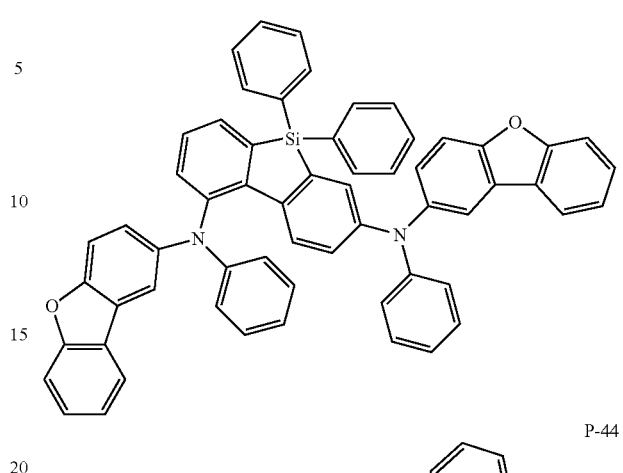

P-44

In another aspect of the present invention, the present invention provides an organic electric element comprising a first electrode, a second electrode, and an organic material layer formed between the first electrode and the second electrode, wherein the organic material layer comprises a single compound two or more compounds represented by Formula 1.

The organic material layer comprises at least one of a hole injection layer, a hole transport layer, an emission-auxiliary layer, a light emitting layer, an electron transport-auxiliary layer, an electron transport layer and an electron injection layer, preferably, the compound is comprised in the emission-auxiliary layer or the hole transport layer.

In another aspect of the present invention, the present invention provides an electronic device comprising a display device and a control unit for driving the display device, wherein the display device comprises the organic electric element.

Hereinafter, synthesis example of the compound represented by Formula 1 and preparation method of an organic electroluminescent element according to the present invention will be described in detail by way of examples. However, the present invention is not limited to the following examples.

Synthesis Example

The compound represented by Formula 1 according to the present invention can be synthesized by reacting Sub 1 with Sub 2.

Synthesis Example

The compound represented by Formula 1 according to the present invention can be synthesized by reacting Sub 1 and Sub 2 as shown in Reaction Scheme 1 below.

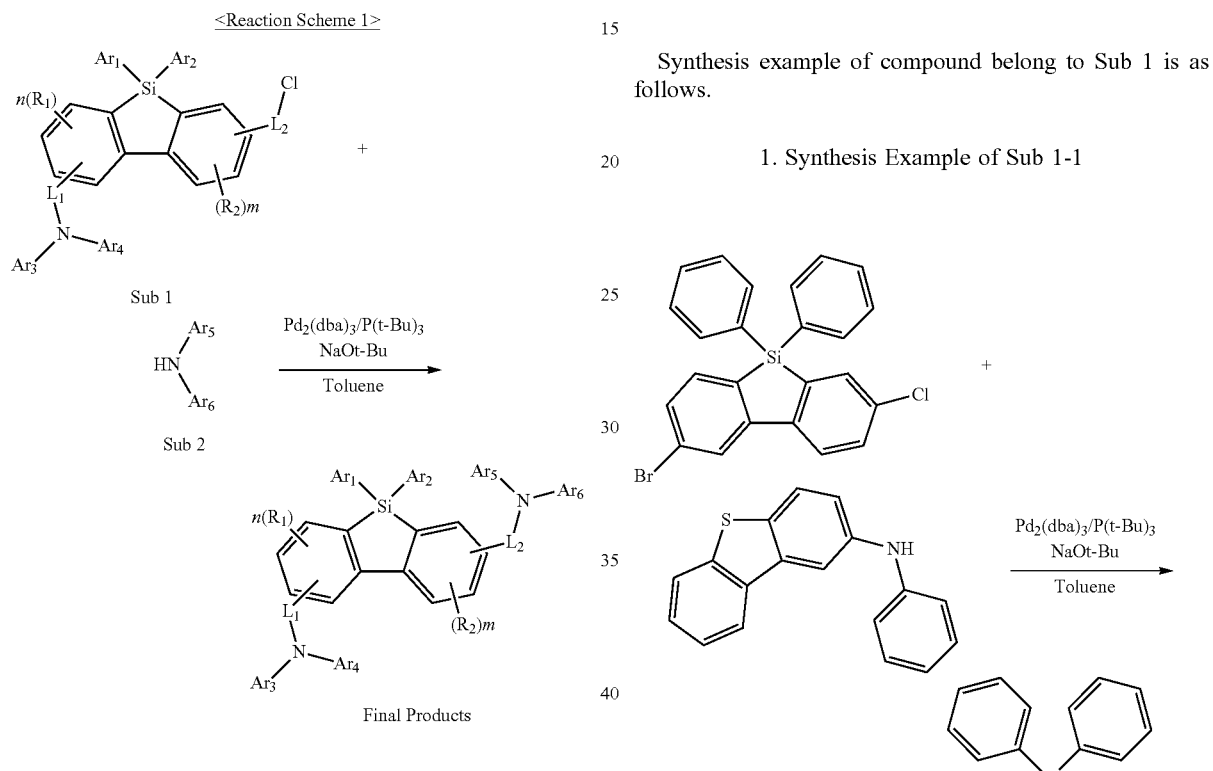

Synthesis Example of Sub 1

Sub 1 of Reaction Scheme 1 can be synthesized by the reaction route of Reaction Scheme 2 below, but there is no limitation thereto.

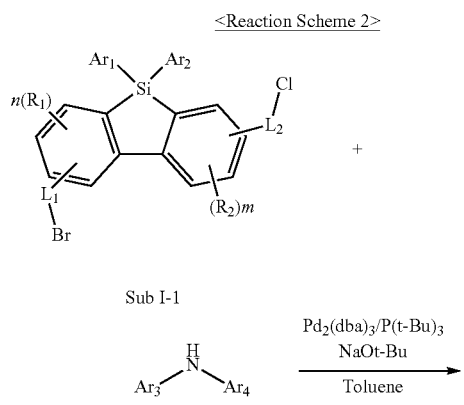

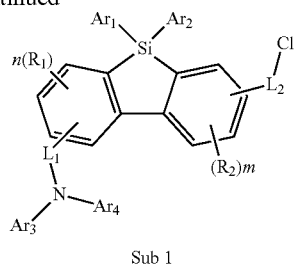

Synthesis example of compound belong to Sub 1 is as follows.

1. Synthesis Example of Sub 1-1

2-bromo-7-chloro-5,5-diphenyl-5H-dibenzo[b,d]silole (15 g, 0.033 mol), N-phenyldibenzo[b,d]thiophen-2-amine (9.2 g, 0.033 mol), Pd$_2$(dba)$_3$ (0.9 g, 0.001 mol), (t-Bu)$_3$P (0.8 mL, 0.002 mol) and NaOt-Bu (9.6 g, 0.10 mol) were added to anhydrous toluene (67 mL) and the reaction was carried out for 4 hours. When the reaction was completed, the reaction product was extracted with CH$_2$Cl$_2$ and water, the organic layer was dried with MgSO$_4$ and concentrated. Thereafter, the concentrate was separated by a silica gel column and recrystallized to obtain 18 g (yield: 83%) of product Sub 1-1.

2. Synthesis Example of Sub 1-5

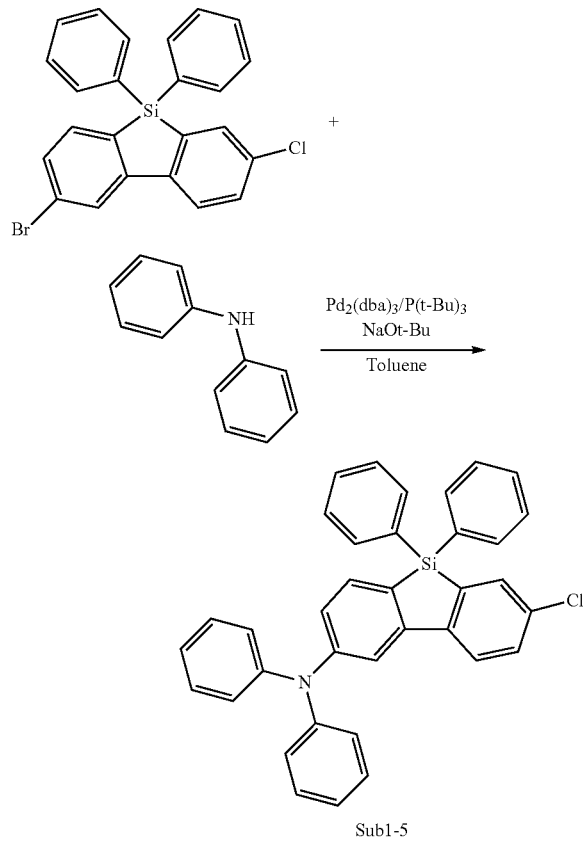

Sub1-5

The reaction was carried out in the same manner as in the synthesis method of Sub 1-1 using 2-bromo-7-chloro-5,5-diphenyl-5H-dibenzo[b,d]silole (40 g, 0.09 mol), diphenylamine (15.1 g, 0.09 mol), Pd$_2$(dba)$_3$ (2.45 g, 0.002 mol), (t-Bu)$_3$P (2.1 mL, 0.004 mol), NaOt-Bu (25.8 g, 0.278 mol) and anhydrous toluene (180 mL) to obtain 38 g (yield: 79%) of product Sub 1-5.

3. Synthesis Example of Sub 1-22

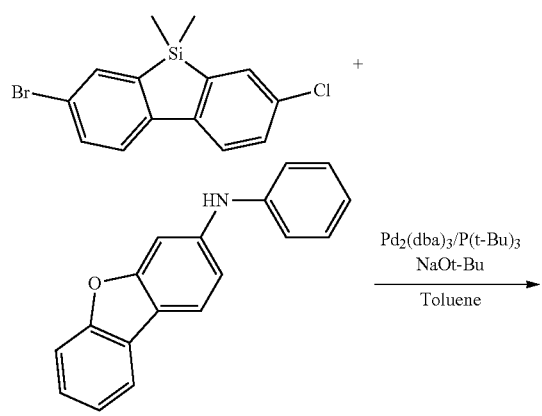

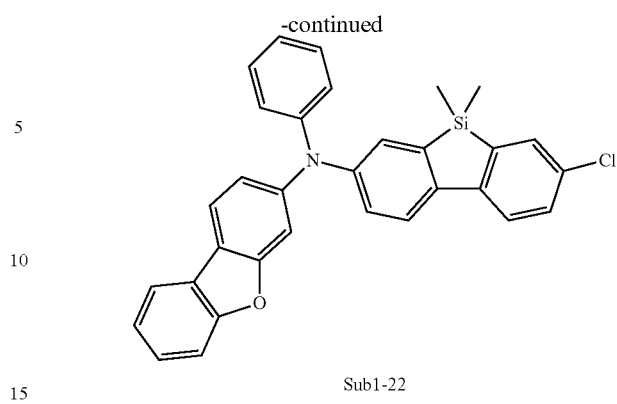

Sub1-22

The reaction was carried out in the same manner as in the synthesis method of Sub 1-1 using 3-bromo-7-chloro-5,5-dimethyl-5H-dibenzo[b,d]silole (40 g, 0.12 mol), N-phenyldibenzo[b,d]furan-3-amine (32 g, 0.12 mol), Pd$_2$(dba)$_3$ (3.4 g, 0.003 mol), (t-Bu)$_3$P (3.1 mL, 0.006 mol), NaOt-Bu (35 g, 0.37 mol) and anhydrous toluene (250 mL) to obtain 55 g (yield: 89%) of product Sub 1-22.

4. Synthesis Example of Sub 1-26

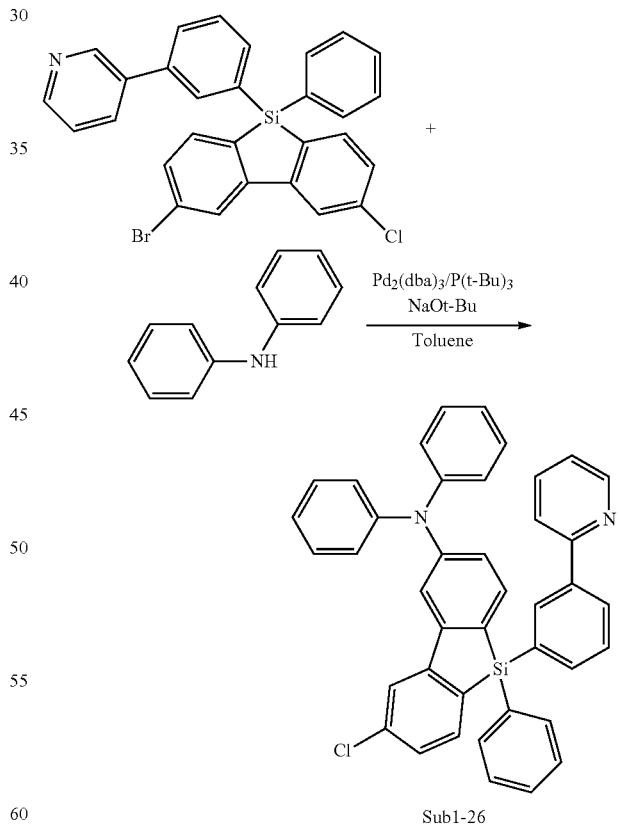

Sub1-26

The reaction was carried out in the same manner as in the synthesis method of Sub 1-1 using 3-(3-(2-bromo-8-chloro-5-phenyl-5H-dibenzo[b,d]silol-5-yl)phenyl)pyridine (10 g, 0.02 mol), diphenylamine (3.2 g, 0.02 mol), Pd$_2$(dba)$_3$ (0.5 g, 0.0006 mol), (t-Bu)$_3$P (0.4 mL, 0.0012 mol), NaOt-Bu (5.5 g, 0.06 mol) and anhydrous toluene (38 mL) to obtain 8 g (yield: 68.5%) of product Sub 1-26.

5. Synthesis Example of Sub 1-39

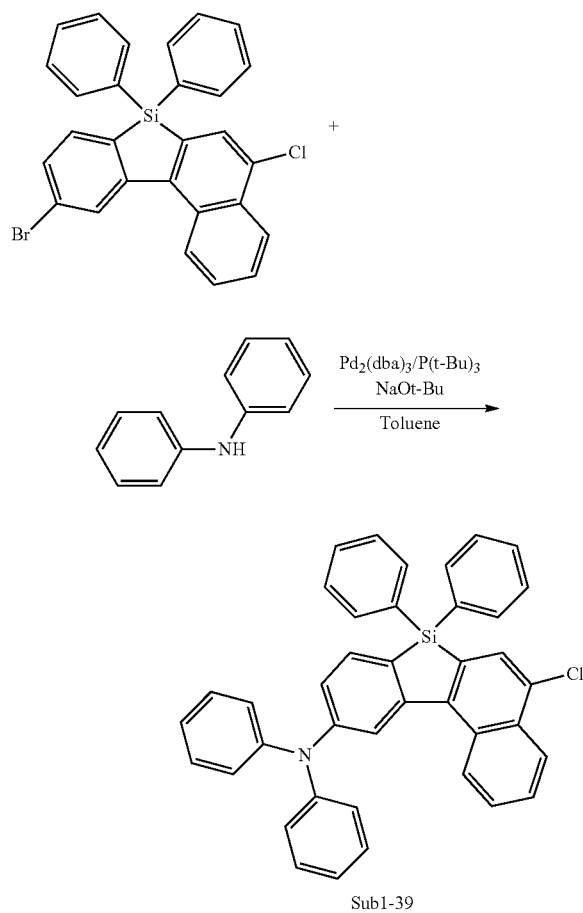

Sub1-39

The reaction was carried out in the same manner as in the synthesis method of Sub 1-1 using 10-bromo-5-chloro-7,7-diphenyl-7H-benzo[b]naphtho[1,2-d]silole (30 g, 0.06 mol), diphenylamine (10.1 g, 0.06 mol), Pd$_2$(dba)$_3$ (1.7 g, 0.002 mol), (t-Bu)$_3$P (1.4 mL, 0.002 mol), NaOt-Bu (17.4 g, 0.18 mol) and anhydrous toluene (120 mL) to obtain 30 g (yield: 85%) of product Sub 1-39.

6. Synthesis Example of Sub 1-59

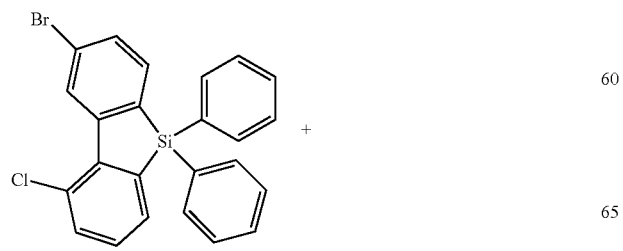

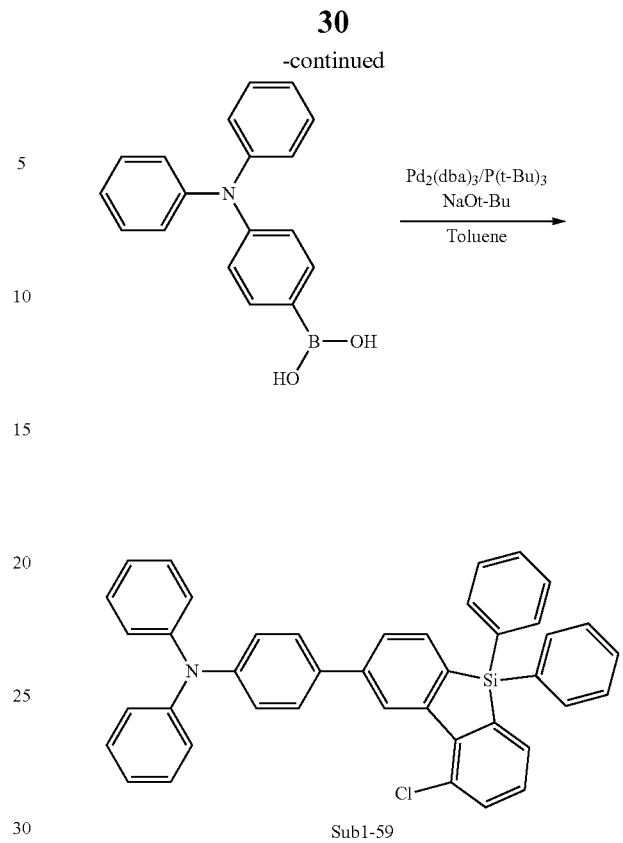

Sub1-59

The reaction was carried out in the same manner as in the synthesis method of Sub 1-1 using 8-bromo-1-chloro-5,5-diphenyl-5H-dibenzo[b,d]silole (30 g, 0.07 mol), (4-(diphenylamino)phenyl)boronic acid (19.3 g, 0.07 mol), Pd$_2$(dba)$_3$ (1.7 g, 0.002 mol), (t-Bu)$_3$P (1.4 mL, 0.002 mol), NaOt-Bu (17.4 g, 0.18 mol) and anhydrous toluene (120 mL) to obtain 32 g (yield: 78%) of product Sub 1-59.

Compounds belonging to Sub 2 may be, but not limited to, the following compounds, and Table 1 shows FD-MS (Field Desorption-Mass Spectrometry) values of the following compounds.

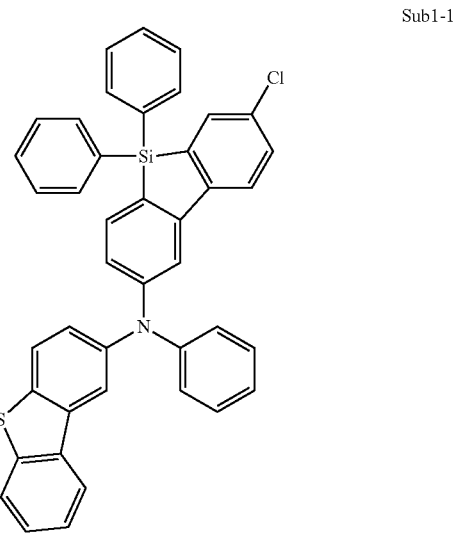

Sub1-1

-continued
Sub1-2
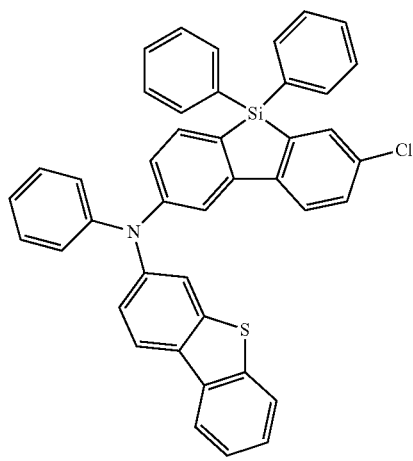
Sub1-3
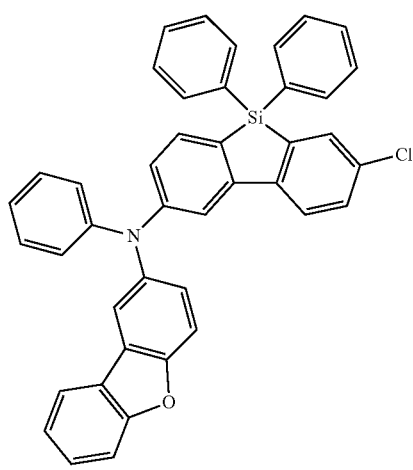
Sub1-4
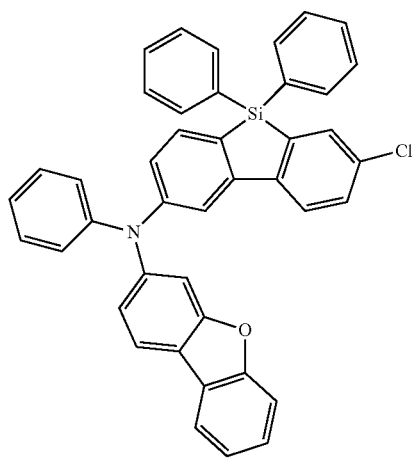
Sub1-5
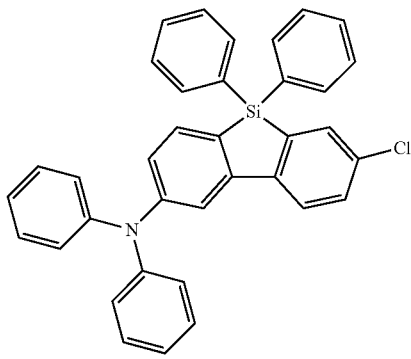
Sub1-6
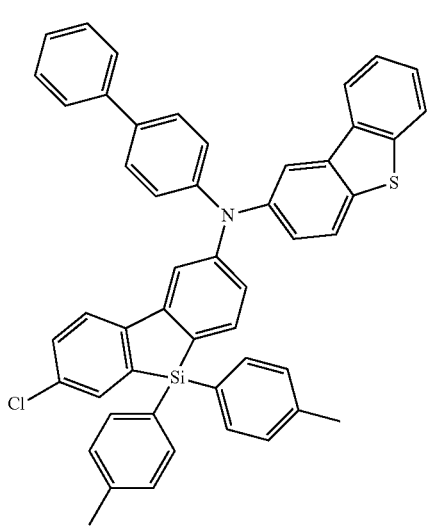
Sub1-7
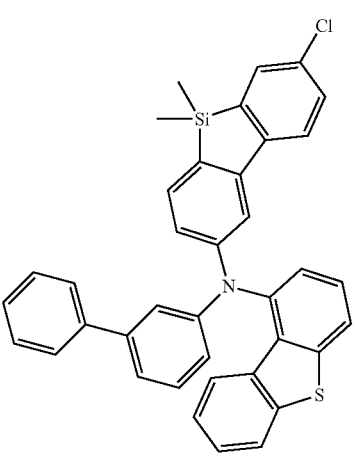

Sub1-8
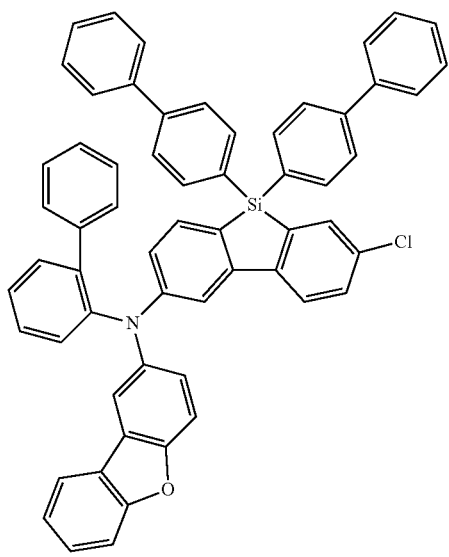
Sub1-9
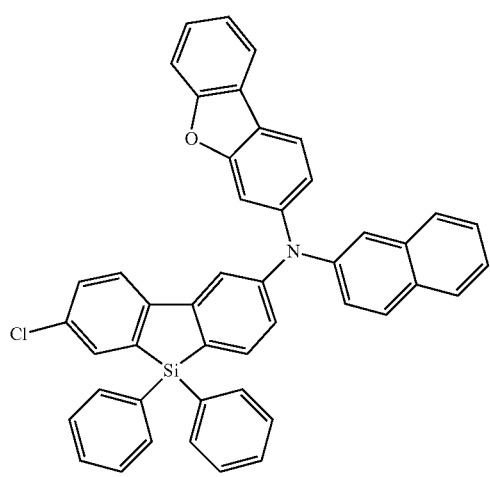
Sub1-10
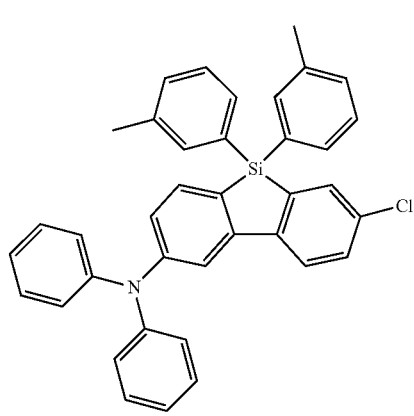
Sub1-11
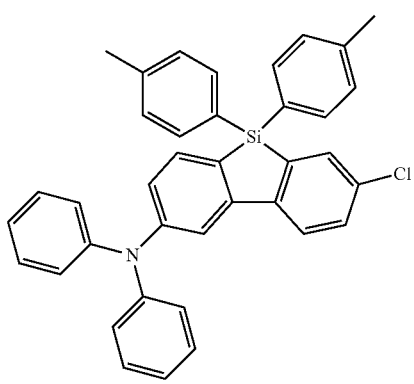
Sub1-12
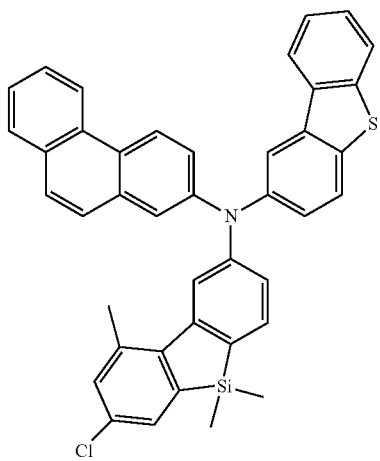
Sub1-13
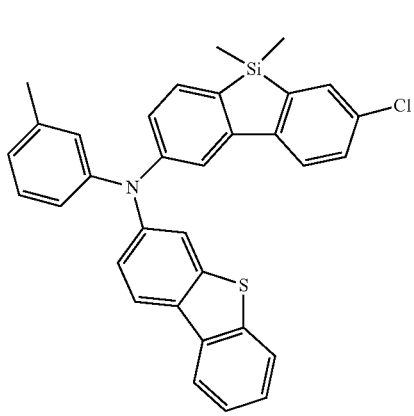

Sub1-14
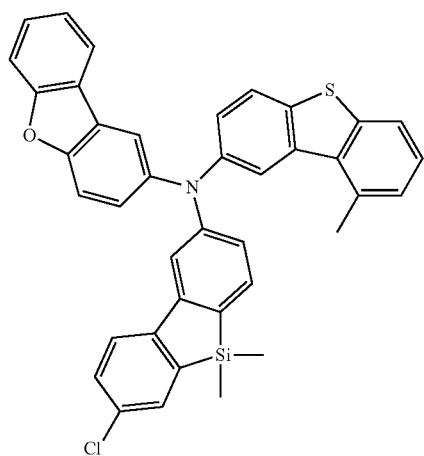
Sub1-15
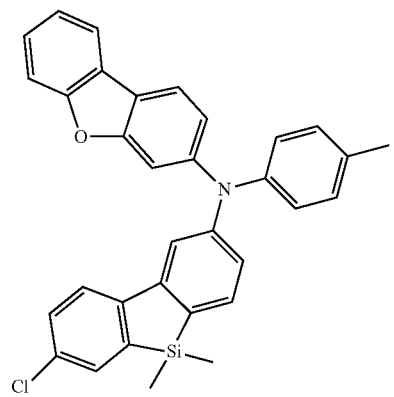
Sub1-16
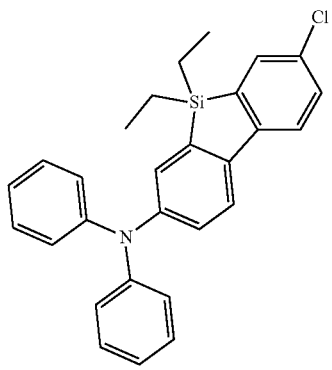
Sub1-17
Sub1-18
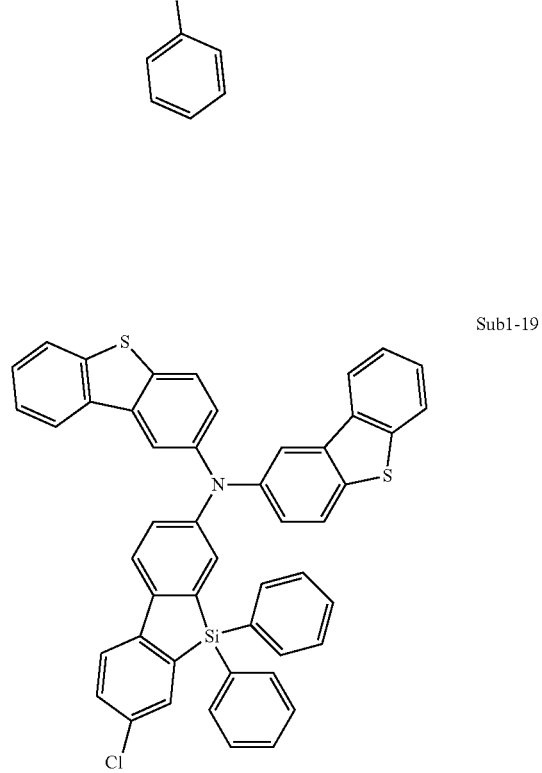
Sub1-19
Sub1-20
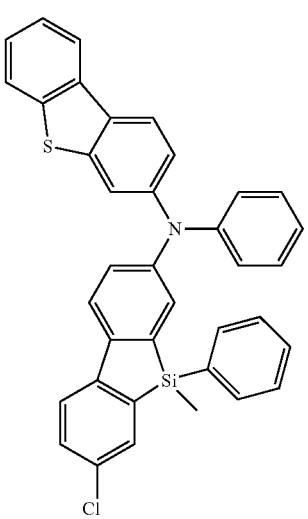

Sub1-21
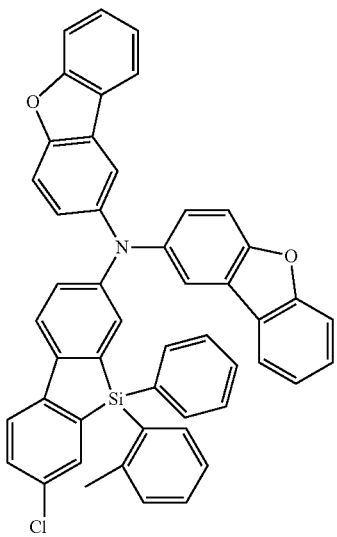
Sub1-22
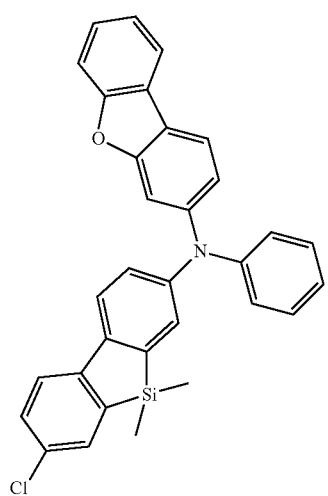
Sub1-23
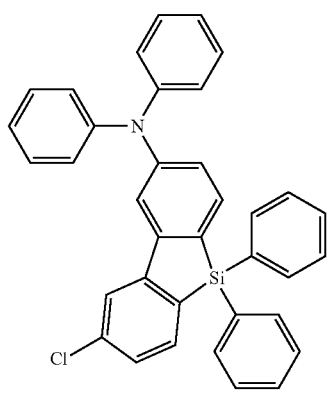
Sub1-24
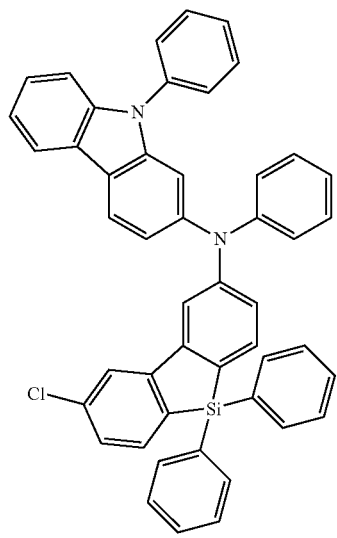
Sub1-25
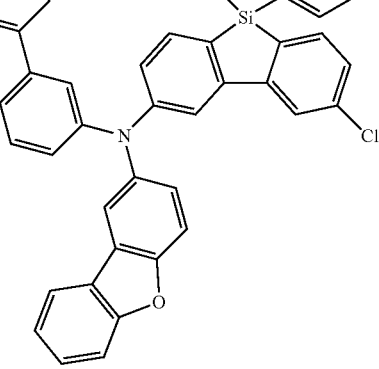
Sub1-26
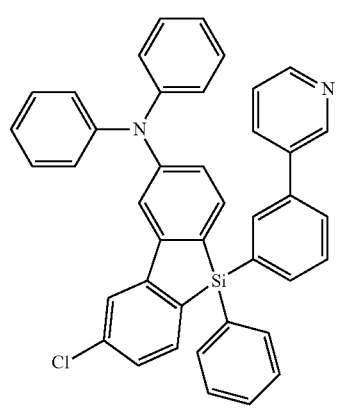

Sub1-27
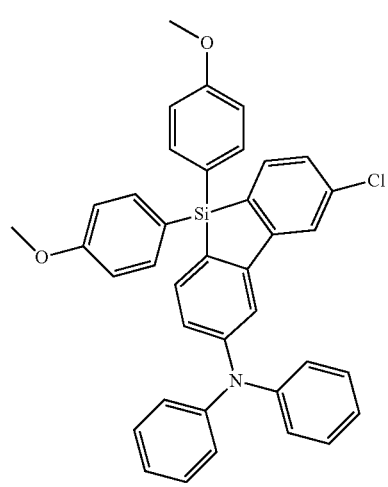
Sub1-30
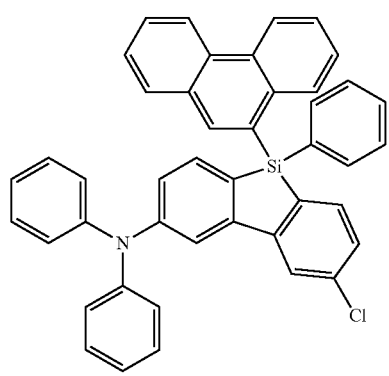
Sub1-28
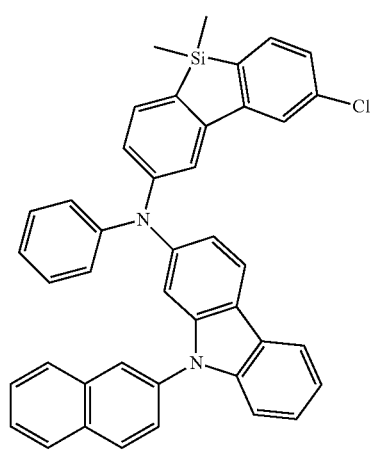
Sub1-31
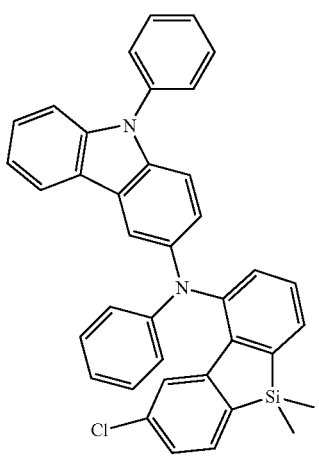
Sub1-29
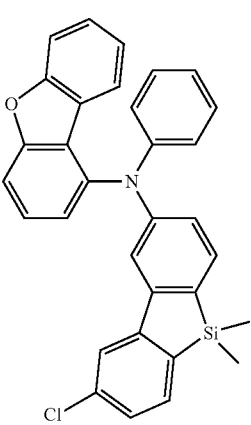
Sub1-32
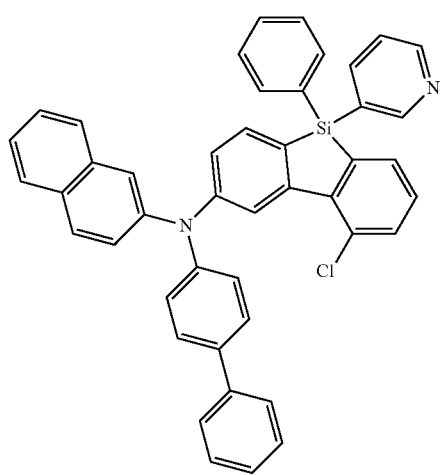

Sub1-33
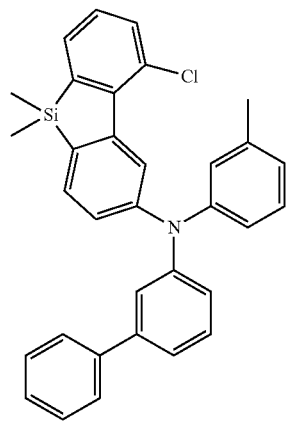
Sub1-36
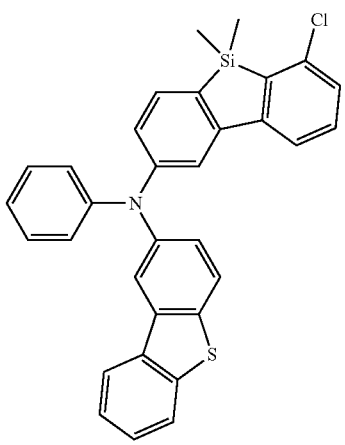
Sub1-34
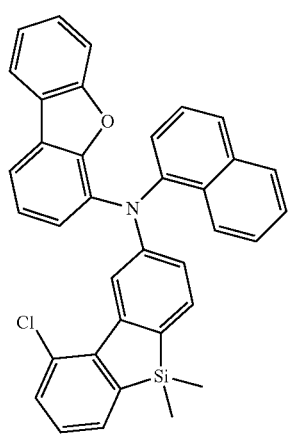
Sub1-37
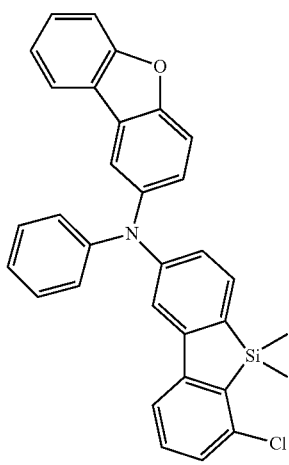
Sub1-35
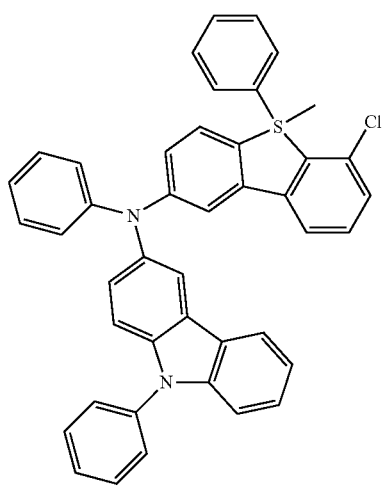
Sub1-38
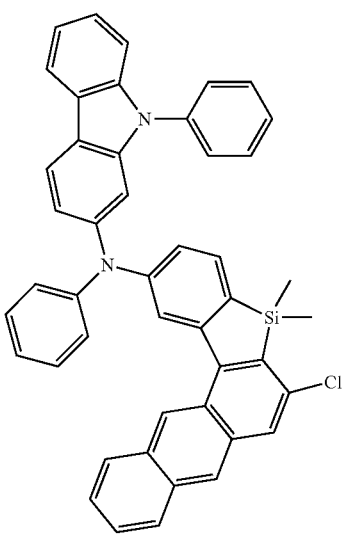

Sub1-39
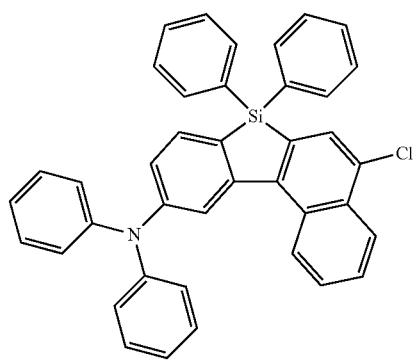
Sub1-42
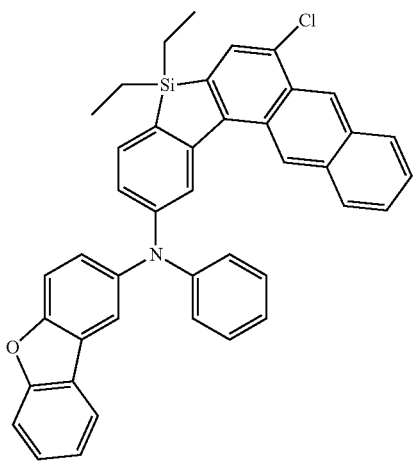
Sub1-40
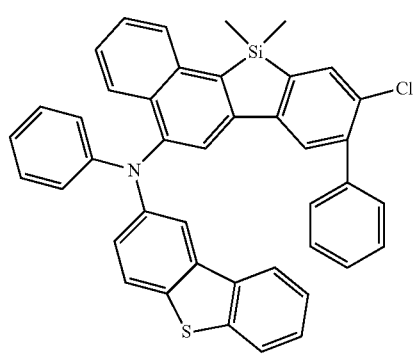
Sub1-43
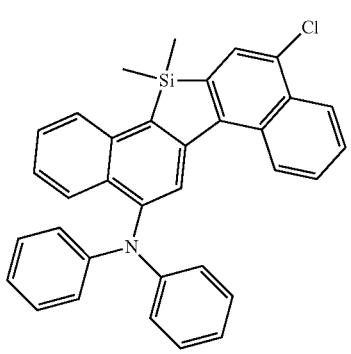
Sub1-44
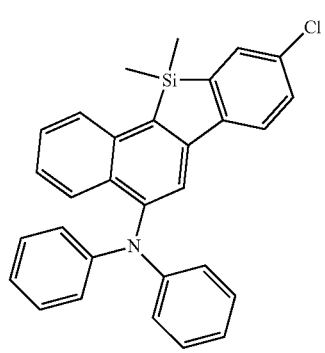
Sub1-41
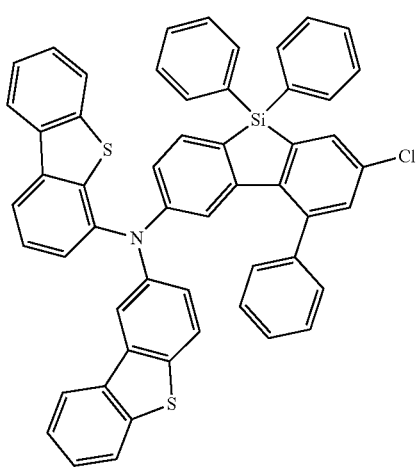
Sub1-45
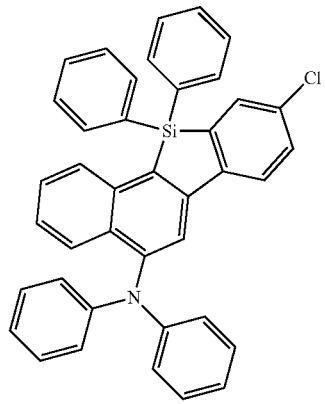

Sub1-46
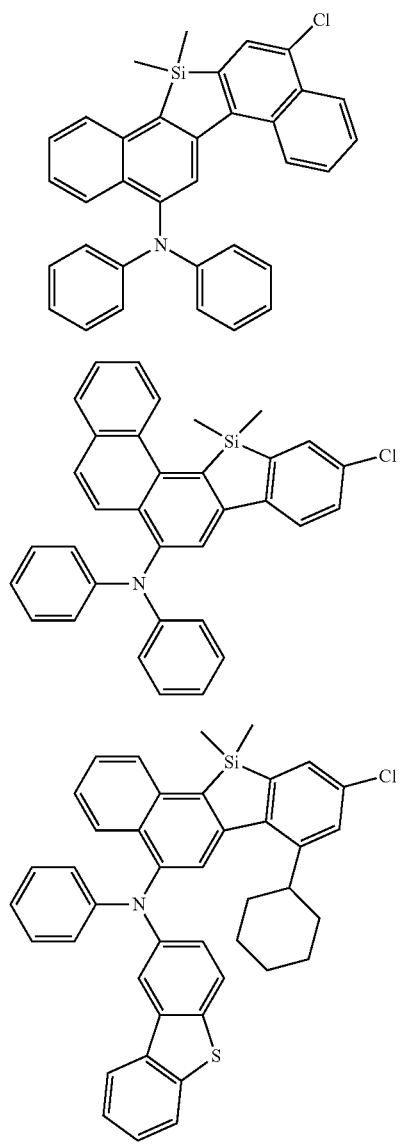
Sub1-47
Sub1-48
Sub1-49
Sub1-50
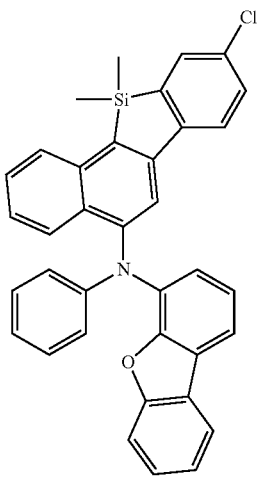
Sub1-51
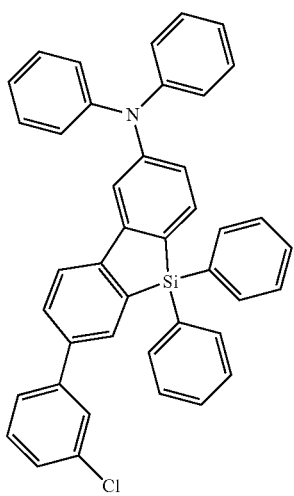
Sub1-52
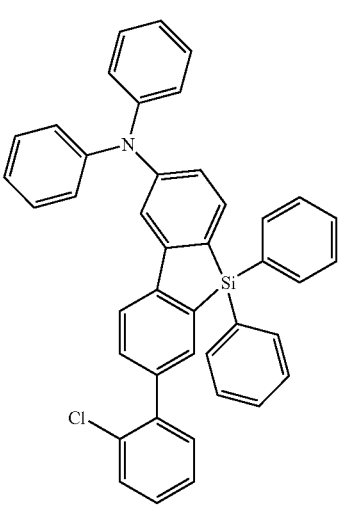

Sub1-53
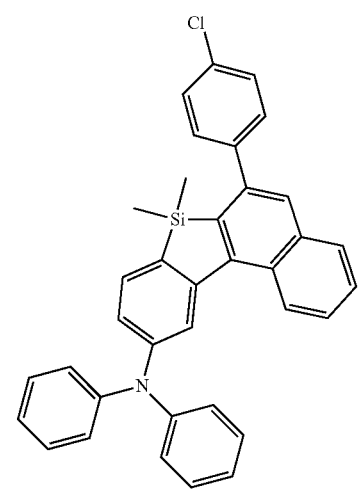
Sub1-54
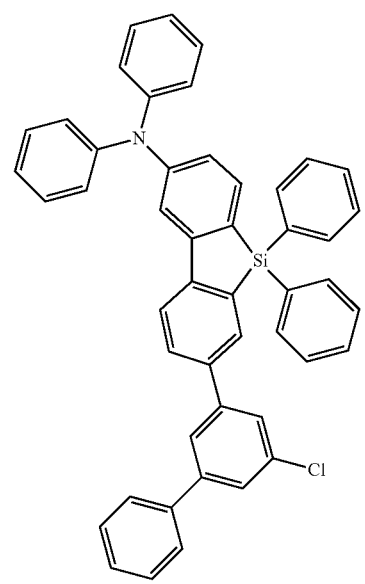
Sub1-55
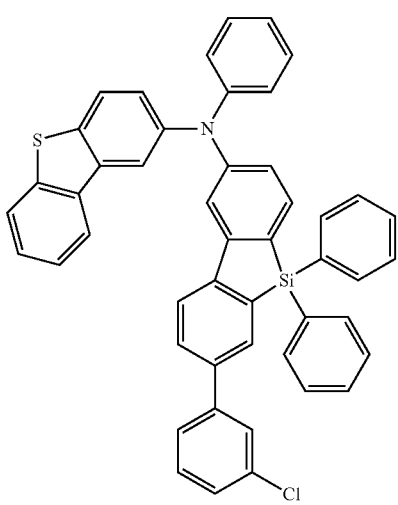
Sub1-56
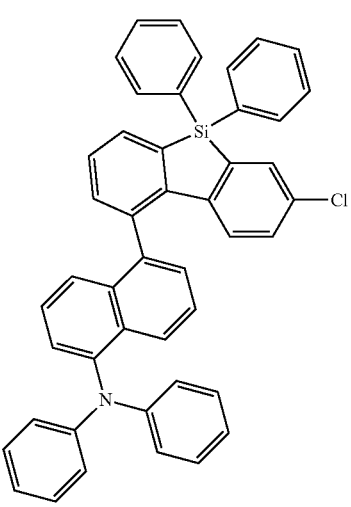
Sub1-57
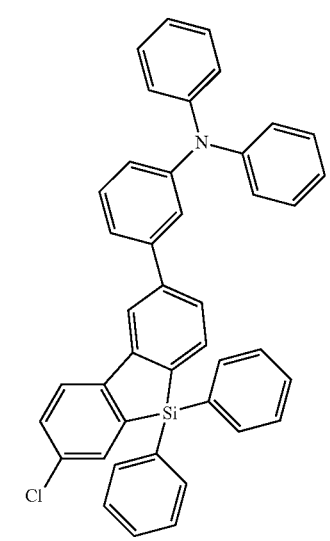
Sub1-58
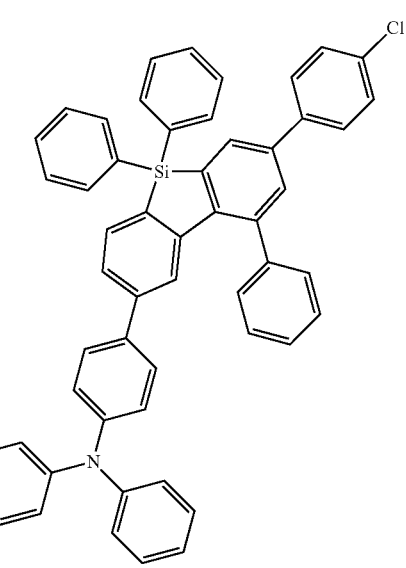

Sub1-59
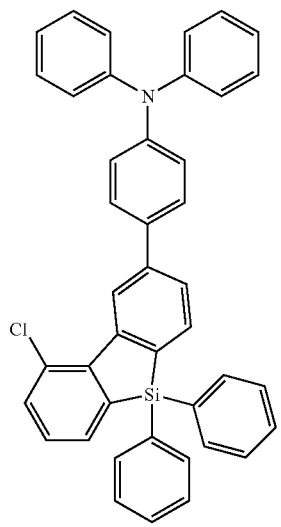

Sub1-60
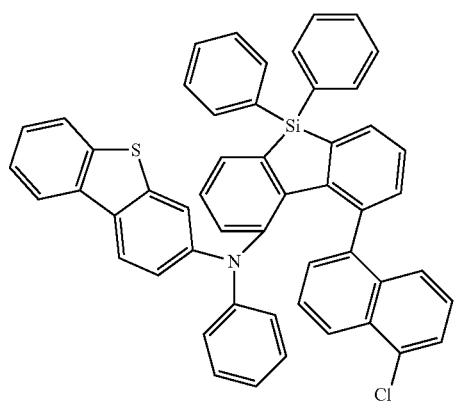

Sub1-61
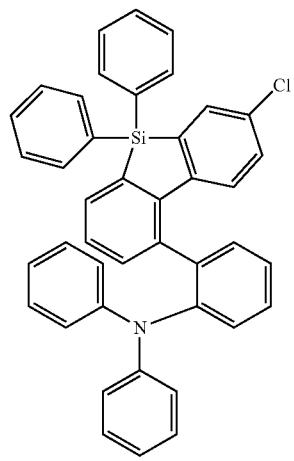

Sub1-62
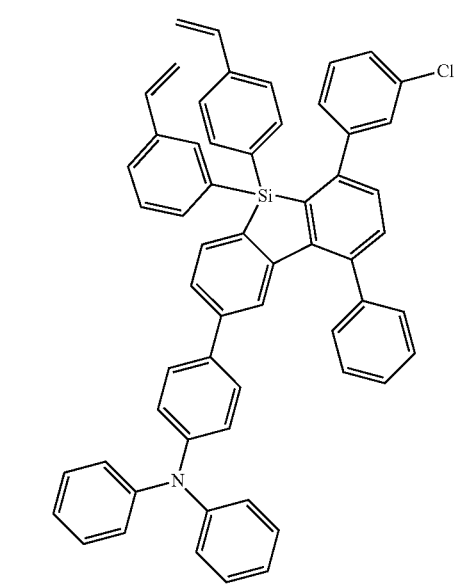

TABLE 1

| Compound | FD-MS | Compound | FD-MS |
|---|---|---|---|
| Sub 1-1 | m/z = 641.14 ($C_{42}H_{28}ClNSSi$ = 642.29) | Sub 1-2 | m/z = 641.14 ($C_{42}H_{28}ClNSSi$ = 642.29) |
| Sub 1-3 | m/z = 625.16 ($C_{42}H_{28}ClNOSi$ = 626.23) | Sub 1-4 | m/z = 625.16 ($C_{42}H_{28}ClNOSi$ = 626.23) |
| Sub 1-5 | m/z = 535.15 ($C_{36}H_{26}ClNSi$ = 536.15) | Sub 1-6 | m/z = 745.20 ($C_{50}H_{36}ClNSSi$ = 746.44) |
| Sub 1-7 | m/z = 593.14 ($C_{38}H_{28}ClNSSi$ = 594.24) | Sub 1-8 | m/z = 853.26 ($C_{60}H_{40}ClNOSi$ = 854.24) |
| Sub 1-9 | m/z = 675.18 ($C_{46}H_{30}ClNOSi$ = 676.29) | Sub 1-10 | m/z = 563.18 ($C_{38}H_{30}ClNSi$ = 564.20) |
| Sub 1-11 | m/z = 563.18 ($C_{38}H_{30}ClNSi$ = 564.20) | Sub 1-12 | m/z = 631.16 ($C_{41}H_{30}ClNSSi$ = 632.29) |
| Sub 1-13 | m/z = 531.12 ($C_{33}H_{26}ClNSSi$ = 532.17) | Sub 1-14 | m/z = 621.13 ($C_{39}H_{28}ClNOSSi$ = 622.25) |
| Sub 1-15 | m/z = 515.15 ($C_{33}H_{26}ClNOSi$ = 516.11) | Sub 1-16 | m/z = 411.12 ($C_{26}H_{22}ClNSi$ = 412.00) |
| Sub 1-17 | m/z = 535.15 ($C_{36}H_{26}ClNSi$ = 536.15) | Sub 1-18 | m/z = 439.15 ($C_{28}H_{26}ClNSi$ = 440.06) |
| Sub 1-19 | m/z = 747.13 ($C_{48}H_{30}ClNS_2Si$ = 748.43) | Sub 1-20 | m/z = 579.12 ($C_{37}H_{26}ClNSSi$ = 580.22) |
| Sub 1-21 | m/z = 729.19 ($C_{49}H_{32}ClNO_2Si$ = 730.34) | Sub 1-22 | m/z = 501.13 ($C_{32}H_{24}ClNOSi$ = 502.09) |
| Sub 1-23 | m/z = 535.15 ($C_{36}H_{26}ClNSi$ = 536.15) | Sub 1-24 | m/z = 700.21 ($C_{48}H_{33}ClN_2Si$ = 701.34) |
| Sub 1-25 | m/z = 701.19 ($C_{48}H_{32}ClNOSi$ = 702.33) | Sub 1-26 | m/z = 612.18 ($C_{41}H_{29}ClN_2Si$ = 613.23) |
| Sub 1-27 | m/z = 595.17 ($C_{38}H_{30}ClNO_2Si$ = 596.20) | Sub 1-28 | m/z = 626.19 ($C_{42}H_{31}ClN_2Si$ = 627.26) |
| Sub 1-29 | m/z = 501.13 ($C_{32}H_{24}ClNOSi$ = 502.09) | Sub 1-30 | m/z = 635.18 ($C_{44}H_{30}ClNSi$ = 636.27) |
| Sub 1-31 | m/z = 576.18 ($C_{38}H_{29}ClN_2Si$ = 577.20) | Sub 1-32 | m/z = 662.19 ($C_{45}H_{31}ClN_2Si$ = 663.29) |
| Sub 1-33 | m/z = 501.17 ($C_{33}H_{28}ClNSi$ = 502.13) | Sub 1-34 | m/z = 551.15 ($C_{36}H_{26}ClNOSi$ = 552.15) |
| Sub 1-35 | m/z = 638.19 ($C_{43}H_{31}ClN_2Si$ = 639.27) | Sub 1-36 | m/z = 517.11 ($C_{32}H_{24}ClNSSi$ = 518.15) |
| Sub 1-37 | m/z = 501.13 ($C_{32}H_{24}ClNOSi$ = 502.09) | Sub 1-38 | m/z = 676.21 ($C_{46}H_{33}ClN2Si$ = 677.32) |
| Sub 1-39 | m/z = 585.17 ($C_{40}H_{28}ClNSi$ = 586.21) | Sub 1-40 | m/z = 643.16 ($C_{42}H_{30}ClNSSi$ = 644.30) |
| Sub 1-41 | m/z = 823.16 ($C_{54}H_{34}ClNS_2Si$ = 824.53) | Sub 1-42 | m/z = 629.19 ($C_{42}H_{32}ClNOSi$ = 630.26) |
| Sub 1-43 | m/z = 511.15 ($C_{34}H_{26}ClNSi$ = 512.12) | Sub 1-44 | m/z = 461.14 ($C_{30}H_{24}ClNSi$ = 462.06) |
| Sub 1-45 | m/z = 585.17 ($C_{40}H_{28}ClNSi$ = 586.21) | Sub 1-46 | m/z = 511.15 ($C_{34}H_{26}ClNSi$ = 512.12) |

TABLE 1-continued

| Compound | FD-MS | Compound | FD-MS |
| --- | --- | --- | --- |
| Sub 1-47 | m/z = 511.15 ($C_{34}H_{26}ClNSi$ = 512.12) | Sub 1-48 | m/z = 649.20 ($C_{42}H_{36}ClNSi$ = 650.35) |
| Sub 1-49 | m/z = 661.20 ($C_{46}H_{32}ClNSi$ = 662.30) | Sub 1-50 | m/z = 551.15 ($C_{36}H_{26}ClNOSi$ = 552.15) |
| Sub 1-51 | m/z = 611.18 ($C_{42}H_{30}ClNSi$ = 612.24) | Sub 1-52 | m/z = 611.18 ($C_{42}H_{30}ClNSi$ = 612.24) |
| Sub 1-53 | m/z = 537.17 ($C_{36}H_{28}ClNSi$ = 538.16) | Sub 1-54 | m/z = 687.21 ($C_{48}H_{34}ClNSi$ = 688.34) |
| Sub 1-55 | m/z = 717.17 ($C_{48}H_{32}ClNSSi$ = 718.39) | Sub 1-56 | m/z = 661.20 ($C_{46}H_{32}ClNSi$ = 662.30) |
| Sub 1-57 | m/z = 611.18 ($C_{42}H_{30}ClNSi$ = 612.24) | Sub 1-58 | m/z = 763.25 ($C_{54}H_{38}ClNSi$ = 764.44) |
| Sub 1-59 | m/z = 611.18 ($C_{42}H_{30}ClNSi$ = 612.24) | Sub 1-60 | m/z = 767.19 ($C_{52}H_{34}ClNSSi$ = 768.45) |
| Sub 1-61 | m/z = 611.18 ($C_{42}H_{30}ClNSi$ = 612.24) | Sub 1-62 | m/z = 815.28 ($C_{58}H_{42}ClNSi$ = 816.52) |

Sub 2 of Scheme 1 may be synthesized as follows, but is not limited thereto.

1. Synthesis Example of Sub 2-1

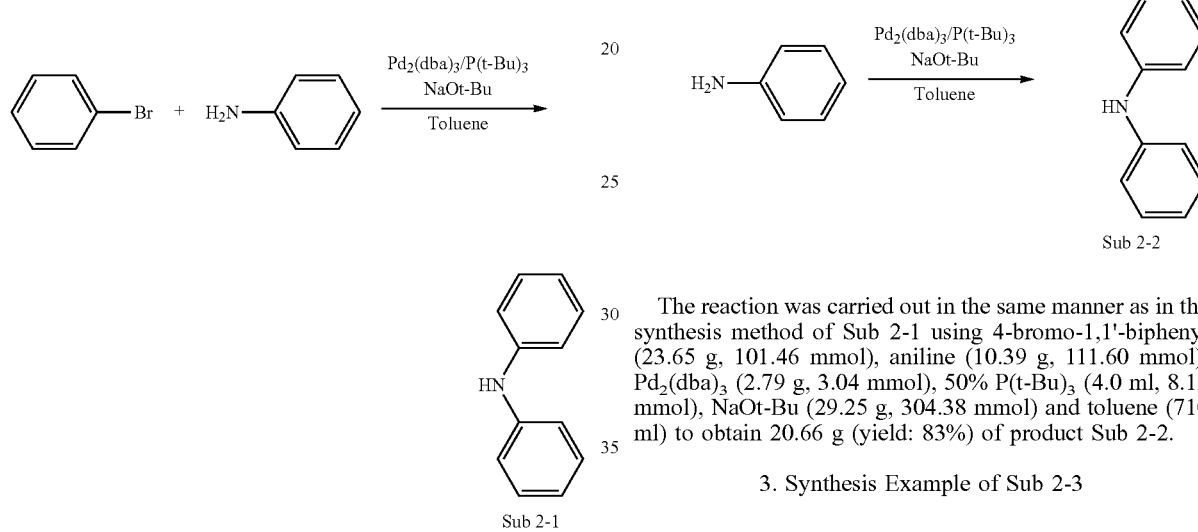

After dissolving bromobenzene (40.68 g, 259.09 mmol) in toluene (1360 ml) in a round bottom flask, aniline (26.54 g, 285.00 mmol), $Pd_2(dba)_3$ (7.12 g, 7.77 mmol), 50% $P(t-Bu)_3$ (10.1 ml, 20.73 mmol) and NaOt-Bu (74.70 g, 777.28 mmol) were added the solution, and the mixture was stirred at 80° C. When the reaction was completed, the reaction product was extracted with $CH_2Cl_2$ and water, the organic layer was dried with $MgSO_4$ and concentrated. Thereafter, the concentrate was separated by a silica gel column and recrystallized to obtain 32.88 g (yield: 75%) of product Sub 2-1.

2. Synthesis Example of Sub 2-2

The reaction was carried out in the same manner as in the synthesis method of Sub 2-1 using 4-bromo-1,1'-biphenyl (23.65 g, 101.46 mmol), aniline (10.39 g, 111.60 mmol), $Pd_2(dba)_3$ (2.79 g, 3.04 mmol), 50% $P(t-Bu)_3$ (4.0 ml, 8.12 mmol), NaOt-Bu (29.25 g, 304.38 mmol) and toluene (710 ml) to obtain 20.66 g (yield: 83%) of product Sub 2-2.

3. Synthesis Example of Sub 2-3

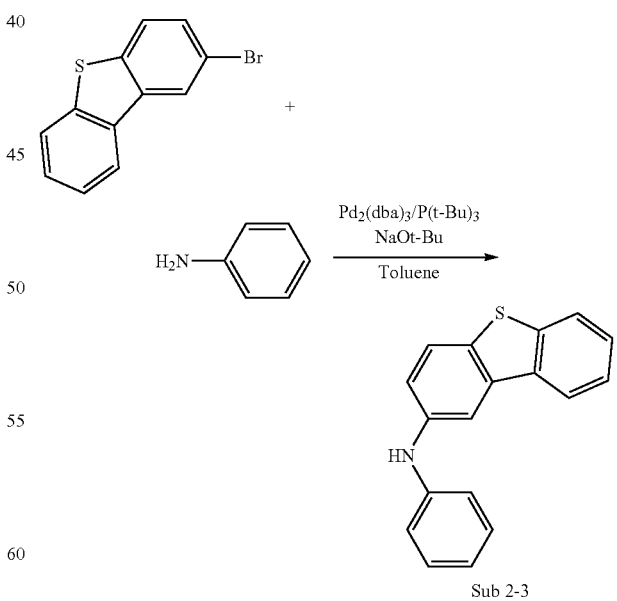

The reaction was carried out in the same manner as in the synthesis method of Sub 2-1 using 2-bromodibenzo[b,d]thiophene (38.11 g, 144.82 mmol), aniline (14.84 g, 159.30 mmol), $Pd_2(dba)_3$ (3.98 g, 4.34 mmol), 50% $P(t-Bu)_3$ (5.6 ml, 11.59 mmol), NaOt-Bu (41.76 g, 434.47 mmol) and toluene (760 ml) to obtain 30.7 g (yield: 77%) of product Sub 2-3.

4. Synthesis Example of Sub 2-26

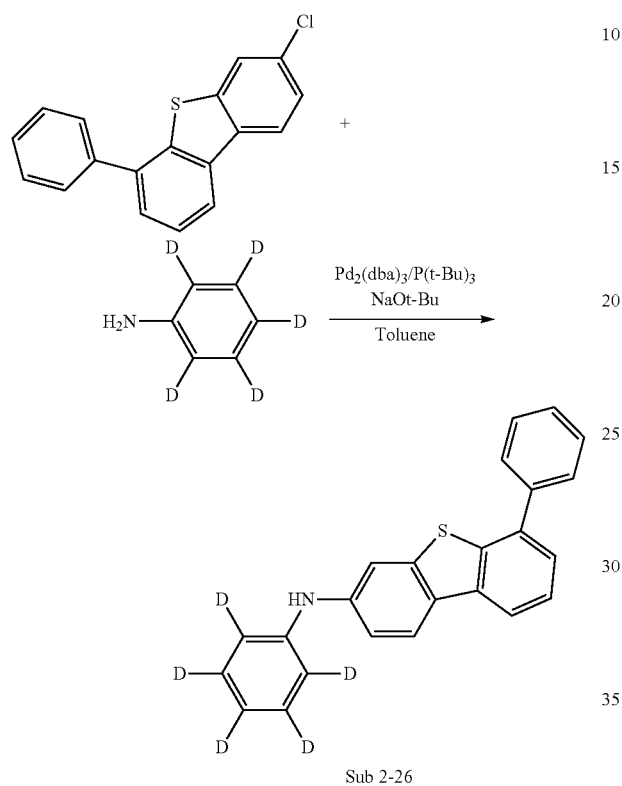

Sub 2-26

The reaction was carried out in the same manner as in the synthesis method of Sub 2-1 using 3-chloro-6-phenyldibenzo[b,d]thiophene (30 g, 0.1 mol), benzen-d5-amine (10 g, 0.1 mol), Pd₂(dba)₃ (2.8 g, 0.03 mol), 50% P(t-Bu)₃ (2.4 ml, 006 mol), NaOt-Bu (29.3 g, 0.3 mol) and toluene (200 ml) to obtain 32 g (yield: 88%) of product Sub 2-26.

Compounds belonging to Sub 2 prepared by the above synthesis example may be the following compounds, but is not limited thereto, and Table 2 shows the FD-MS value of the following compounds.

Sub2-1

Sub2-2

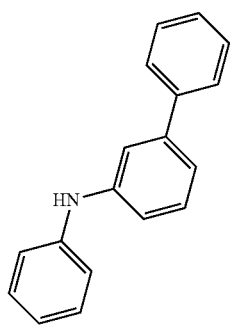

Sub2-3

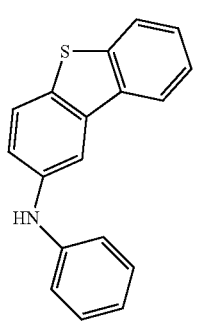

Sub2-4

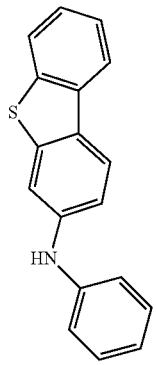

Sub2-5

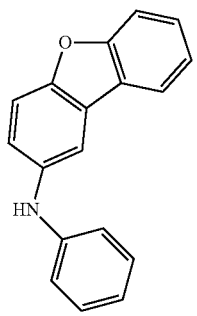

Sub2-6
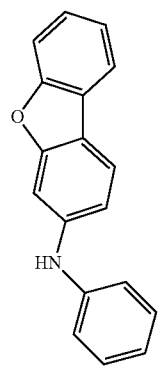
Sub2-7
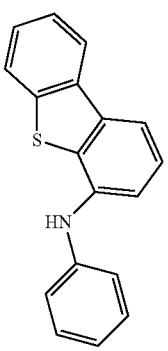
Sub2-8
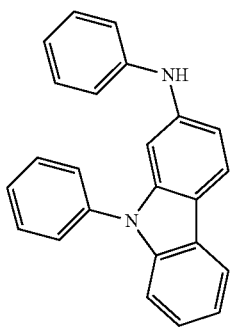
Sub2-9
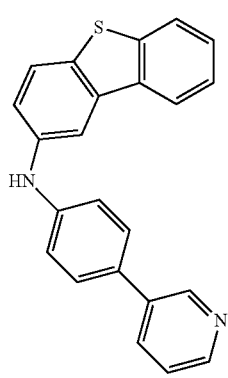
Sub2-10
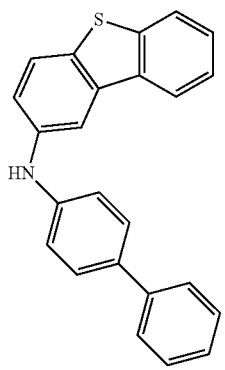
Sub2-11
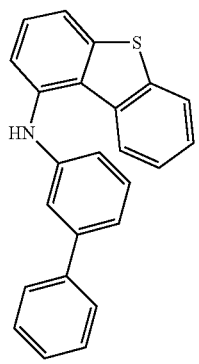
Sub2-12
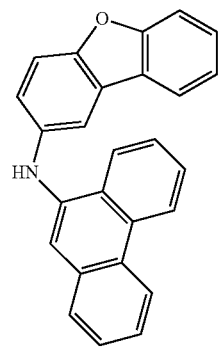
Sub2-13
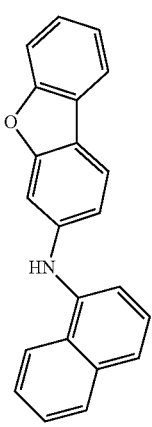

Sub2-14
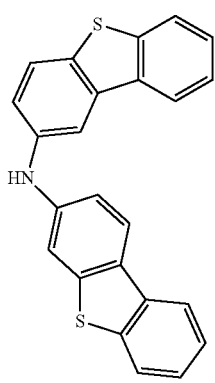
Sub2-15
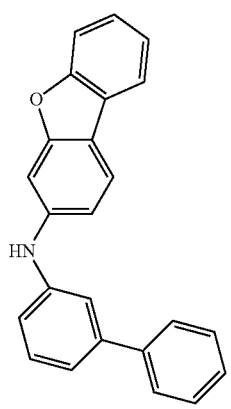
Sub2-16
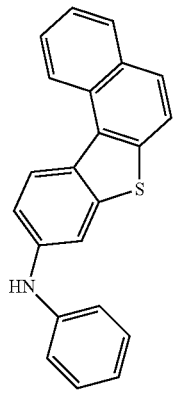
Sub2-17
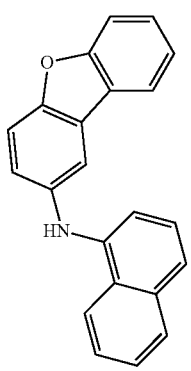
Sub2-18
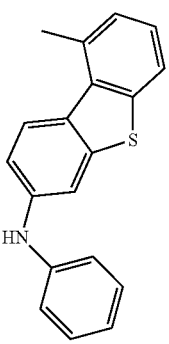
Sub2-19
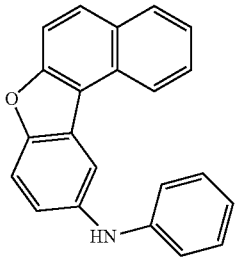
Sub2-20
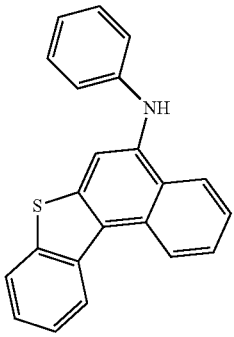
Sub2-21
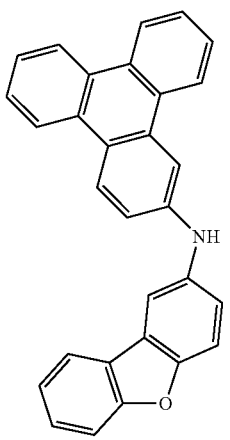

Sub2-22
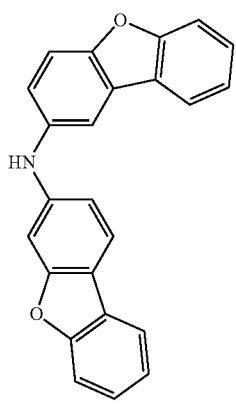
Sub2-23
Sub2-24
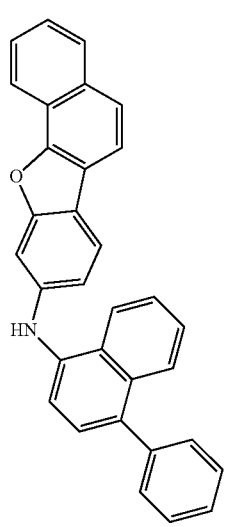
Sub2-25
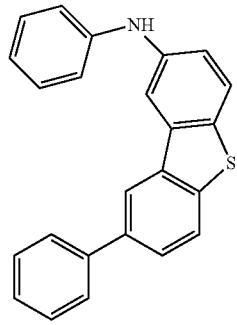
Sub2-26
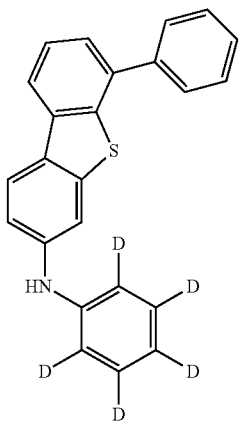
Sub2-27
Sub2-28
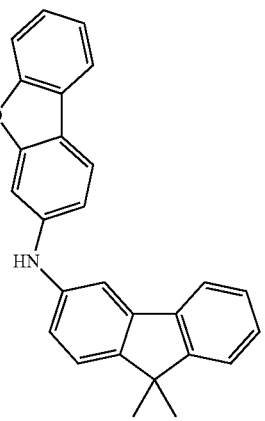

-continued

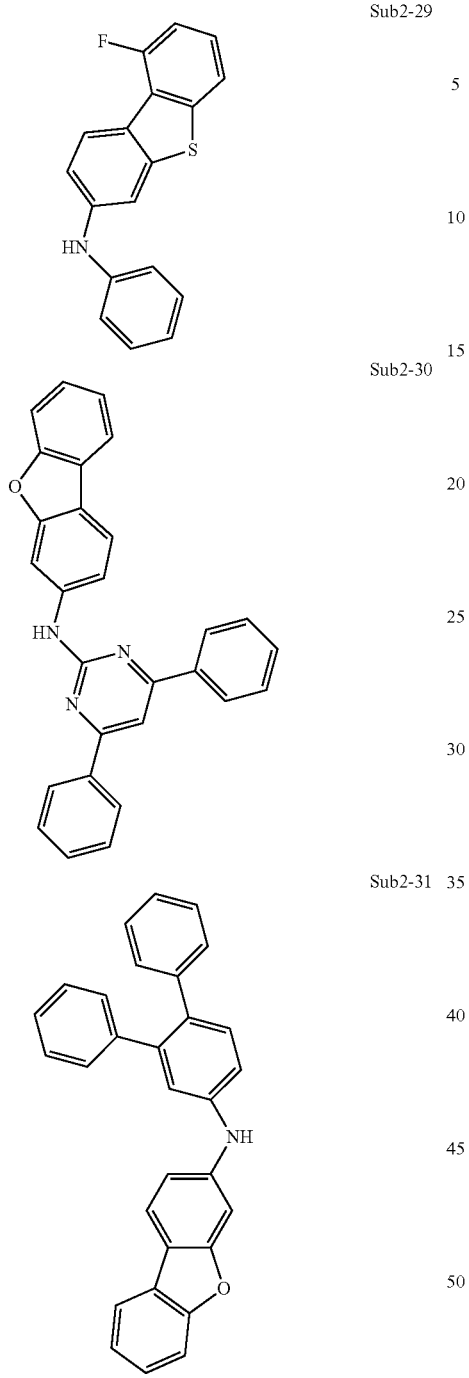

Sub2-29

Sub2-30

Sub2-31

-continued

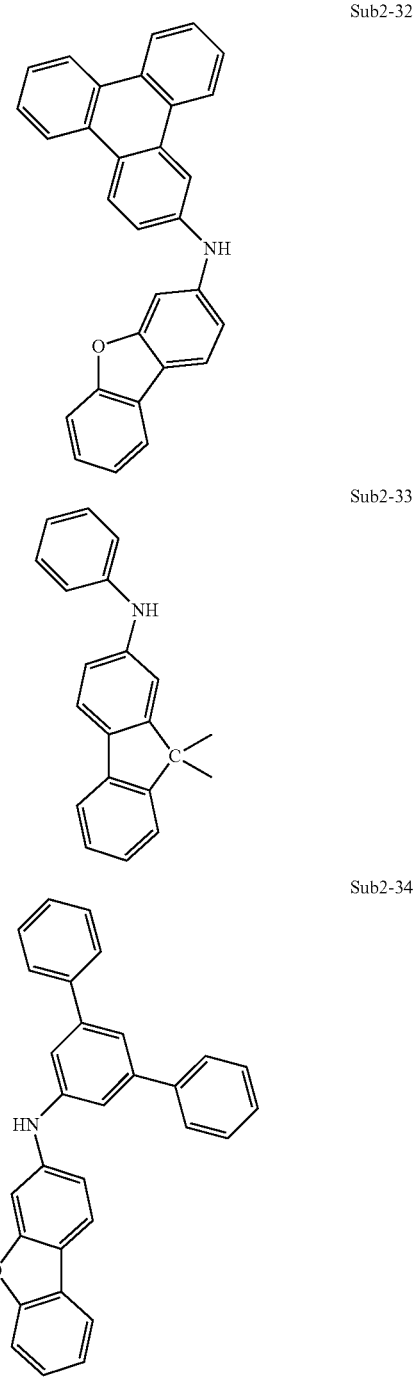

Sub2-32

Sub2-33

Sub2-34

TABLE 2

| Compound | FD-MS | Compound | FD-MS |
| --- | --- | --- | --- |
| Sub 2-1 | m/z = 169.09 ($C_{12}H_{11}N$ = 169.23) | Sub 2-2 | m/z = 245.12 ($C_{18}H_{15}N$ = 245.33) |
| Sub 2-3 | m/z = 275.08 ($C_{18}H_{13}NS$ = 275.37) | Sub 2-4 | m/z = 275.08 ($C_{18}H_{13}NS$ = 275.37) |
| Sub 2-5 | m/z = 259.10 ($C_{18}H13NO$ = 259.31) | Sub 2-6 | m/z = 259.10 ($C_{18}H_{13}NO$ = 259.31) |
| Sub 2-7 | m/z = 275.08 ($C_{18}H_{13}NS$ = 275.37) | Sub 2-8 | m/z = 334.15 ($C_{24}H_{18}N_2$ = 334.42) |
| Sub 2-9 | m/z = 352.10 ($C_{23}H_{16}N_2S$ = 352.46) | Sub 2-10 | m/z = 351.11 ($C_{24}H_{17}NS$ = 351.47) |
| Sub 2-11 | m/z = 351.11 ($C_{24}H_{17}NS$ = 351.47) | Sub 2-12 | m/z = 359.13 ($C_{26}H_{17}NO$ = 359.43) |
| Sub 2-13 | m/z = 309.12 ($C_{22}H_{15}NO$ = 309.37) | Sub 2-14 | m/z = 381.06 ($C_{24}H_{15}NS_2$ = 381.51) |
| Sub 2-15 | m/z = 335.13 ($C_{24}H_{17}NO$ = 335.41) | Sub 2-16 | m/z = 325.09 ($C_{22}H_{15}NS$ = 325.43) |
| Sub 2-17 | m/z = 309.12 ($C_{22}H_{15}NO$ = 309.37) | Sub 2-18 | m/z = 289.09 ($C_{19}H_{15}NS$ = 289.40) |

TABLE 2-continued

| Compound | FD-MS | Compound | FD-MS |
|---|---|---|---|
| Sub 2-19 | m/z = 309.12 ($C_{22}H_{15}NO$ = 309.37) | Sub 2-20 | m/z = 325.09 ($C_{22}H_{15}NS$ = 325.43) |
| Sub 2-21 | m/z = 409.15 ($C_{30}H_{19}NO$ = 409.49) | Sub 2-22 | m/z = 349.11 ($C_{24}H_{15}NO_2$ = 349.39) |
| Sub 2-23 | m/z = 440.13 ($C_{30}H_{20}N_2S$ = 440.56) | Sub 2-24 | m/z = 435.16 ($C_{32}H_{21}NO$ = 435.53) |
| Sub 2-25 | m/z = 351.11 ($C_{24}H_{17}NS$ = 351.47) | Sub 2-26 | m/z = 356.14 ($C_{24}H_{12}D_5NS$ = 356.50) |
| Sub 2-27 | m/z = 375.16 ($C_{27}H_{21}NO$ = 375.47) | Sub 2-28 | m/z = 385.15 ($C_{28}H_{19}NO$ = 385.47) |
| Sub 2-29 | m/z = 293.07 ($C_{18}H_{12}FNS$ = 293.36) | Sub 2-30 | m/z = 413.15 ($C_{28}H_{19}N_3O$ = 413.48) |
| Sub 2-31 | m/z = 411.16 ($C_{30}H_{21}NO$ = 411.50) | Sub 2-32 | m/z = 409.15 ($C_{30}H_{19}NO$ = 409.49) |
| Sub 2-33 | m/z = 285.15 ($C_{21}H_{19}N$ = 285.39) | Sub 2-34 | m/z = 411.16 ($C_{30}H_{21}NO$ = 411.50) |

Synthesis Example of Final Compound

1. Synthesis Example of P-1

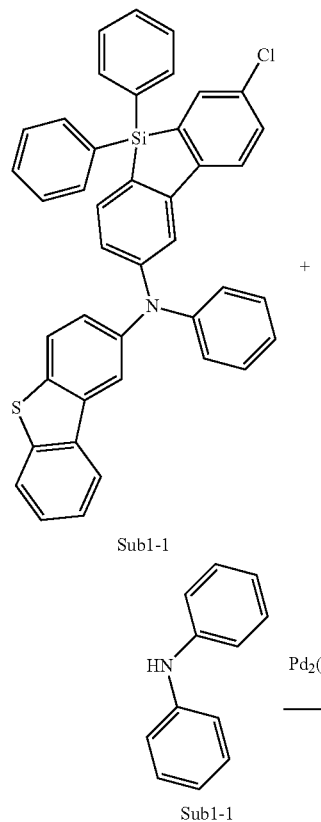

After dissolving Sub 1-1 (10 g, 0.016 mol) in toluene (31 ml), Sub 2-1 (2.6 g, 0.016 mol), Pd$_2$(dba)$_3$ (0.4 g, 0.0005 mmol), 50% P(t-Bu)$_3$ (0.4 ml, 0.001 mmol) and NaOt-Bu (4.5 g, 0.05 mol) were added the solution and the mixture was stirred at 130° C. When the reaction was completed, the reaction product was extracted with CH$_2$Cl$_2$ and water, the organic layer was dried with MgSO$_4$ and concentrated. Thereafter, the concentrate was separated by a silica gel column and recrystallized to obtain 10 g (yield: 83%) of product P-1.

2. Synthesis Example of P-13

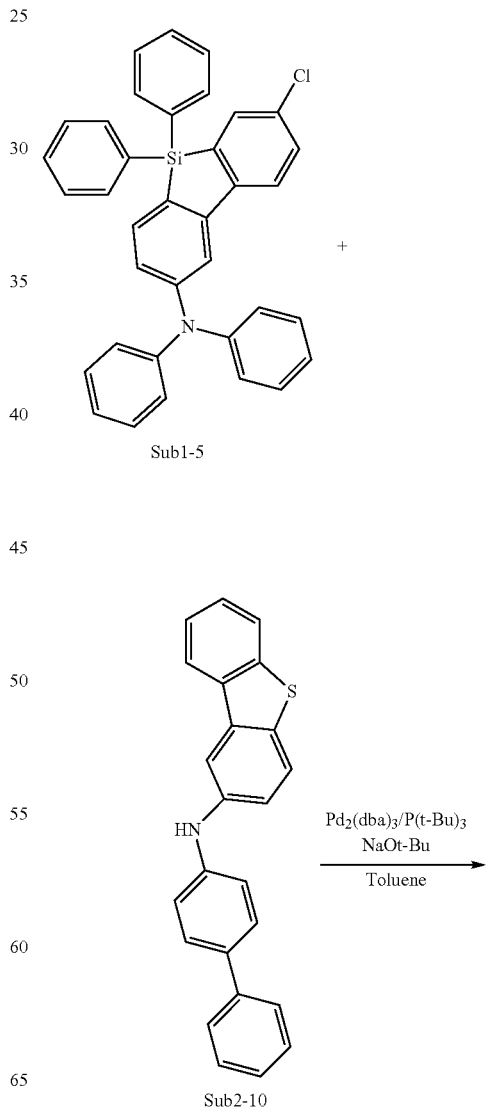

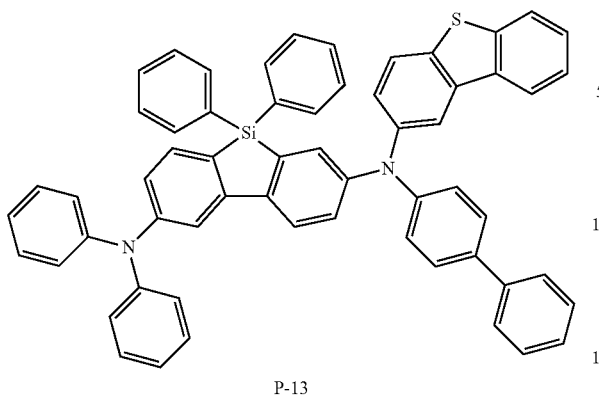

P-13

The reaction was carried out in the same manner as in the synthesis method of P-1 using Sub 1-5 (13 g, 0.024 mol), Sub 2-10 (8.5 g, 0.024 mol), Pd$_2$(dba)$_3$ (0.7 g, 0.0007 mol), P(t-Bu)$_3$ (0.6 mL, 0.0007 mmol), NaOt-Bu (7 g, 0.07 mol) and toluene (31 ml) to obtain 17 g (yield: 82%) of product P-13.

3. Synthesis Example of P-22

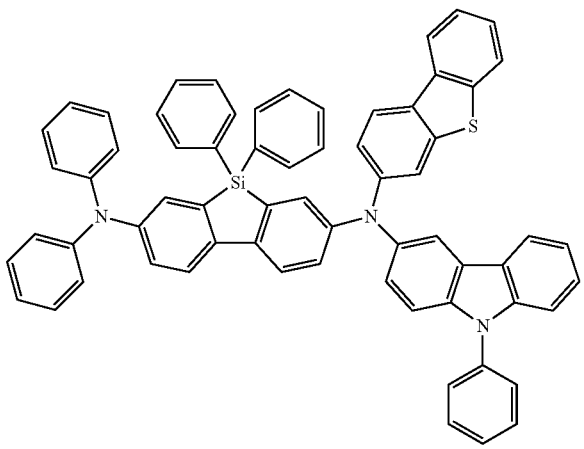

P-22

The reaction was carried out in the same manner as in the synthesis method of P-1 using Sub 1-17 (12 g, 0.02 mol), Sub 2-23 (9.8 g, 0.02 mol), Pd$_2$(dba)$_3$ (0.61 g, 0.0007 mol), P(t-Bu)$_3$ (0.5 mL, 0.001 mmol), NaOt-Bu (6.4 g, 0.06 mol) and toluene (33 ml) to obtain 17 g (yield: 80%) of product P-22.

4. Synthesis Example of P-59

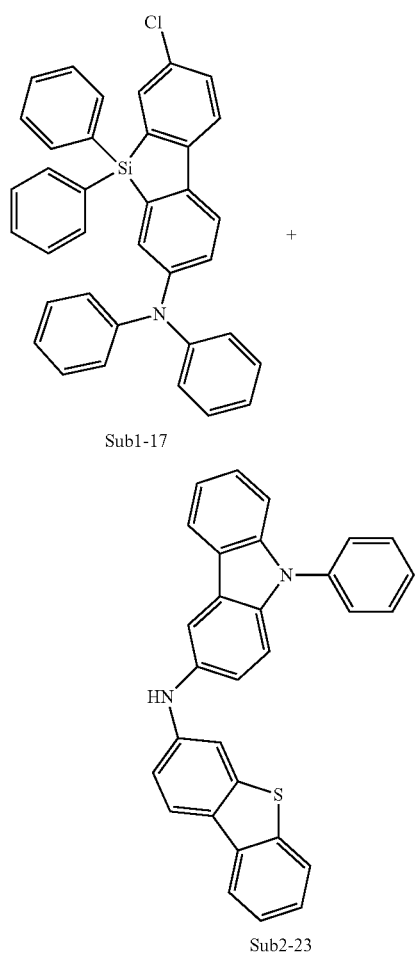

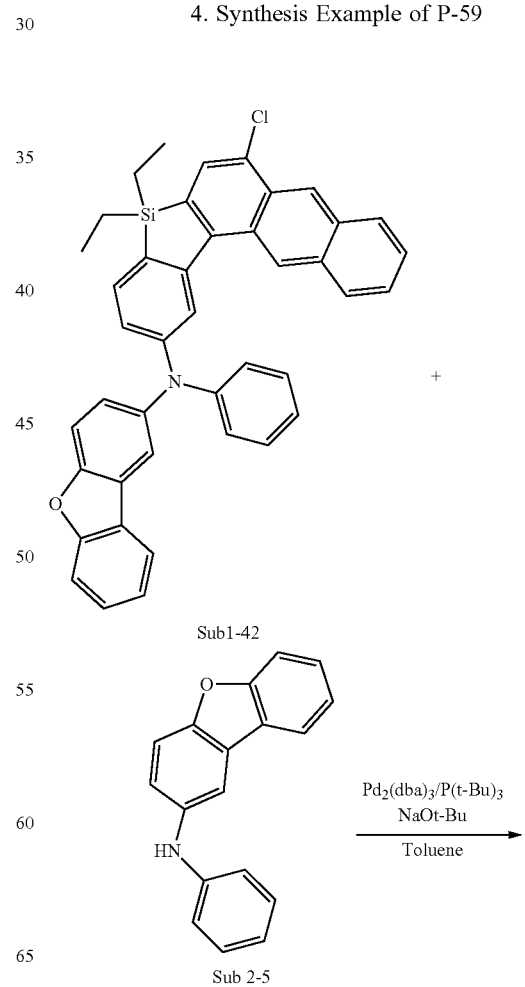

-continued

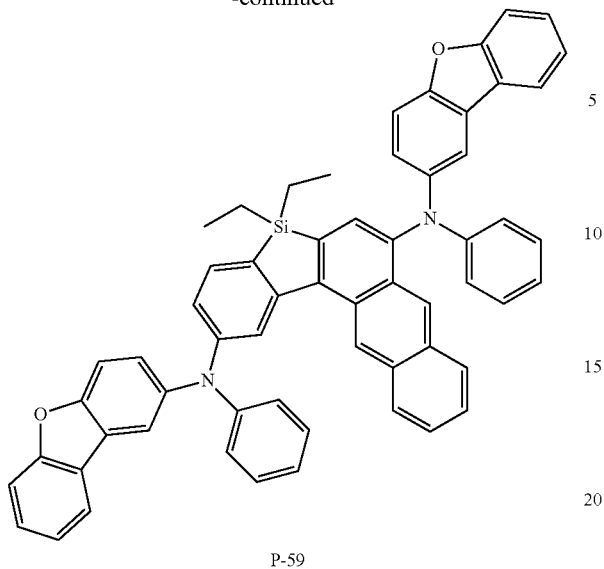

P-59

The reaction was carried out in the same manner as in the synthesis method of P-1 using Sub 1-42 (15 g, 0.023 mol), Sub 2-5 (6.2 g, 0.023 mmol), Pd$_2$(dba)$_3$ (0.65 g, 0.0007 mol), P(t-Bu)$_3$ (0.6 mL, 0.001 mol), NaOt-Bu (6.9 g, 0.07 mol) and toluene (35 ml) to obtain 18 g (yield: 83.6%) of product P-59.

5. Synthesis Example of P-73

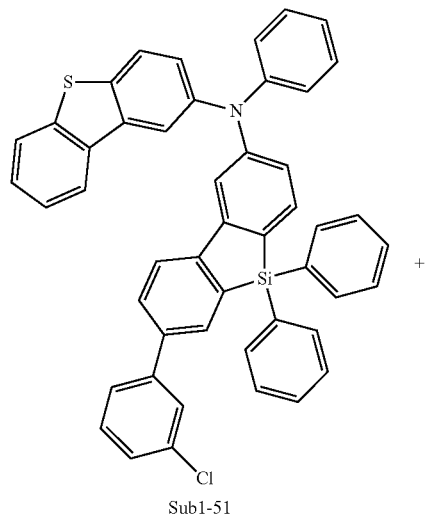

Sub1-51

+

-continued

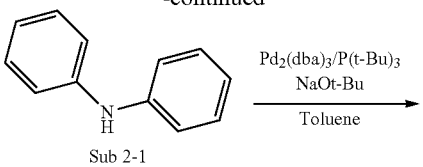

Sub 2-1

Pd$_2$(dba)$_3$/P(t-Bu)$_3$
NaOt-Bu
————→
Toluene

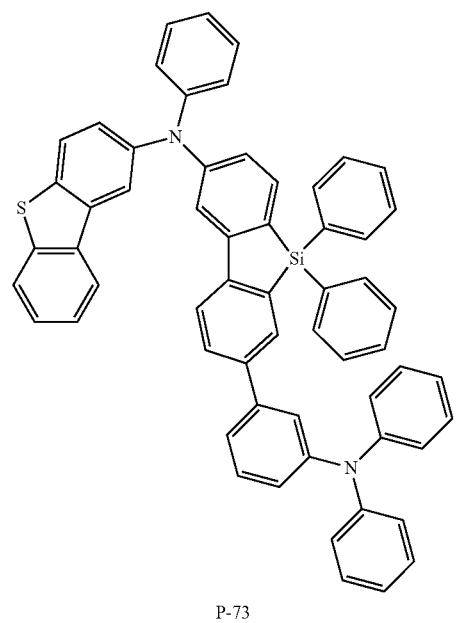

P-73

The reaction was carried out in the same manner as in the synthesis method of P-1 using Sub 1-51 (12 g, 0.016 mol), Sub 2-1 (2.8 g, 0.016 mmol), Pd$_2$(dba)$_3$ (0.46 g, 0.0005 mol), P(t-Bu)$_3$ (0.4 mL, 0.001 mmol) and NaOt-Bu (4.8 g, 0.05 mol) to obtain 11 g (yield: 77%) of product P-72.

The FD-MS values of compounds P-1 to P-80 of the present invention prepared according to the above synthesis examples are shown in Table 3 below.

TABLE 3

| Compound | FD-MS | Compound | FD-MS |
|---|---|---|---|
| P-1 | m/z = 774.25(C$_{54}$H$_{38}$N$_2$SSi = 775.06) | P-2 | m/z = 774.25 (C$_{54}$H$_{38}$N$_2$SSi = 775.06) |
| P-3 | m/z = 758.28(C$_{54}$H$_{38}$N$_2$OSi = 759.0) | P-4 | m/z = 758.28(C$_{54}$H$_{38}$N$_2$OSi = 759.0) |
| P-5 | m/z = 774.25(C$_{54}$H$_{38}$N$_2$SSi = 775.06) | P-6 | m/z = 774.25 (C$_{54}$H$_{38}$N$_2$SSi = 775.06) |
| P-7 | m/z = 758.28(C$_{54}$H$_{38}$N$_2$OSi = 759.0) | P-8 | m/z = 758.28(C$_{54}$H$_{38}$N$_2$OSi = 759.0) |
| P-9 | m/z = 878.32(C$_{62}$H$_{46}$N$_2$SSi = 879.2) | P-10 | m/z = 726.25(C$_{50}$H$_{38}$N$_2$SSi = 727.0) |
| P-11 | m/z = 986.37(C$_{72}$H$_{50}$N$_2$OSi = 987.3) | P-12 | m/z = 808.29(C$_{58}$H$_{40}$N$_2$OSi = 809.1) |
| P-13 | m/z = 850.28(C$_{60}$H$_{42}$N$_2$SSi = 851.2) | P-14 | m/z = 878.32(C$_{62}$H$_{46}$N$_2$SSi = 879.21) |
| P-15 | m/z = 886.34(C$_{64}$H$_{46}$N$_2$OSi = 887.2) | P-16 | m/z = 808.29(C$_{58}$H$_{40}$N$_2$OSi = 809.1) |
| P-17 | m/z = 764.27(C$_{53}$H$_{40}$N$_2$SSi = 765.1) | P-18 | m/z = 664.24(C$_{45}$H$_{36}$N$_2$SSi = 664.94) |

TABLE 3-continued

| Compound | FD-MS | Compound | FD-MS |
|---|---|---|---|
| P-19 | m/z = 754.25($C_{51}H_{38}N_2OSSi$ = 755.0) | P-20 | m/z = 648.26($C_{45}H_{36}N_2OSi$ = 648.9) |
| P-21 | m/z = 756.21($C_{50}H_{36}N_2S_2Si$ = 757.1) | P-22 | m/z = 939.31($C_{66}H_{45}N_3SSi$ = 940.25) |
| P-23 | m/z = 812.32($C_{58}H_{44}N_2S_2Si$ = 813.1) | P-24 | m/z = 974.37($C_{71}H_{50}N_2OSi$ = 975.3) |
| P-25 | m/z = 880.24($C_{60}H_{40}N_2S_2Si$ = 881.2) | P-26 | m/z = 818.22($C_{55}H_{38}N_2S_2Si$ = 819.1) |
| P-27 | m/z = 862.30($C_{61}H_{42}N_2O_2Si$ = 863.10) | P-28 | m/z = 740.23($C_{50}H_{36}N_2OSSi$ = 741.00) |
| P-29 | m/z = 851.28($C_{59}H_{41}N_3SSi$ = 852.1) | P-30 | m/z = 939.31($C_{66}H_{45}N_3SSi$ = 940.25) |
| P-31 | m/z = 910.34($C_{66}H_{46}N_2OSi$ = 911.2) | P-32 | m/z = 987.36($C_{71}H_{49}N_3OSi$ = 988.3) |
| P-33 | m/z = 910.3($C_{62}H_{46}N_2O_2SSi$ = 911.2) | P-34 | m/z = 865.29($C_{60}H_{43}N_3SSi$ = 866.17) |
| P-35 | m/z = 710.28($C_{50}H_{38}N_2OSi$ = 711.0) | P-36 | m/z = 1008.4($C_{74}H_{48}N_2OSi$ = 1009.3) |
| P-37 | m/z = 880.24($C_{60}H_{40}N_2S_2Si$ = 881.2) | P-38 | m/z = 874.28($C_{62}H_{42}N_2SSi$ = 875.18) |
| P-39 | m/z = 858.31($C_{62}H_{42}N_2OSi$ = 859.1) | P-40 | m/z = 786.31($C_{56}H_{42}N_2OSi$ = 787.1) |
| P-41 | m/z = 986.23($C_{66}H_{42}N_2S_3Si$ = 987.3) | P-42 | m/z = 880.24($C_{60}H_{40}N_2S_2Si$ = 881.2) |
| P-43 | m/z = 848.29($C_{60}H_{40}N_2)_2Si$ = 849.08) | P-44 | m/z = 834.31($C_{60}H_{42}N_2OSi$ = 835.1) |
| P-45 | m/z = 815.28($C_{56}H_{41}N_3SSi$ = 816.1) | P-46 | m/z = 951.31($C_{67}H_{45}N_3SSi$ = 952.26) |
| P-47 | m/z = 724.29($C_{51}H_{40}N_2OSi$ = 725.0) | P-48 | m/z = 849.32($C_{60}H_{43}N_3OSi$ = 850.1) |
| P-49 | m/z = 951.33($C_{67}H_{45}N_3O_2Si$ = 952.20) | P-50 | m/z = 837.3($C_{56}H_{35}D_5N_2S_2Si$ = 838.2) |
| P-51 | m/z = 774.27($C_{54}H_{38}N_2O_2Si$ = 775.00) | P-52 | m/z = 1075.4($C_{78}H_{53}N_3OSi$ = 1076.4) |
| P-53 | m/z = 824.27($C_{58}H_{40}N_2SSi$ = 825.12) | P-54 | m/z = 824.27($C_{58}H_{40}N_2SSi$ = 825.12) |
| P-55 | m/z = 808.29($C_{58}H_{40}N_2OSi$ = 809.1) | P-56 | m/z = 808.29($C_{58}H_{40}N_2OSi$ = 809.1) |
| P-57 | m/z = 866.28($C_{60}H_{42}N_2OSSi$ = 867.2) | P-58 | m/z = 1076.3($C_{73}H_{48}N_2S_3Si$ = 1077.5) |
| P-59 | m/z = 852.32($C_{60}H_{44}N_2O_2Si$ = 853.11) | P-60 | m/z = 886.34($C_{64}H_{46}N_2OSi$ = 887.17) |
| P-61 | m/z = 700.24($C_{48}H_{36}N_2SSi$ = 701.0) | P-62 | m/z = 842.26($C_{58}H_{39}FN_2SSi$ = 843.1) |
| P-63 | m/z = 734.3($C_{52}H_{38}N_2OSi$ = 734.97) | P-64 | m/z = 888.33($C_{62}H_{44}N_4OSi$ = 889.15) |
| P-65 | m/z = 888.30($C_{60}H_{48}N_2S_2Si$ = 889.3) | P-66 | m/z = 950.32($C_{68}H_{46}N_2SSi$ = 951.28) |
| P-67 | m/z = 684.26($C_{48}H_{36}N_2OSi$ = 684.9) | P-68 | m/z = 900.32 ($C_{64}H_{44}N_2O_2Si$ = 901.2) |
| P-69 | m/z = 850.28($C_{60}H_{42}N_2SSi$ = 851.16) | P-70 | m/z = 850.28($C_{60}H_{42}N_2SSi$ = 851.16) |
| P-71 | m/z = 810.31 ($C_{58}H_{42}N_2OSi$ = 811.1) | P-72 | m/z = 910.34($C_{66}H_{46}N_2OSi$ = 911.2) |
| P-73 | m/z = 850.28($C_{60}H_{42}N_2SSi$ = 851.2) | P-74 | m/z = 900.30($C_{64}H_{44}N_2SSi$ = 901.22) |
| P-75 | m/z = 834.31($C_{60}H_{42}N_2OSi$ = 835.1) | P-76 | m/z = 1062.4($C_{78}H_{54}N_2OSi$ = 1063.4) |
| P-77 | m/z = 850.28($C_{60}H_{42}N_2SSi$ = 851.1) | P-78 | m/z = 900.3($C_{64}H_{44}N_2SSi$ = 901.22) |
| P-79 | m/z = 834.3($C_{60}H_{42}N_2OSi$ = 835.09) | P-80 | m/z = 1064.45($C_{79}H_{60}N_2Si$ = 1065.5) |

Manufacturing and Evaluation of Organic Electric Element

[Example 1] Red Organic Electroluminescent Element (An Emission-Auxiliary Layer)

$N^1$-(naphthalen-2-yl)-$N^4$,$N^4$-bis(4-(naphthalen-2-yl(phenyl)amino)phenyl)-$N^1$-phenylbenzene-1,4-diamine (hereinafter, "2-TNATA") on an ITO layer (anode) formed on a glass substrate was vacuum-deposited to a thickness of 60 nm to form a hole injection layer. Thereafter, N,N'-bis(1-naphthalenyl)-N, N'-bis-phenyl-(1,1'-biphenyl)-4,4'-diamine (hereinafter, "NPB") on the hole injection layer was vacuum-deposited to a thickness of 60 nm to form a hole transport layer.

Subsequently, after an emission-auxiliary layer with a thickness of 20 nm was formed by vacuum-depositing the compound P-1 of the present invention on the hole transport layer, 4,4'-N,N'-dicarbazole-biphenyl(hereinafter, "CBP") as a host material and bis-(1-phenylisoquinoly)iridium(III) acetylacetonate (hereinafter, "(piq)$_2$Ir(acac)") as a dopant material in a weight ratio of 95:5 were deposited on the emission-auxiliary layer to form a light emitting layer with a thickness of 30 nm.

Subsequently, (1,1'-bisphenyl-4-olato)bis(2-methyl-8-quinolinolato)aluminum (hereinafter, "BAIq") was vacuum-deposited to a thickness of 5 nm on the light emitting layer to form a hole blocking layer, and tris-(8-hydroxyquinoline) aluminum (hereinafter, "Alq$_3$") was vacuum-deposited to a thickness of 40 nm on the hole blocking layer to form a an electron transport layer. Thereafter, LiF was deposited to a thickness of 0.2 nm to form an electron injection layer, and then Al was deposited to a thickness of 150 nm to form a cathode.

[Example 2 to Example 13] Red Organic Electroluminescent Element (An Emission-Auxiliary Layer)

The organic electroluminescent elements were manufactured in the same manner as described in Example 1 except that compounds of the present invention described in the following Table 4 instead of compound P-1 of the present invention, were used as material of an emission-auxiliary layer.

[Comparative Example 1] to [Comparative Example 3]

The organic electroluminescent elements were manufactured in the same manner as described in Example 1 except that Comparative Compound A to C were used as material of an emission-auxiliary layer, respectively.

<Comparative Compd A>

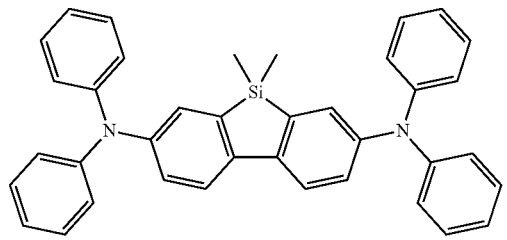

-continued

<Comparative Compd B>

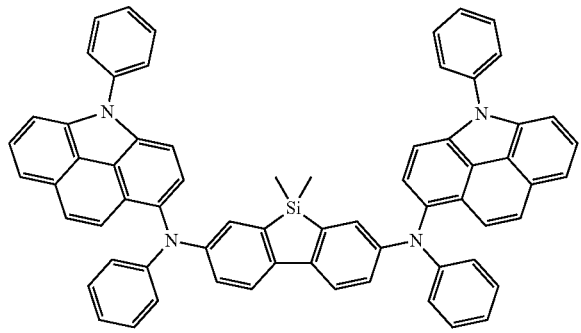

<Comparative Compd C>

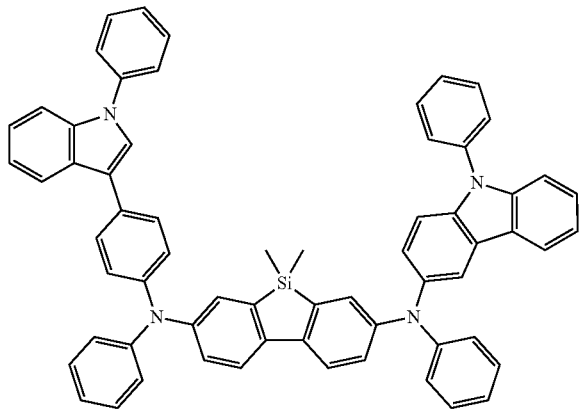

Electroluminescence (EL) characteristics were measured with PR-650 (Photo esearch) by applying a forward bias DC voltage to the organic electroluminescent elements prepared in Examples 1 to 13 of the present invention and Comparative Examples 1 to 3. And, the T95 life time was measured using a life time measuring apparatus manufactured by ms science Inc. at reference brightness of 2500 cd/m$^2$. The measurement results are shown in Tables 4 below.

From the results of Table 4, it is can be seen that not only can the driving voltage be lowered, but efficiency and lifespan are significantly improved where a red organic electric element are manufactured using the compound of the present invention as material for an emission-auxiliary layer, compared to the cases of using Comparative Compounds A to C.

The present invention is the same as the comparative compound in that the amine groups are bonded to both benzene ring of the dibenzosilole core, respectively, but the present invention is different in that amine group is substituted with the specific substituents such as dibenzothiophen or dibenzofuran.

Where dibenzothiophen or dibenzofuran is introduced as substituent of amine group, the refractive index is significantly increased and the Tg value is also increased, compare to the case where the substituent such as a general aryl group or the substituents in Comparative Compound B or Comparative Compound C is introduced. Therefore, in accordance with the embodiment of the present invention, it seems that luminous efficiency and thermal stability are improved, and thus, the lifespan and the like is increased.

This is because even though core of compound is the same, the physical properties of the compound are different depending on the type of the substituent substituted on the amino group. This suggests that the difference of properties may act as a major factor in improving the performance of the device when depositing the compound.

Although the exemplary embodiments of the present invention have been described for illustrative purposes, those skilled in the art to which the present invention pertains will be capable of various modifications without departing from the essential characteristics of the present invention. Therefore, the embodiment disclosed herein is intended to illustrate the scope of the technical idea of the present invention, and the spirit and scope of the present invention are not limited by the embodiments. The scope of the present invention shall be construed on the basis of the accompanying claims, and it shall be construed that all of the technical ideas included within the scope equivalent to the claims belong to the present invention.

TABLE 4

|  | Compound | Voltage (V) | Current Density (mA/cm$^2$) | Brightness (cd/m$^2$) | Efficiency (cd/A) | Lifetime T(95) | CIE x | CIE y |
| --- | --- | --- | --- | --- | --- | --- | --- | --- |
| comp. Ex(1) | comp. Com A | 6.5 | 32.1 | 2500.0 | 7.8 | 30.1 | 0.62 | 0.33 |
| comp. Ex(2) | comp. Com B | 6.6 | 30.1 | 2500.0 | 8.3 | 50.8 | 0.63 | 0.30 |
| comp. Ex(3) | comp. Com C | 6.3 | 27.5 | 2500.0 | 9.1 | 45.2 | 0.60 | 0.33 |
| Ex.(1) | P-1 | 5.5 | 16.1 | 2500.0 | 15.5 | 73.2 | 0.63 | 0.34 |
| Ex.(2) | P-4 | 5.5 | 16.5 | 2500.0 | 15.1 | 70.3 | 0.64 | 0.33 |
| Ex.(3) | P-6 | 5.5 | 16.4 | 2500.0 | 15.3 | 72.4 | 0.64 | 0.35 |
| Ex.(4) | P-12 | 5.5 | 16.6 | 2500.0 | 15.1 | 79.9 | 0.62 | 0.32 |
| Ex.(5) | P-14 | 5.6 | 16.9 | 2500.0 | 14.8 | 71.0 | 0.63 | 0.30 |
| Ex.(6) | P-21 | 5.8 | 18.7 | 2500.0 | 13.4 | 64.5 | 0.64 | 0.31 |
| Ex.(7) | P-38 | 5.7 | 17.5 | 2500.0 | 14.3 | 76.6 | 0.61 | 0.35 |
| Ex.(8) | P-44 | 5.7 | 17.2 | 2500.0 | 14.5 | 77.5 | 0.62 | 0.34 |
| Ex.(9) | P-55 | 6.0 | 19.5 | 2500.0 | 12.8 | 80.2 | 0.62 | 0.32 |
| Ex.(10) | P-62 | 5.6 | 16.7 | 2500.0 | 14.9 | 76.9 | 0.65 | 0.33 |
| Ex.(11) | P-67 | 5.9 | 18.0 | 2500.0 | 13.9 | 68.1 | 0.62 | 0.34 |
| Ex.(12) | P-73 | 5.6 | 17.0 | 2500.0 | 14.7 | 74.0 | 0.62 | 0.35 |
| Ex.(13) | P-75 | 5.6 | 16.9 | 2500.0 | 14.8 | 73.2 | 0.65 | 0.33 |

The invention claimed is:
1. A compound represented by one of Formula 8 to 10:

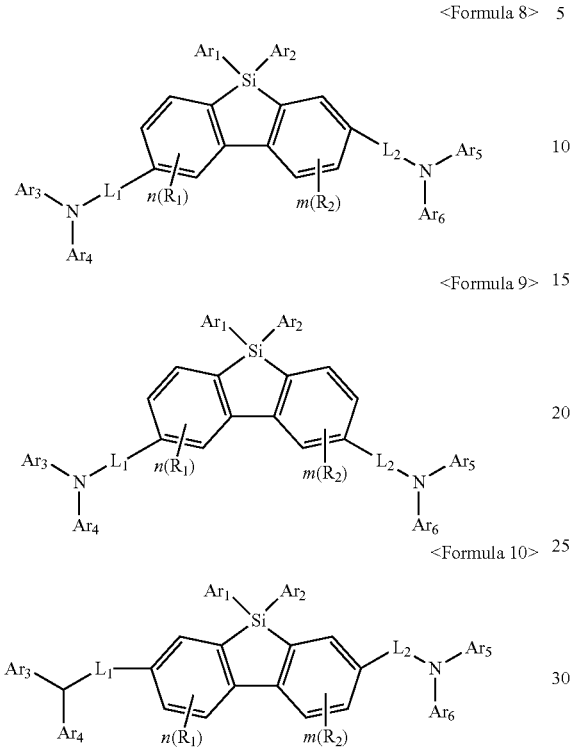

<Formula 8>

<Formula 9>

<Formula 10> wherein:
Ar$_1$ and Ar$_2$ are each independently selected from the group consisting of a C$_6$-C$_{60}$ aryl group, a C$_2$-C$_{60}$ heterocyclic group containing at least one heteroatom of O, N, S, Si, and P, a C$_3$-C$_{60}$ aliphatic ring group, a C$_1$-C$_{50}$ alkyl group, a C$_2$-C$_{20}$ alkenyl group, a C$_2$-C$_{20}$ alkynyl group, a C$_1$-C$_{30}$ alkoxyl group, a C$_6$-C$_{30}$ aryloxy group, and -L'-N(R$_a$)(R$_b$), and adjacent groups together may be bonded to each other to form a heterocyclic group containing Si, Ar$_3$ to Ar$_6$ are each independently selected from the group consisting of a C$_6$-C$_{60}$ aryl group, a C$_2$-C$_{60}$ heterocyclic group containing at least one heteroatom of O, N, S, Si, and P, a C$_3$-C$_{60}$ aliphatic ring group, -L'-N(R$_a$)(R$_b$) and Formula 1-1, and adjacent groups together may be bonded to each other to form a heterocyclic group containing N, with the proviso that at least one of Ar$_3$ to Ar$_6$ is Formula 1-1,

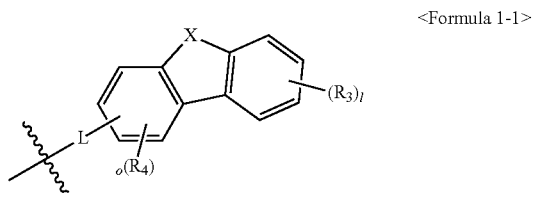

<Formula 1-1>

X is O or S,
R$_1$ and R$_2$ are each independently selected from the group consisting of hydrogen, deuterium, halogen, a C$_6$-C$_{60}$ aryl group, a fluorenyl group, a C$_2$-C$_{60}$ heterocyclic group containing at least one heteroatom of O, N, S, Si, and P, a C$_3$-C$_{60}$ aliphatic ring group, a C$_1$-C$_{50}$ alkyl group, a C$_2$-C$_{20}$ alkenyl group, a C$_1$-C$_{30}$ alkoxyl group, a C$_6$-C$_{30}$ aryloxy group and -L'-N(R$_a$)(R$_b$), R$_3$ and R$_4$ are each independently selected from the group consisting of hydrogen, deuterium, halogen, a C$_6$-C$_{60}$ aryl group, a fluorenyl group, a C$_2$-C$_{60}$ heterocyclic group containing at least one heteroatom of O, N, S, Si, and P, a C$_3$-C$_{60}$ aliphatic ring group, a C$_1$-C$_{50}$ alkyl group, a C$_2$-C$_{20}$ alkenyl group, a C$_1$-C$_{30}$ alkoxyl group, a C$_6$-C$_{30}$ aryloxy group and -L'-N(R$_a$)(R$_b$), and adjacent groups together may be bonded to each other to form a ring, n, m and o are each an integer of 0 to 3, l is an integer of 0 to 4, where they are each an integer of 2 or more, each of a plurality of R$_1$s, each of a plurality of R$_2$s, each of a plurality of R$_3$s, each of a plurality of R$_4$s are the same or different from each other, L$_1$, L$_2$ and L are each independently selected from the group consisting of a single bond, a C$_6$-C$_{60}$ arylene group, a fluorenylene group, a C$_2$-C$_{60}$ heterocyclic group containing at least one heteroatom of O, N, S, Si, and P, and a C$_3$-C$_{60}$ aliphatic ring group, L' is selected from the group consisting of a single bond, a C$_6$-C$_{60}$ arylene group, a fluorenylene group, a C$_3$-C$_{60}$ aliphatic ring and a C$_2$-C$_{60}$ heterocyclic group, R$_a$ and R$_b$ are each independently selected from the group consisting of a C$_6$-C$_{60}$ aryl group, a fluorenyl group, a C$_3$-C$_{60}$ aliphatic ring group, and a C$_2$-C$_{60}$ heterocyclic group containing at least one heteroatom of O, N, S, Si, and P, and Ar$_1$ to Ar$_6$, R$_1$ to R$_4$, the ring formed by adjacent groups, L$_1$, L$_2$, L, L', R$_a$ and R$_b$ may be each optionally substituted with one or more substituents selected from the group consisting of deuterium, halogen, a silane group unsubstituted or substituted with a C$_1$-C$_{20}$ alkyl group or a C$_6$-C$_{20}$ aryl group, a siloxane group, a boron group, a germanium group, a cyano group, a nitro group, a phosphine oxide group unsubstituted or substituted with a C$_1$-C$_{20}$ alkyl group or a C$_6$-C$_{20}$ aryl group, a C$_1$-C$_{20}$ alkylthio group, a C$_1$-C$_{20}$ alkoxyl group, a C$_1$-C$_{20}$ alkyl group, a C$_2$-C$_{20}$ alkenyl group, a C$_2$-C$_{20}$ alkynyl group, a C$_6$-C$_{20}$ aryl group, a C$_6$-C$_{20}$ aryl group substituted with deuterium, a fluorenyl group, a C$_2$-C$_{20}$ heterocyclic group containing at least one heteroatom of O, N, S, Si, and P, a C$_3$-C$_{20}$ cycloalkyl group, a C$_7$-C$_{20}$ arylalkyl group, and C$_8$-C$_{20}$ arylalkenyl group.

2. An organic electric element comprising a first electrode, a second electrode, and an organic material layer formed between the first electrode and the second electrode, wherein the organic material layer comprises a single compound two or more compounds represented by Formula 1 of claim 1.

3. The organic electric element of claim 2, wherein the organic material layer comprises at least one of a hole injection layer, a hole transport layer, an emission-auxiliary layer, a light emitting layer, an electron transport-auxiliary layer, an electron transport layer and an electron injection layer.

4. The organic electric element of claim 3, wherein the compound is comprised in the hole transport layer or the emission-auxiliary layer.

5. The organic electric element of claim 2, wherein the organic material layer is formed by spin coating, nozzle printing, inkjet printing, slot coating, dip coating or roll-to-roll.

6. An electronic device comprising a display device and a control unit for driving the display device, wherein the display device comprises the organic electric element of claim 2.

7. The electronic device of claim 6, wherein the organic electric element is selected from the group consisting of an organic electroluminescent element, an organic solar cell, an organic photo conductor, an organic transistor, an element for monochromatic illumination and element for quantum dot display.

8. A composition comprising one of the following compounds:

P-1
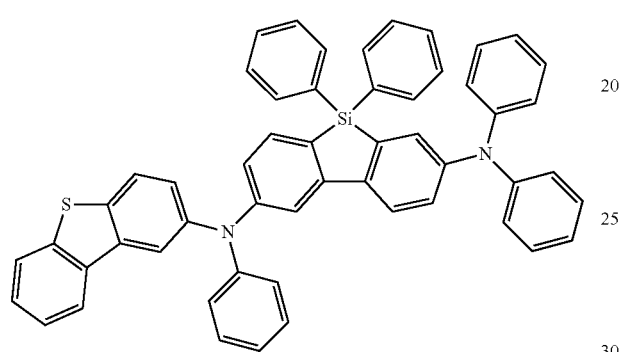

P-2
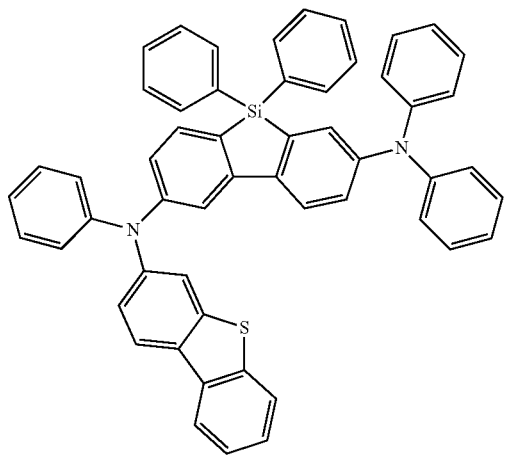

P-3
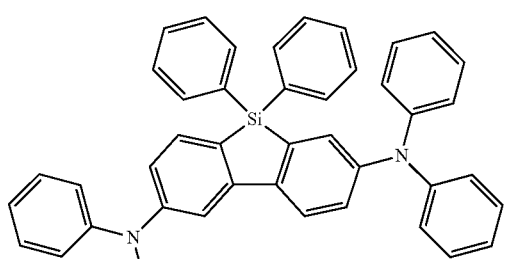
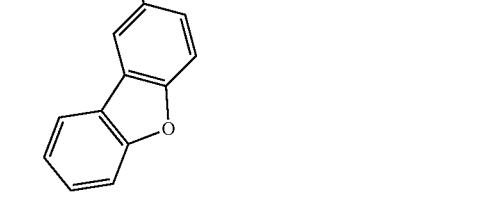

-continued

P-4
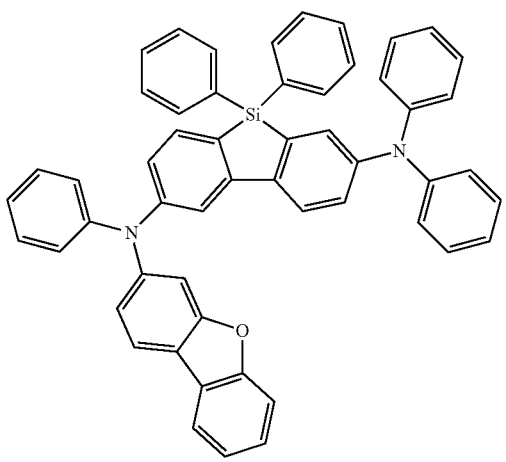

P-5
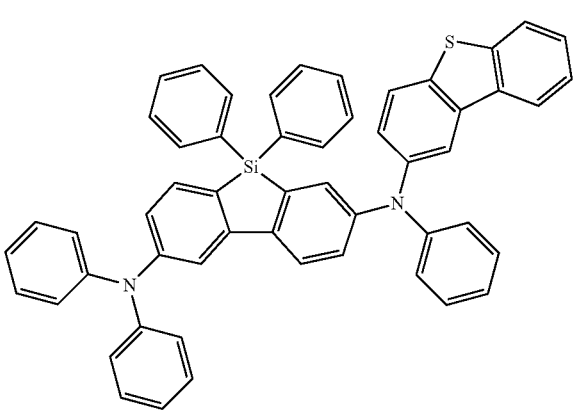

P-6
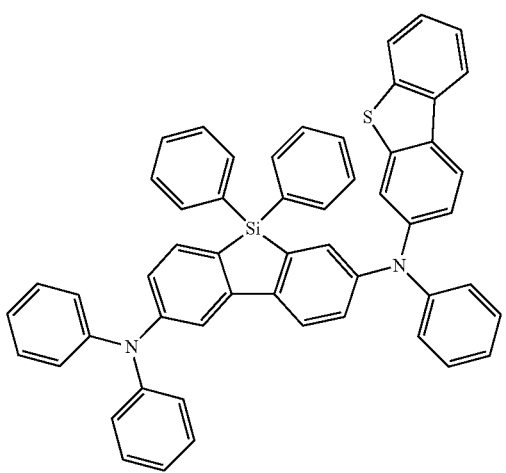

P-7
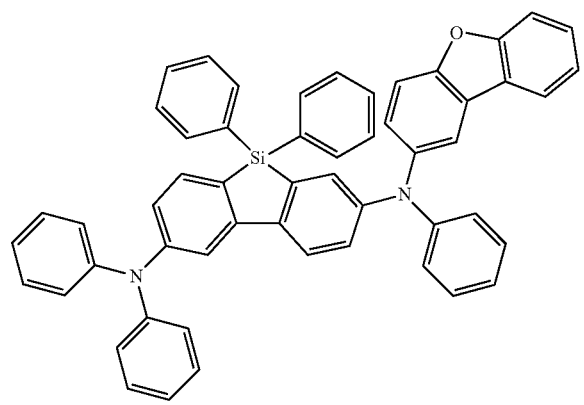
P-8
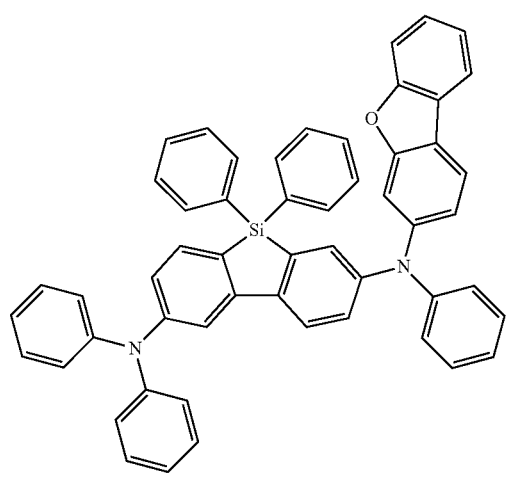
P-9
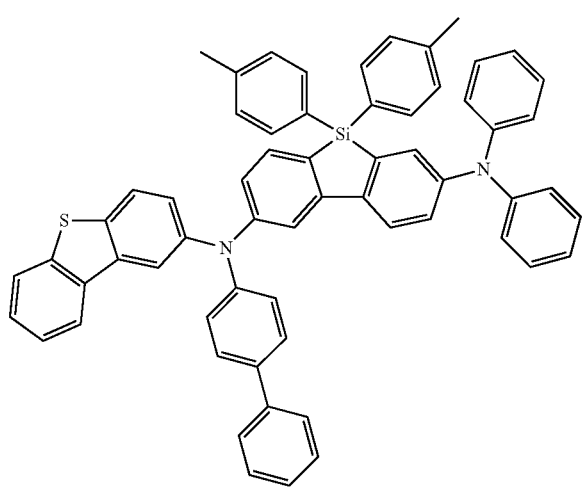
P-10
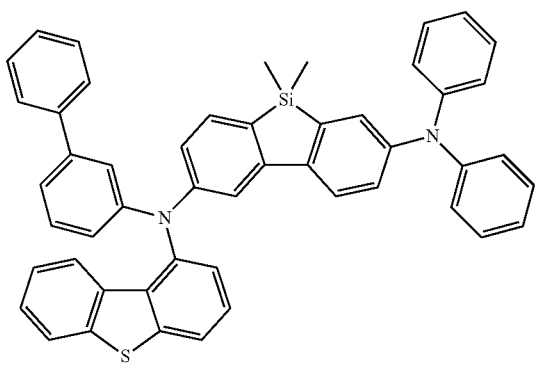
P-11
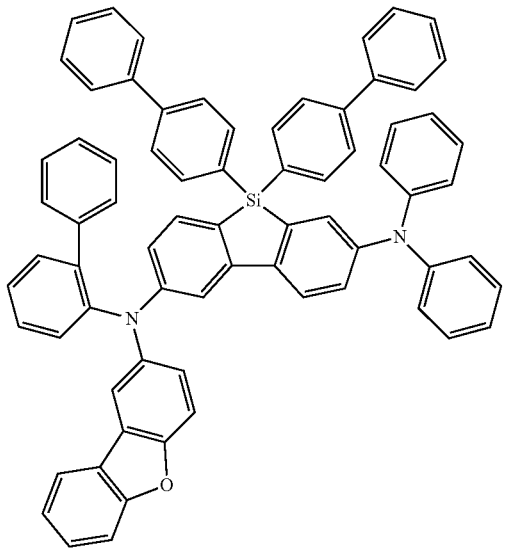
P-12
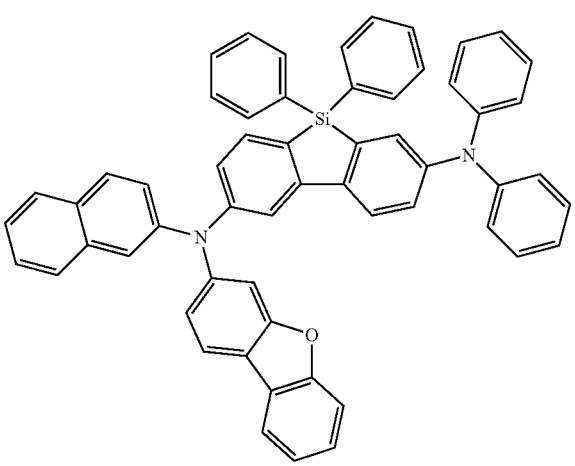

P-13
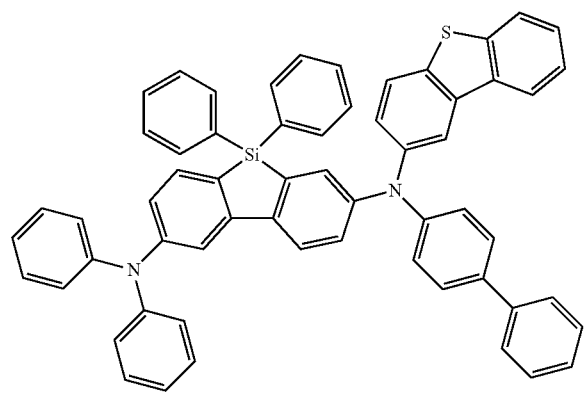
P-16
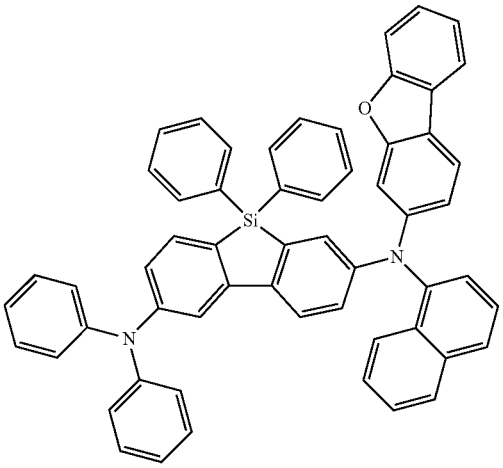
P-14
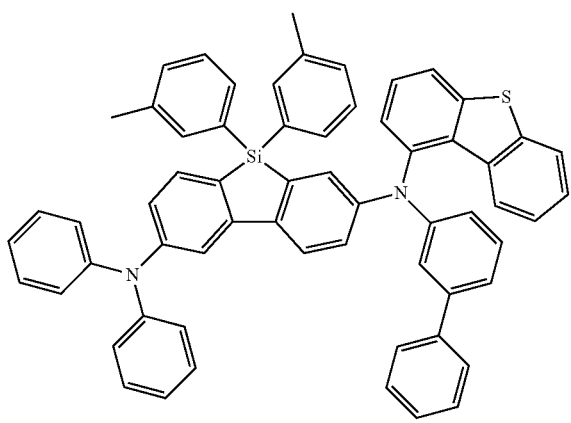
P-17
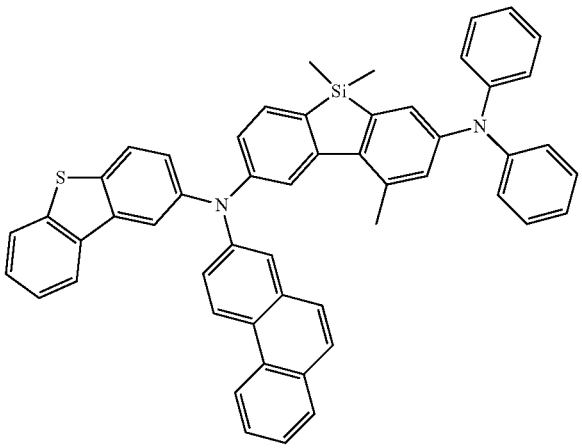
P-15
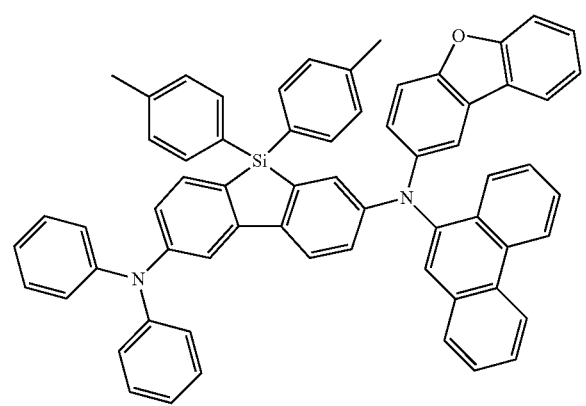
P-18
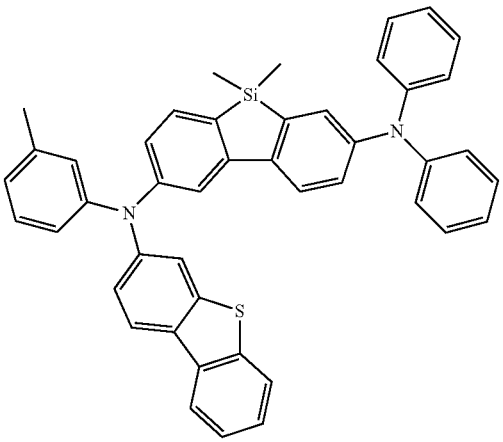

P-19
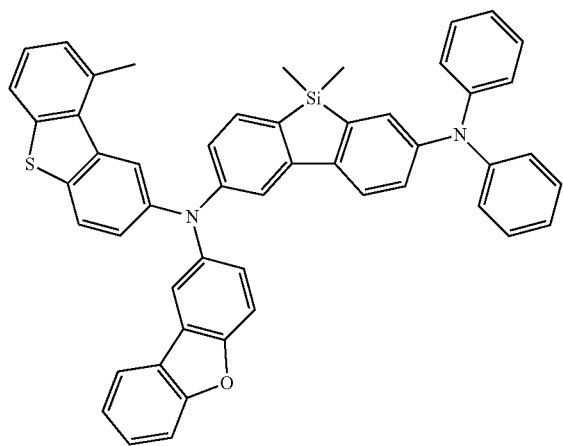
P-22
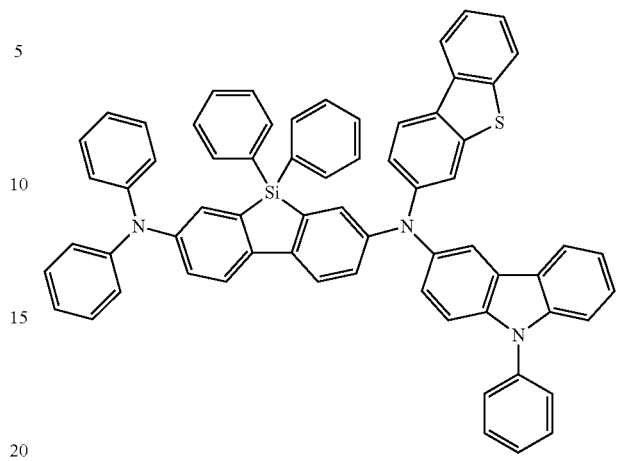
P-20
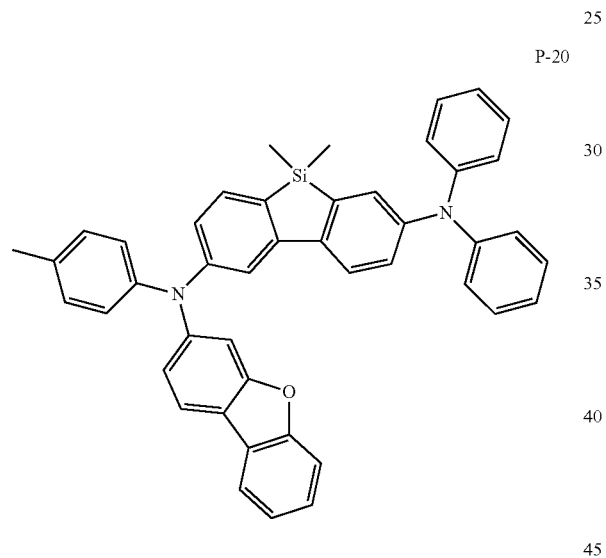
P-23
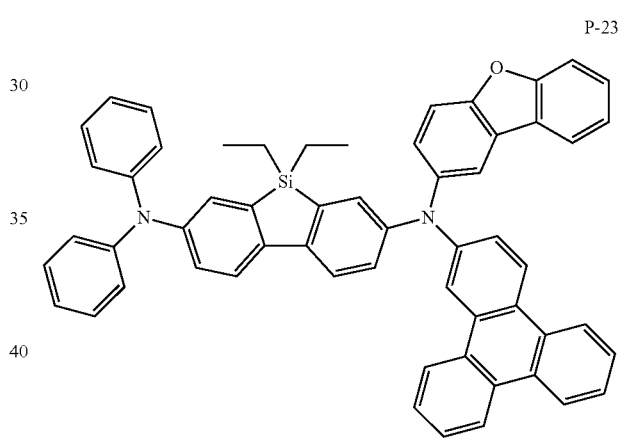
P-21
P-24
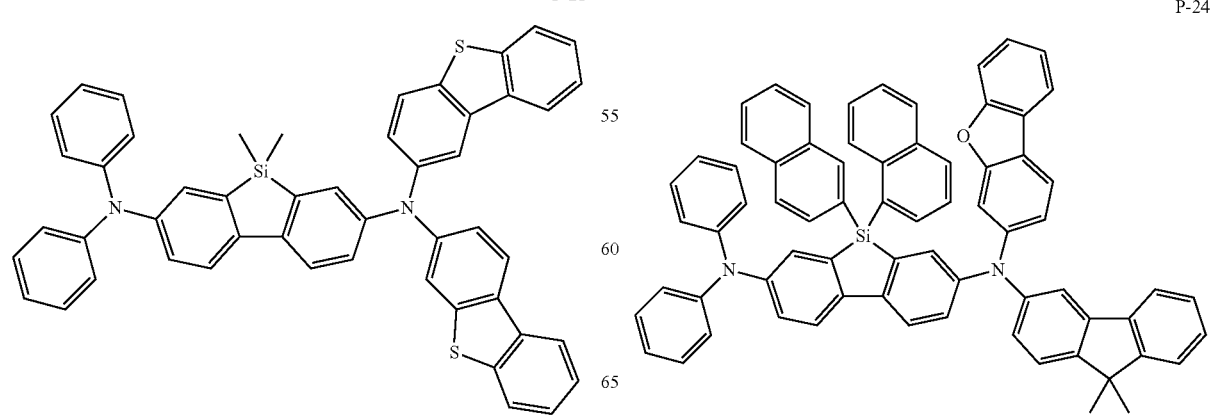

P-25
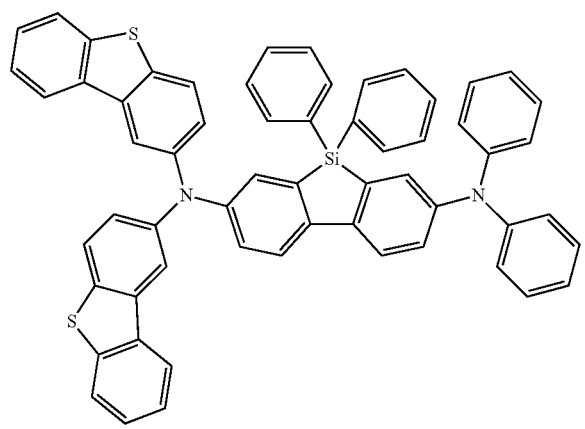
P-26
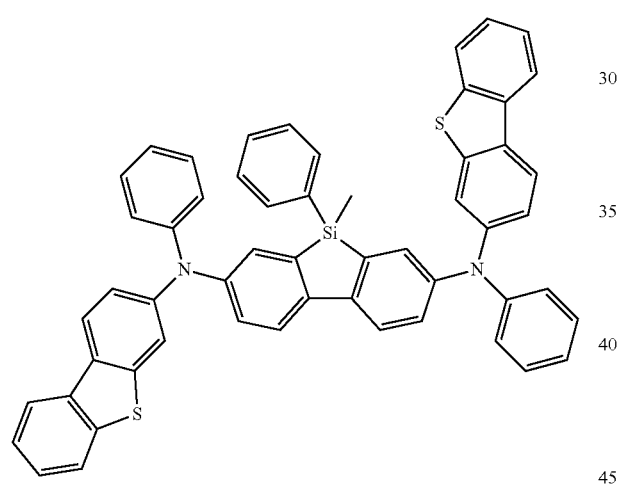
P-27
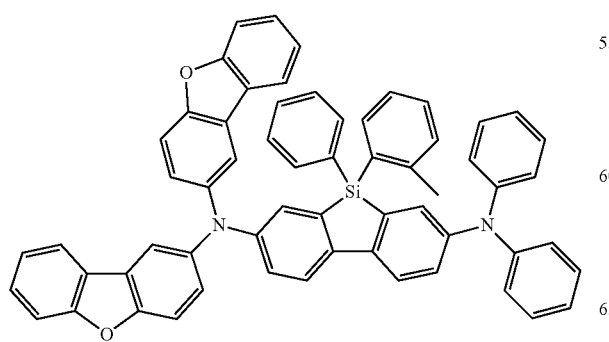
P-28
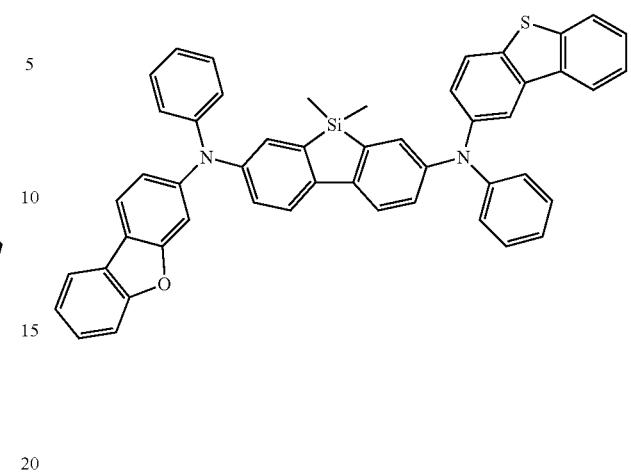
P-29
P-30
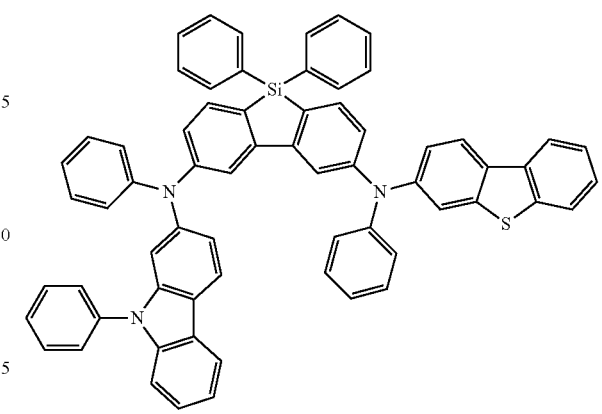

P-31
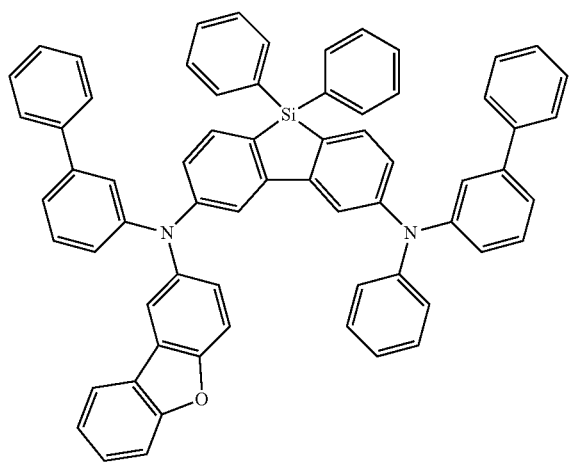
P-34
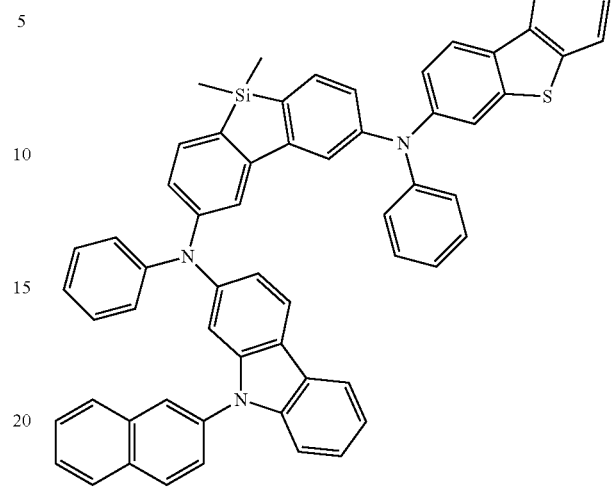
P-32
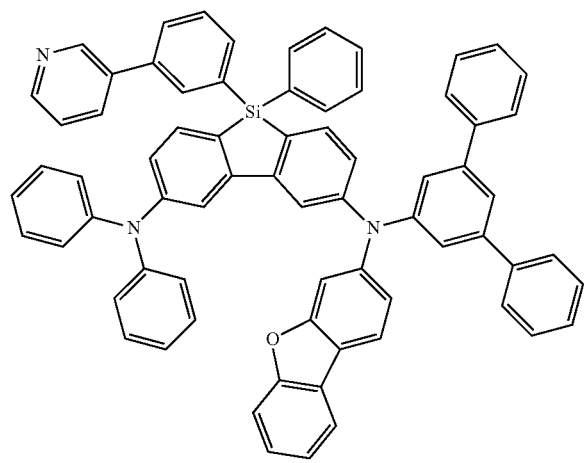
P-35
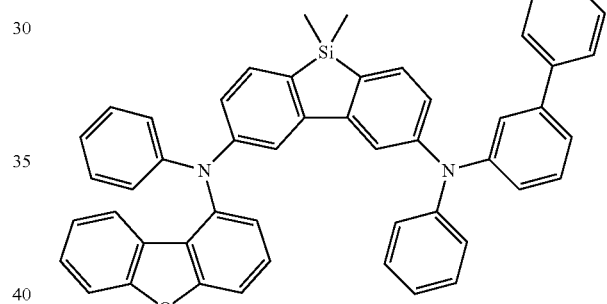
P-33
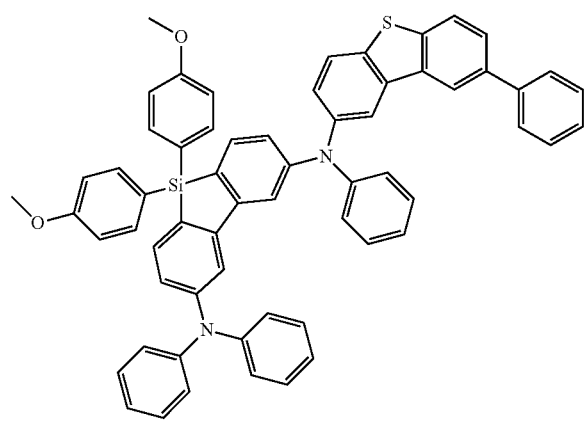
P-36
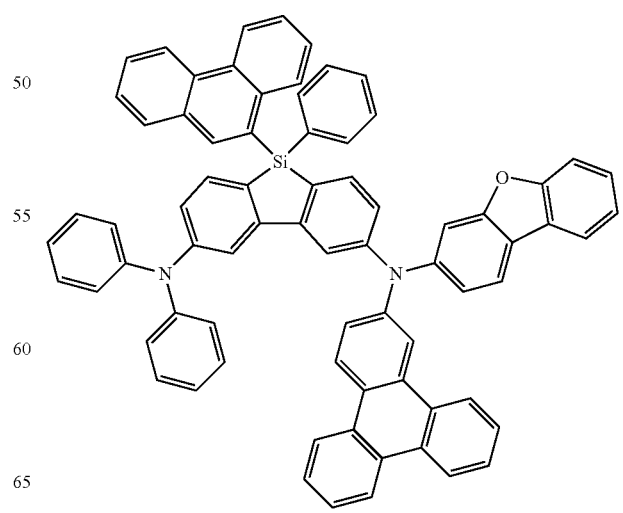

P-37
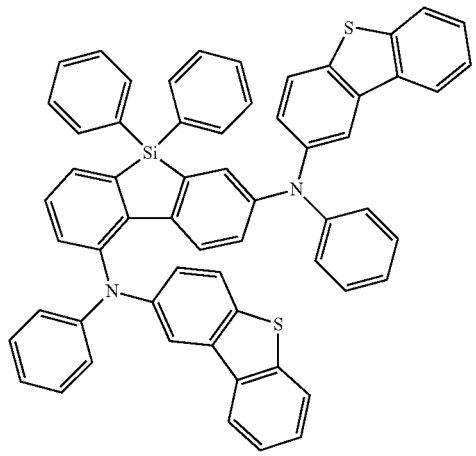
P-38
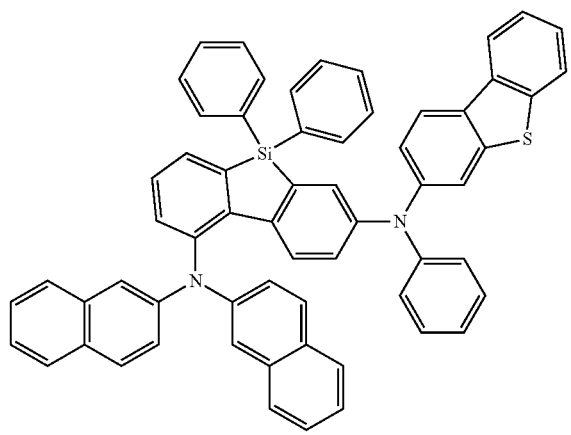
P-39
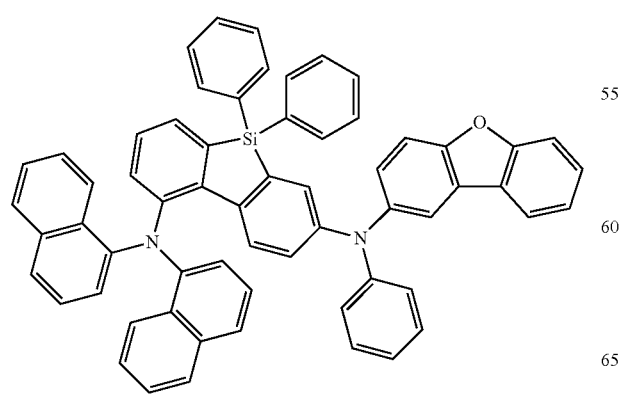
P-40
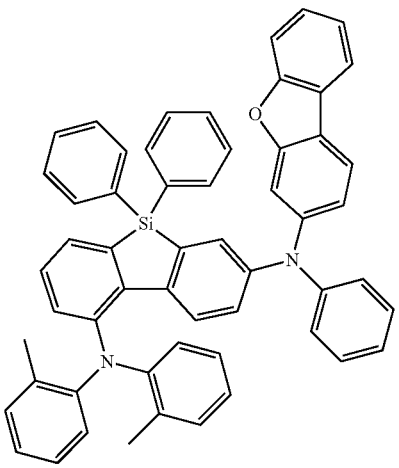
P-41
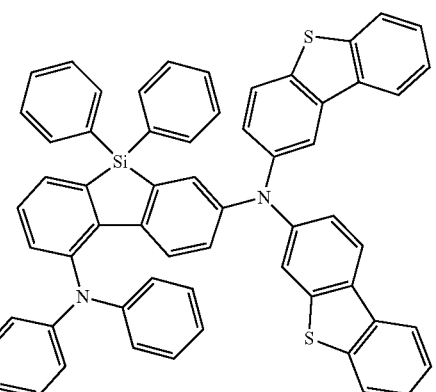
P-42
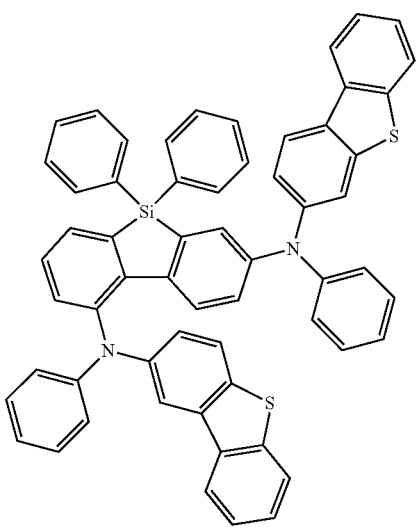

P-43
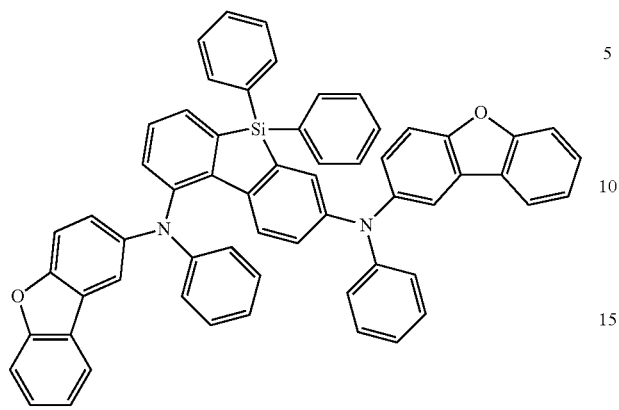
P-44
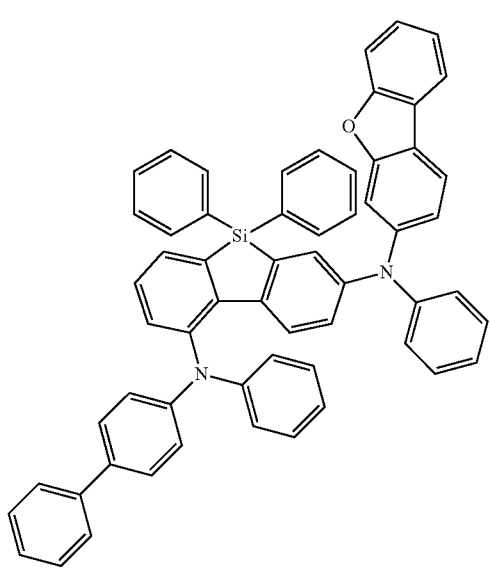
P-45
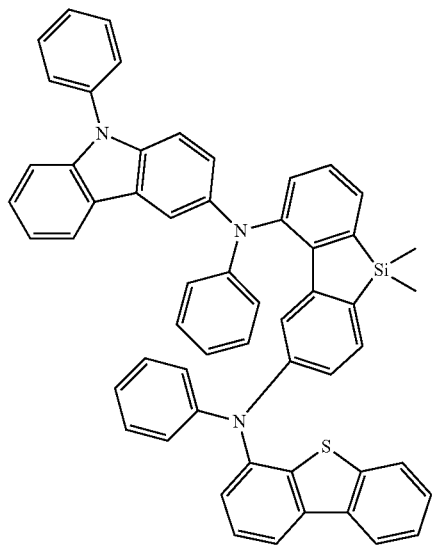
P-46
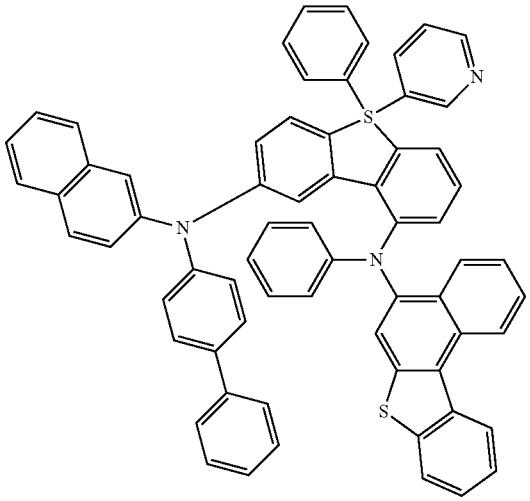
P-47
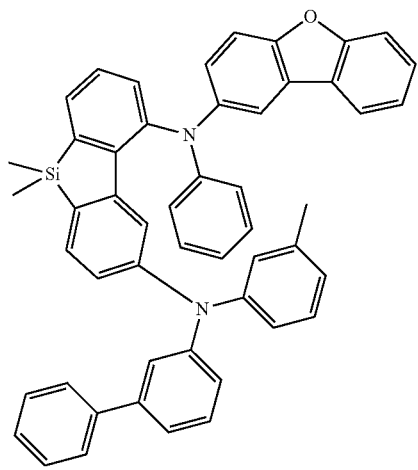
P-48
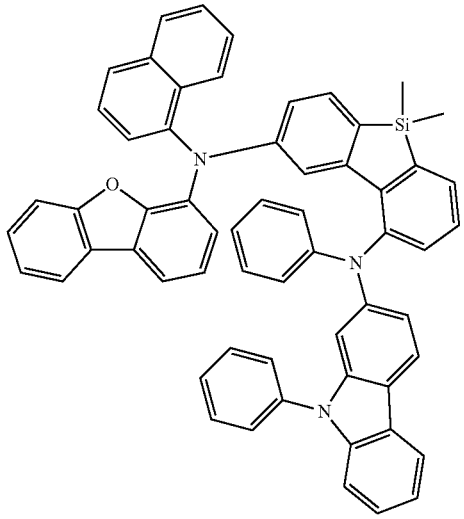

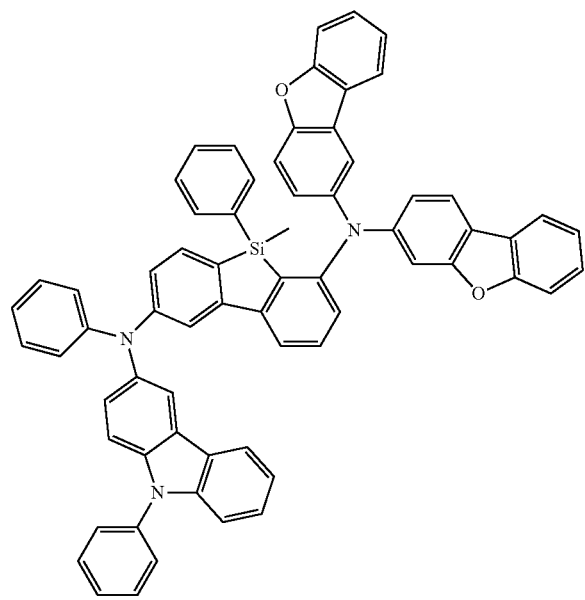
P-49
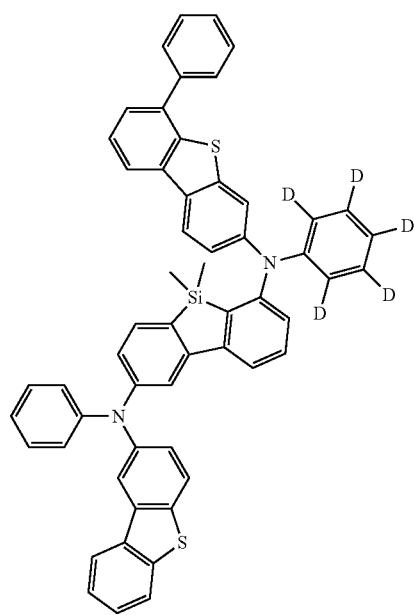
P-50
P-51
P-52
P-53

P-54
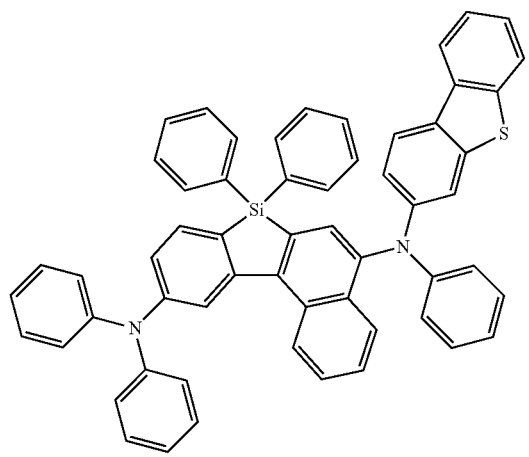
P-57
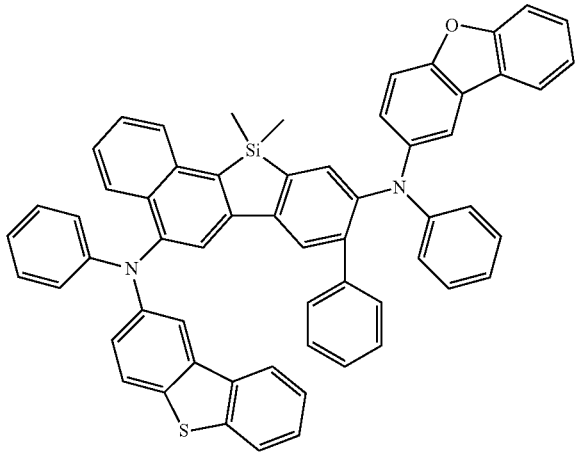
P-55
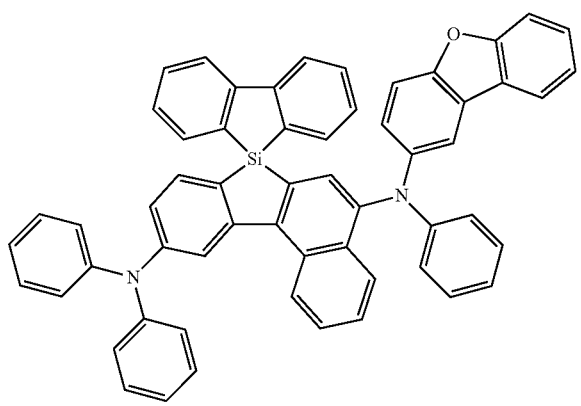
P-58
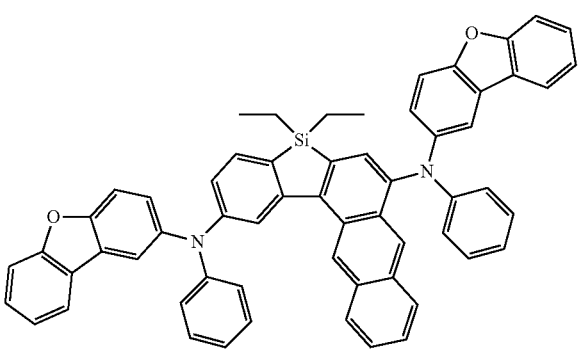
P-56
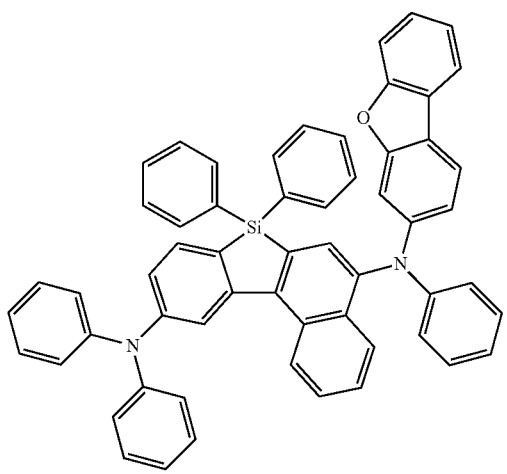
P-59

P-60
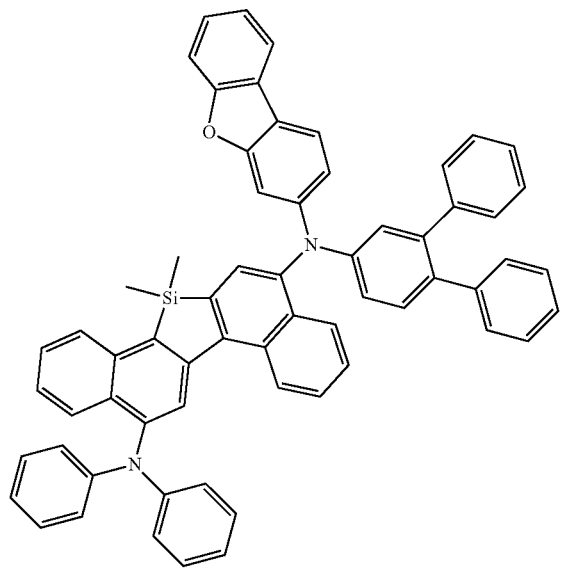
P-61
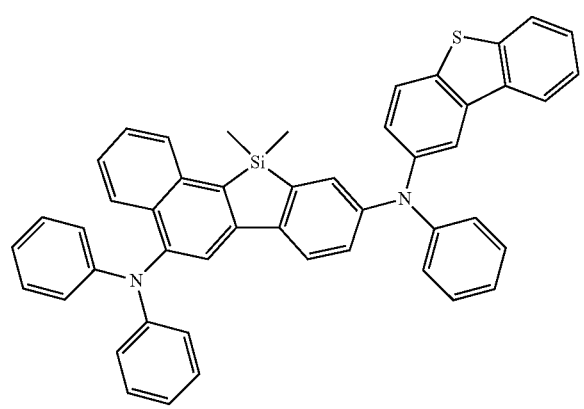
P-62
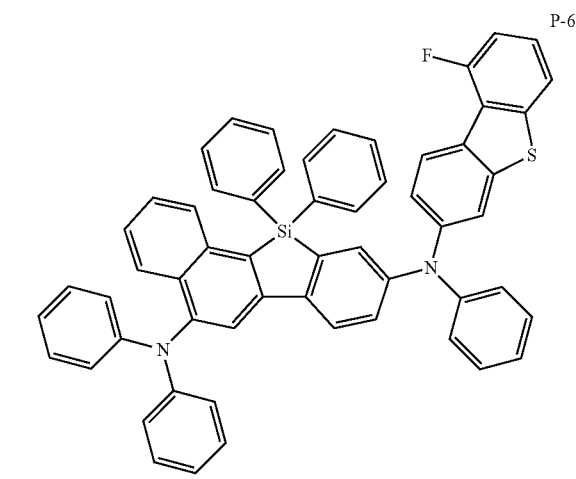
P-63
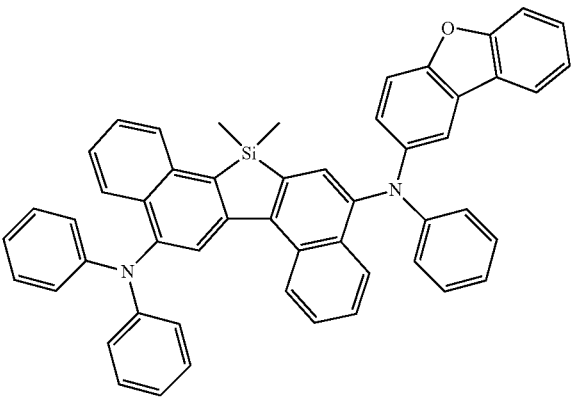
P-64
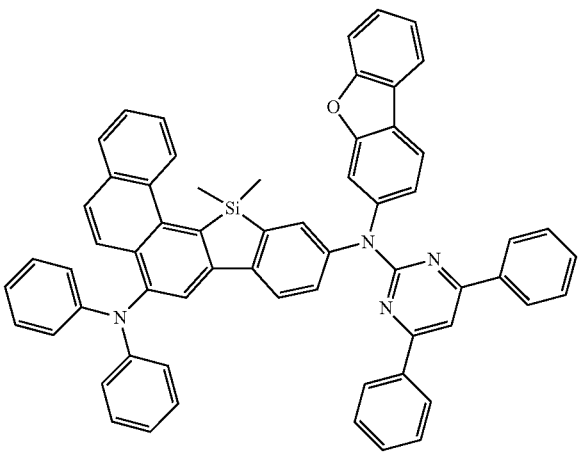
P-65
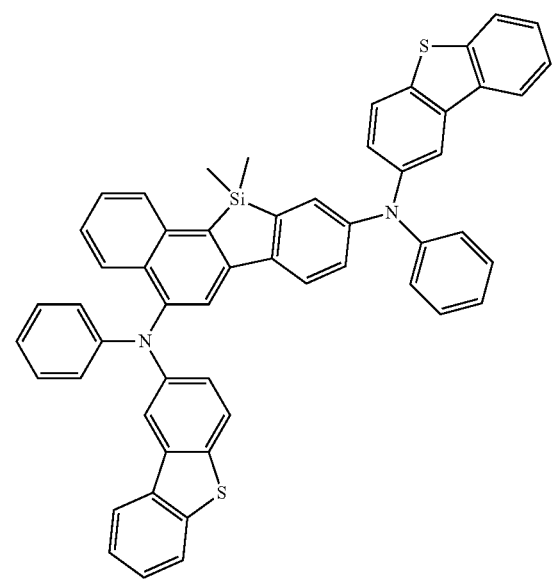

P-66
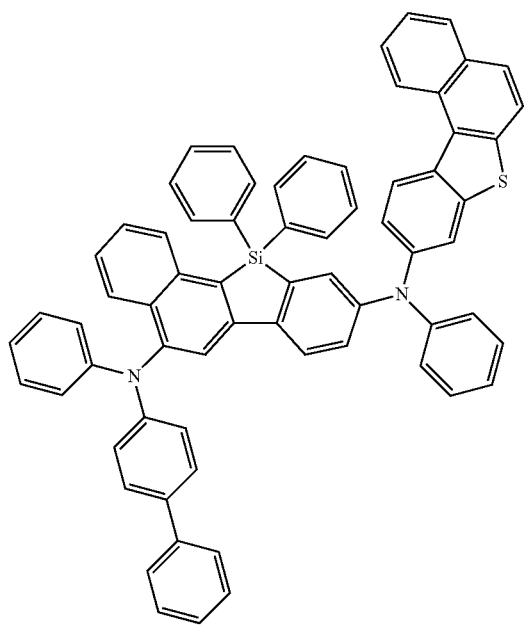
P-67
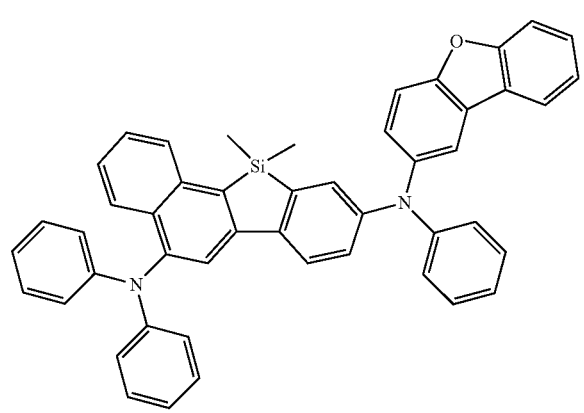
P-68
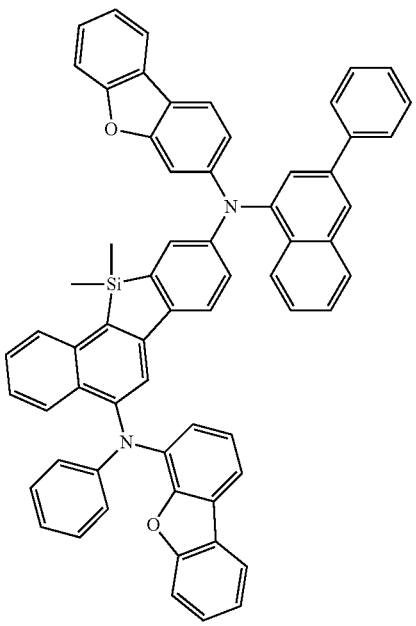
P-69
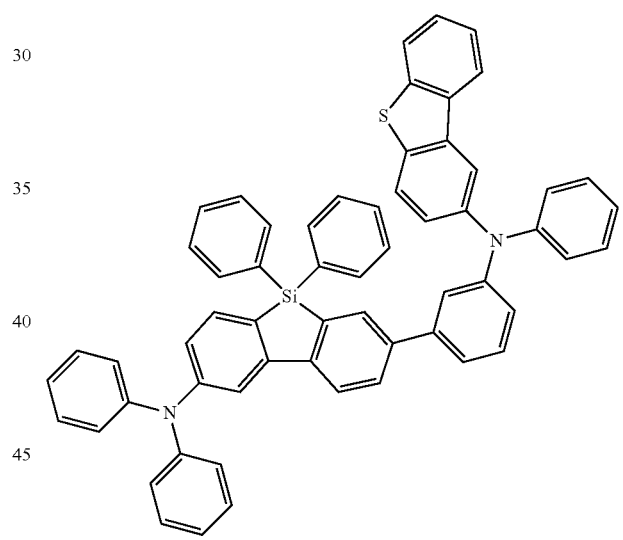
P-70
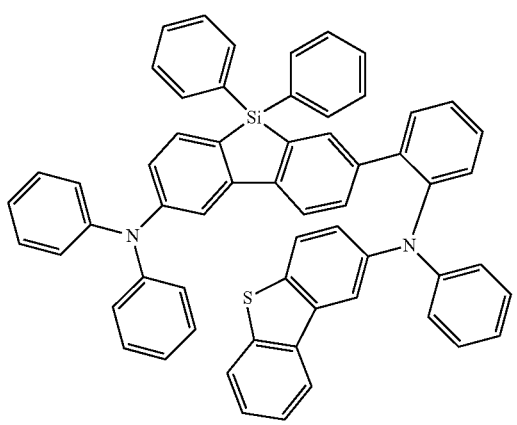

-continued
P-71
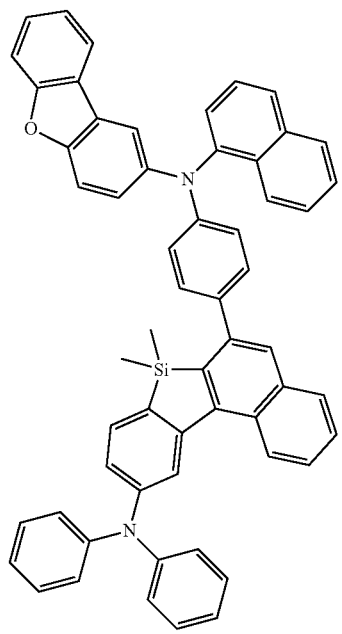
P-72
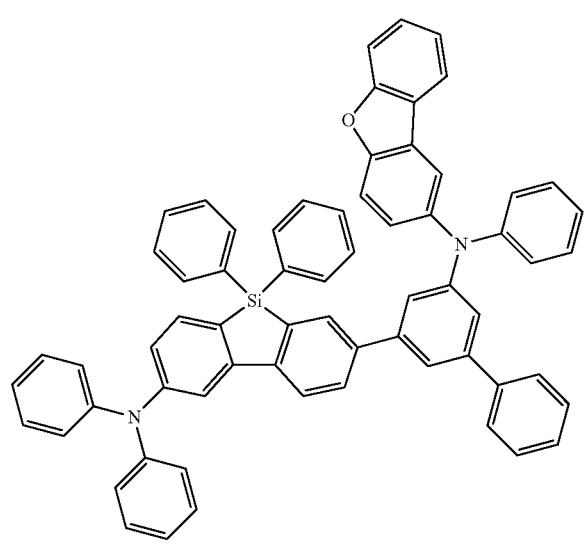
P-73
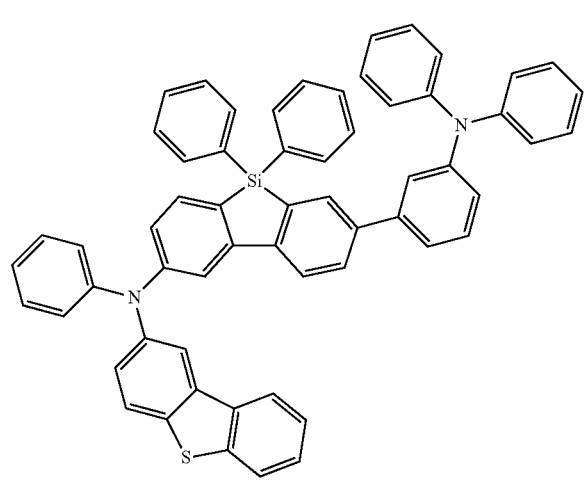
-continued
P-74
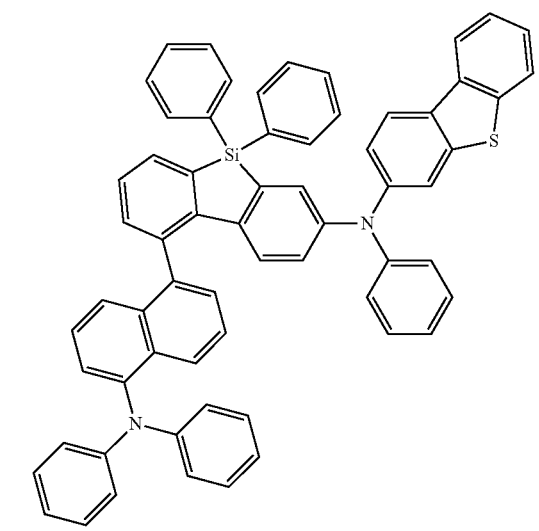
P-75
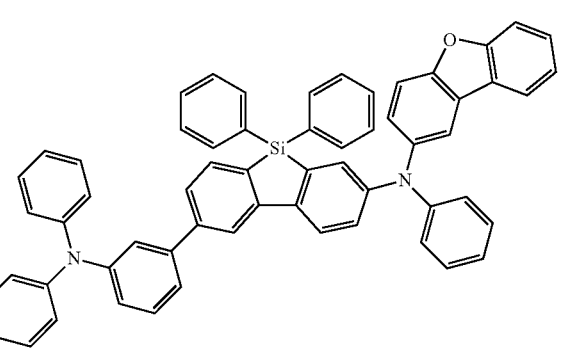
P-76
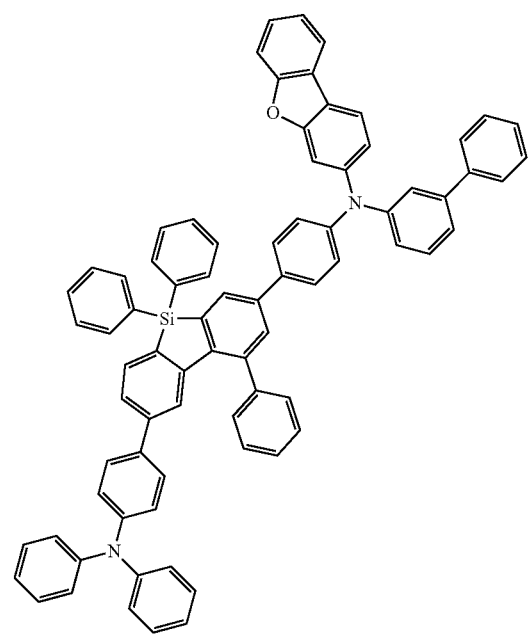

-continued

P-77

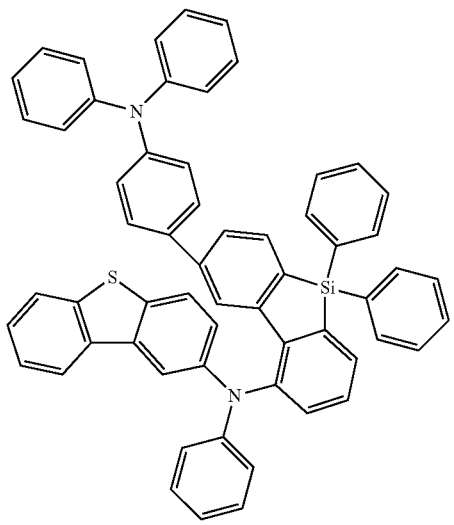

P-78

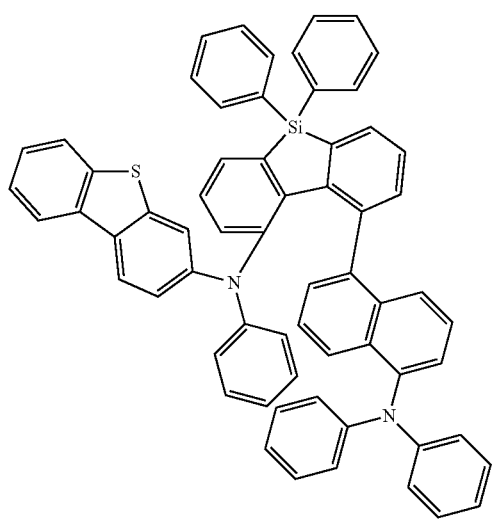

-continued

P-79

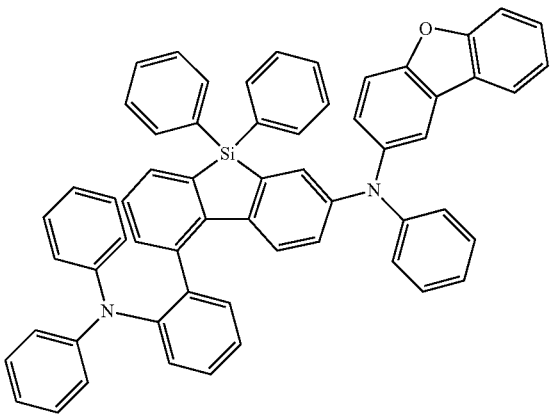

P-80

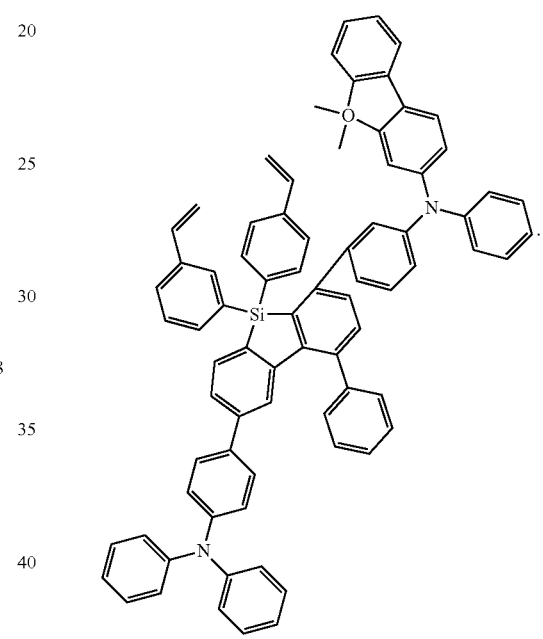

9. An organic electric element comprising a first electrode, a second electrode, and an organic material layer formed between the first electrode and the second electrode, wherein the organic material layer comprises the composition of claim 8.

10. An electronic device comprising a display device and a control unit for driving the display device, wherein the display device comprises the organic electric element of claim 9.

* * * * *